(12) United States Patent
Negoro et al.

(10) Patent No.: US 12,396,181 B2
(45) Date of Patent: Aug. 19, 2025

(54) IMAGING DEVICE AND ELECTRONIC DEVICE

(71) Applicant: Semiconductor Energy Laboratory Co., Ltd., Atsugi (JP)

(72) Inventors: Yusuke Negoro, Kaizuka (JP); Hideaki Shishido, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 149 days.

(21) Appl. No.: 18/024,286

(22) PCT Filed: Sep. 9, 2021

(86) PCT No.: PCT/IB2021/058180
§ 371 (c)(1),
(2) Date: Mar. 2, 2023

(87) PCT Pub. No.: WO2022/064307
PCT Pub. Date: Mar. 31, 2022

(65) Prior Publication Data
US 2023/0397444 A1 Dec. 7, 2023

(30) Foreign Application Priority Data
Sep. 22, 2020 (JP) .................... 2020-158024

(51) Int. Cl.
*H04N 25/771* (2023.01)
*H04N 25/79* (2023.01)
(Continued)

(52) U.S. Cl.
CPC ........... *H10B 80/00* (2023.02); *H04N 25/771* (2023.01); *H04N 25/79* (2023.01); *H10F 39/182* (2025.01);
(Continued)

(58) Field of Classification Search
CPC .................................................... H04N 25/771
See application file for complete search history.

(56) References Cited

U.S. PATENT DOCUMENTS 8,253,135 B2 8/2012 Uochi et al.
8,378,391 B2 2/2013 Koyama et al.
(Continued)

FOREIGN PATENT DOCUMENTS

CN  108781265 A  11/2018
EP    3439288 A   2/2019
(Continued)

OTHER PUBLICATIONS

Hafnium-Indium-Zinc Oxide thin film transistors using HfO2 as gate dielectric, with both layers deposited by RF sputtering, Hernandez et al., 2016 (Year: 2016).*
(Continued)

*Primary Examiner* — James M Hannett
(74) *Attorney, Agent, or Firm* — Eric J. Robinson; Robinson Intellectual Property Law Office, P.C.

(57) ABSTRACT

An imaging device that has an image processing function and is capable of operating at high speed is provided. The imaging device has an additional function such as image processing, image data obtained by an imaging operation is binarized in a pixel portion, and a product-sum operation is performed using the binarized data. A memory circuit is provided in the pixel portion and retains a weight coefficient used for the product-sum operation. Thus, an arithmetic operation can be performed without the weight coefficient read from the outside every time, so that power consumption can be reduced. Furthermore, a pixel circuit, a memory circuit, and the like and a product-sum operation circuit and the like are formed to be stacked; therefore, the length of a wiring between the circuits can be shortened, and a low-
(Continued)

power consumption operation and a high-speed operation can be performed.

24 Claims, 34 Drawing Sheets

(51) Int. Cl.
| | | |
|---|---|---|
| *H10B 80/00* | (2023.01) | |
| *H10F 39/00* | (2025.01) | |
| *H10F 39/18* | (2025.01) | |
| *H10K 39/00* | (2023.01) | |
| *H01L 23/00* | (2006.01) | |

(52) U.S. Cl.
CPC ....... *H10F 39/8023* (2025.01); *H10K 39/601* (2023.02); *H01L 24/05* (2013.01); *H01L 24/08* (2013.01); *H01L 2224/05624* (2013.01); *H01L 2224/05644* (2013.01); *H01L 2224/05647* (2013.01); *H01L 2224/05684* (2013.01); *H01L 2224/08146* (2013.01)

(56) References Cited

U.S. PATENT DOCUMENTS

| | | | |
|---|---|---|---|
| 8,759,829 B2 | 6/2014 | Uochi et al. | |
| 8,916,869 B2 | 12/2014 | Koyama et al. | |
| 9,184,189 B2 | 11/2015 | Uochi et al. | |
| 9,331,112 B2 | 5/2016 | Koyama et al. | |
| 9,773,814 B2 | 9/2017 | Koyama et al. | |
| 9,773,832 B2 | 9/2017 | Kurokawa | |
| 10,020,336 B2 | 7/2018 | Ikeda et al. | |
| 10,074,687 B2 | 9/2018 | Kurokawa | |
| 10,388,687 B2 | 8/2019 | Ikeda et al. | |
| 10,600,839 B2 | 3/2020 | Kurokawa | |
| 10,659,707 B2 * | 5/2020 | Oka ................... H04N 25/766 |
| 10,904,471 B2 | 1/2021 | Matsumoto et al. | |
| 10,910,427 B2 | 2/2021 | Ikeda et al. | |
| 10,964,743 B2 | 3/2021 | Kurokawa | |
| 11,082,651 B2 | 8/2021 | Oka et al. | |
| 11,089,248 B2 | 8/2021 | Oka et al. | |
| 11,239,273 B2 | 2/2022 | Ikeda et al. | |
| 11,367,739 B2 | 6/2022 | Okamoto et al. | |
| 11,588,990 B2 | 2/2023 | Oka et al. | |
| 11,699,068 B2 | 7/2023 | Ikeda et al. | |
| 11,843,881 B2 | 12/2023 | Oka et al. | |
| 12,165,049 B2 | 12/2024 | Ikeda et al. | |
| 12,244,944 B2 | 3/2025 | Oka et al. | |
| 2007/0007567 A1 * | 1/2007 | Yaegashi ............... H01L 23/544 |
| | | | 257/295 |
| 2016/0172410 A1 | 6/2016 | Kurokawa | |
| 2017/0186800 A1 | 6/2017 | Ikeda et al. | |
| 2018/0039882 A1 | 2/2018 | Ikeda et al. | |
| 2018/0077374 A1 * | 3/2018 | Takahashi ............... H04N 25/78 |
| 2019/0034748 A1 | 1/2019 | Matsumoto et al. | |
| 2019/0297287 A1 | 9/2019 | Oka et al. | |
| 2019/0311217 A1 * | 10/2019 | Tsuji ..................... H04N 23/60 |
| 2021/0105426 A1 | 4/2021 | Matsumoto et al. | |
| 2021/0233952 A1 | 7/2021 | Kurokawa | |
| 2022/0094842 A1 * | 3/2022 | Fujiwara ................. G06N 3/045 |
| 2022/0139975 A1 | 5/2022 | Kimura et al. | |
| 2022/0149100 A1 | 5/2022 | Ikeda et al. | |
| 2025/0053798 A1 | 2/2025 | Ikeda et al. | |

FOREIGN PATENT DOCUMENTS

| | | |
|---|---|---|
| EP | 3468169 A | 4/2019 |
| EP | 3726830 A | 10/2020 |
| EP | 3748955 A | 12/2020 |
| JP | 2011-119711 A | 6/2011 |
| JP | 2016-123087 A | 7/2016 |
| JP | 2018-041943 A | 3/2018 |
| JP | 2020-065305 A | 4/2020 |
| JP | 2020-150177 A | 9/2020 |
| KR | 2017-0077800 A | 7/2017 |
| TW | 201717347 | 5/2017 |
| WO | WO-2017/168665 | 10/2017 |
| WO | WO-2017/209221 | 12/2017 |
| WO | WO-2018/025116 | 2/2018 |
| WO | WO-2019/003037 | 1/2019 |

OTHER PUBLICATIONS

International Search Report (Application No. PCT/IB2021/058180) Dated Dec. 7, 2021.

Written Opinion (Application No. PCT/IB2021/058180) Dated Dec. 7, 2021.

Taiwanese Office Action (Application No. 110132249) Dated May 9, 2025.

* cited by examiner

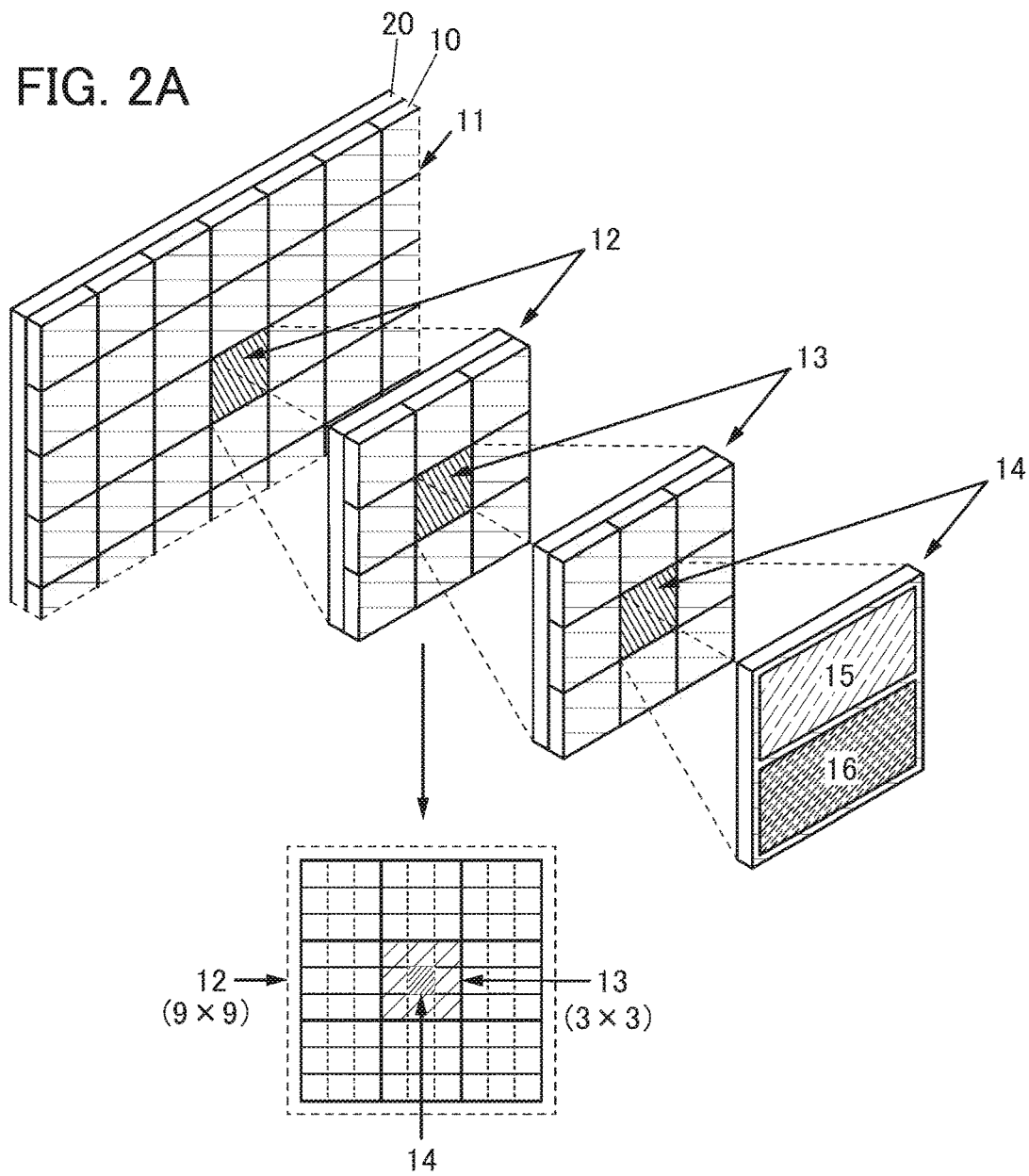
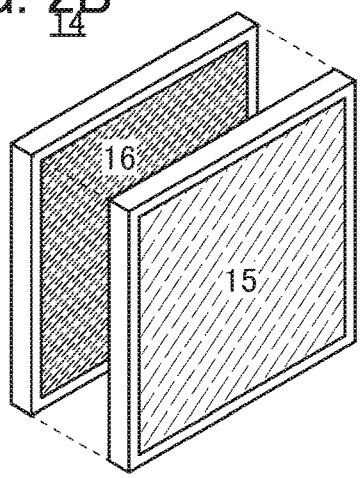
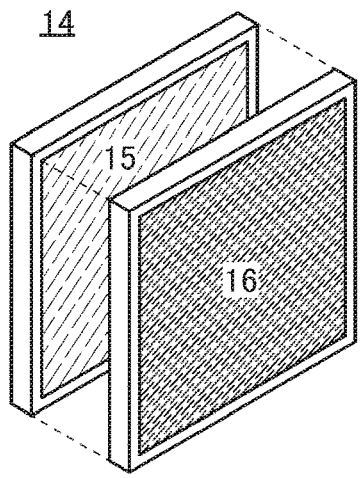

IMAGING DEVICE AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor apparatus, a display device, a liquid crystal display device, a light-emitting device, a lighting device, a power storage device, a memory device, an imaging device, an operation method thereof, and a manufacturing method thereof.

Note that in this specification and the like, a semiconductor apparatus generally means an apparatus that can function by utilizing semiconductor characteristics. A transistor and a semiconductor circuit are embodiments of semiconductor apparatuses. In addition, in some cases, a memory device, a display device, an imaging device, or an electronic device includes a semiconductor apparatus.

BACKGROUND ART

A technique for forming a transistor using an oxide semiconductor thin film formed over a substrate has attracted attention. For example, Patent Document 1 discloses an imaging device with a structure in which a transistor including an oxide semiconductor and having extremely low off-state current is used in a pixel circuit.

In addition, Patent Document 2 discloses a technique for adding an arithmetic function to an imaging device.

REFERENCE

Patent Document

[Patent Document 1] Japanese Published Patent Application No. 2011-119711
[Patent Document 2] Japanese Published Patent Application No. 2016-123087

SUMMARY OF THE INVENTION

Problems to be Solved by the Invention

Imaging devices mounted on portable devices and the like generally have a function of obtaining images with high resolution. In the next generation, an imaging device is required to be equipped with more intelligent functions.

Image data (analog data) obtained by an imaging device is converted into digital data and taken out to the outside, and then image processing is performed as necessary. If the processing can be carried out in the imaging device, higher-speed communication with an external device is possible, which improves user's convenience. Furthermore, the load and power consumption of a peripheral device or the like can be reduced.

In addition, components such as circuits that are increased when functions are added to the imaging device are preferably stacked. For example, when a plurality of circuits are provided to be overlapped with a pixel circuit, an increase in area can be inhibited and a small imaging device with an advanced function can be formed. Furthermore, the length of a wiring between the stacked circuits can be shortened, so that a high-speed operation with low power consumption can be achieved.

Thus, an object of one embodiment of the present invention is to provide an imaging device capable of image processing. Another object is to provide a small imaging device with an advanced function. Another object is to provide an imaging device capable of operating at high speed. Another object is to provide an imaging device with low power consumption. Another object is to provide a highly reliable imaging device. Another object is to provide a novel imaging device or the like. Another object is to provide a method for driving the imaging device. Another object is to provide a novel semiconductor apparatus or the like.

Note that the description of these objects does not preclude the existence of other objects. Note that in one embodiment of the present invention, there is no need to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention relates to an imaging device that has an image processing function and is capable of operating at high speed.

One embodiment of the present invention is an imaging device including a plurality of pixel blocks. The pixel block includes a first layer and a second layer. The first layer includes a region overlapped with the second layer. The pixel block includes a plurality of pixel circuits and a plurality of first memory circuits in the first layer, and a plurality of product-sum operation circuits, a plurality of first binarization circuits, and a plurality of second binarization circuits in the second layer. The pixel circuit and the first memory circuit each include a transistor including a metal oxide in a channel formation region.

Another embodiment of the present invention is an imaging device including a plurality of pixel blocks. The pixel block includes a first layer, a second layer, and a third layer. The first layer is positioned between the second layer and the third layer, or the third layer is positioned between the first layer and the second layer. The first layer to the third layer include a region where they overlap one another. The pixel block includes a plurality of pixel circuits in the first layer, a plurality of product-sum operation circuits, a plurality of first binarization circuits, and a plurality of second binarization circuits in the second layer, and a plurality of first memory circuits in the third layer. The pixel circuit and the first memory circuit each include a transistor including a metal oxide in a channel formation region.

It is preferable that the product-sum operation circuit, the first binarization circuit, and the second binarization circuit each include a transistor including silicon in a channel formation region.

The pixel circuits are as many as the first binarization circuits, and the pixel circuit can be electrically connected to one of the first binarization circuits.

One of the first binarization circuits can be electrically connected to the plurality of product-sum operation circuits.

One of the first memory circuits can be electrically connected to the plurality of product-sum operation circuits.

The product-sum operation circuits are as many as the second binarization circuits, and one of the product-sum operation circuits can be electrically connected to one of the second binarization circuits.

A driver circuit of the pixel circuit and a driver circuit of the first memory circuit can be provided in the second layer.

A second memory circuit is further included. An input terminal of the second memory circuit may be electrically connected to the plurality of second binarization circuits, and an output terminal of the second memory circuit may be electrically connected to the plurality of product-sum operation circuits.

A third memory circuit and a third binarization circuit are further included. The third memory circuit may be electrically connected to the plurality of product-sum operation circuits with the third binarization circuit therebetween.

The second memory circuit, the third memory circuit, and the third binarization circuit can be provided in the second layer.

The metal oxide preferably includes In, Zn, and M (M is one or more of Al, Ti, Ga, Ge, Sn, Y, Zr, La, Ce, Nd, and Hf).

The first memory circuit may include a memory cell, and the memory cell may include a capacitor including a ferroelectric layer.

Effect of the Invention

With the use of one embodiment of the present invention, an imaging device capable of image processing can be provided. Alternatively, a small imaging device with an advanced function can be provided. Alternatively, an imaging device capable of operating at high speed can be provided. Alternatively, an imaging device with low power consumption can be provided. Alternatively, a highly reliable imaging device can be provided. Alternatively, a novel imaging device or the like can be provided. Alternatively, a method for driving the imaging device can be provided. Alternatively, a novel semiconductor apparatus or the like can be provided.

BRIEF DESCRIPTION OF THE DRAWINGS

FIG. 2A to FIG. 2C are diagrams illustrating a pixel portion.

MODE FOR CARRYING OUT THE INVENTION

Figure 1:
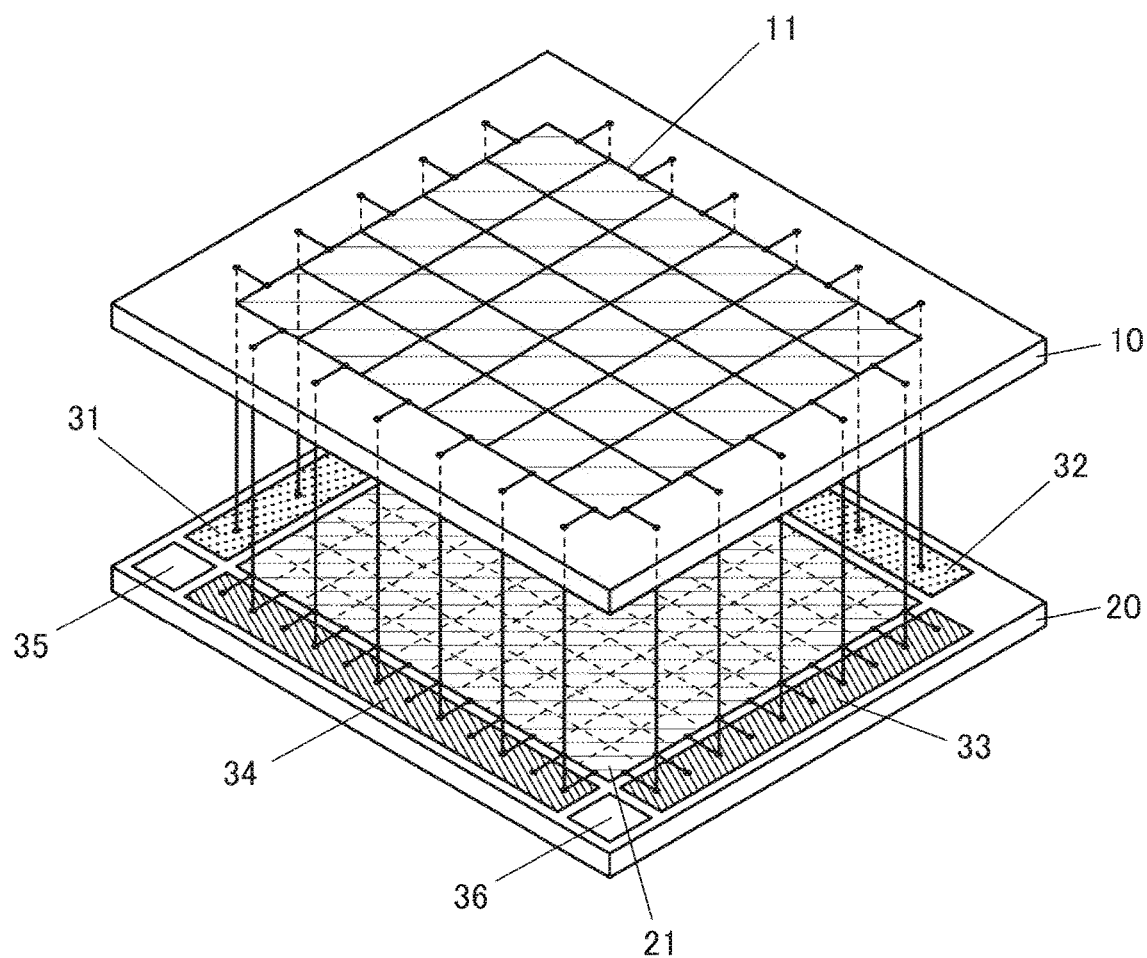
FIG. 1 is a diagram illustrating an imaging device.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through one conductor or a plurality of conductors. In this specification, even such a structure is included in the category of direct connection.

Embodiment 1

In this embodiment, an imaging device according to one embodiment of the present invention is described with reference to drawings.

One embodiment of the present invention is an imaging device having an additional function such as image processing. The imaging device binarizes analog data (image data) obtained by an imaging operation, in a pixel portion, and performs a product-sum operation using the binarized data. A memory circuit provided in the pixel portion retains a weight coefficient (also referred to as weight data or a filter) used for the product-sum operation. Thus, an arithmetic operation can be performed without the weight coefficient read from the outside every time, so that power consumption can be reduced.

In addition, a pixel circuit, a memory circuit, and the like and a product-sum operation circuit and the like are formed to be stacked in the imaging device according to one embodiment of the present invention; therefore, the length of wirings between the circuits can be shortened, and a low-power consumption operation and a high-speed operation can be performed.

<Imaging Device>

FIG. 1 is a perspective view illustrating an imaging device according to one embodiment of the present invention. The imaging device includes a layer 10 and a layer 20. The layer 10 can be provided over the layer 20. The imaging device includes a pixel portion 11 provided with a pixel circuit, a memory circuit, and the like. The pixel portion 11 includes components provided in the layer 10 and components provided in the layer 20.

A pixel circuit and a memory circuit can be provided in the layer 10. In the layer 20, a driver circuit for circuits included in the layer 10, an arithmetic circuit for data obtained by the circuits included in the layer 10, a data conversion circuit, a memory circuit, and the like can be provided. For example, an arithmetic unit 21, a row driver 31, and a column driver 32 that drive a pixel circuit, a row driver 33, and a column driver 34 that drive a memory circuit, and the like can be provided in the layer 20. Furthermore, a circuit 35, a circuit 36, and the like that have a data selection function, a data retention function, a data conversion function, a data read function, and the like may be provided in the layer 20 as needed.

The circuits included in the layer 10 and the circuits included in the layer 20 can be electrically connected to each other with electrodes, wirings, or the like passing through the layer 10. Note that some of the circuits can be provided in the layer opposite to that described above or can be provided outside the imaging device.

FIG. 2A is a diagram illustrating details of the pixel portion 11. The pixel portion 11 includes a plurality of pixel blocks 12 arranged in a matrix. In addition, the pixel block 12 includes 3×3 pixel blocks 13. Furthermore, the pixel block 13 includes 3×3 pixels 14. In other words, the pixel block 12 includes 9×9 pixels 14. The pixel 14 includes a pixel circuit and a memory circuit 16.

Note that a variety of arithmetic operations are performed in one embodiment of the present invention on the assumption that the pixel block 13 includes 3×3 pixels 14; however, the number of pixels is not limited thereto, and can be, for example, 2×2, 4×4, 5×5, or 25×25. Alternatively, the number of pixels 14 in a horizontal direction and the number of pixels 14 in a vertical direction may differ from each other. In addition, some pixel blocks 13 may be shared by adjacent pixel blocks 12. Furthermore, some pixels 14 may be shared by adjacent pixel blocks 13. Note that the number of pixel blocks 13 included in the pixel block 12 can be changed as appropriate.

Although the pixel 14 illustrated in FIG. 2A is an example in which the pixel circuit 15 and the memory circuit 16 are provided side by side in the layer 10, the pixel circuit 15 may be provided over the memory circuit 16 to overlap each other, as illustrated in FIG. 2B. Alternatively, as illustrated in FIG. 2C, the memory circuit 16 may be provided over the pixel circuit 15 to overlap each other.

Figure 3:
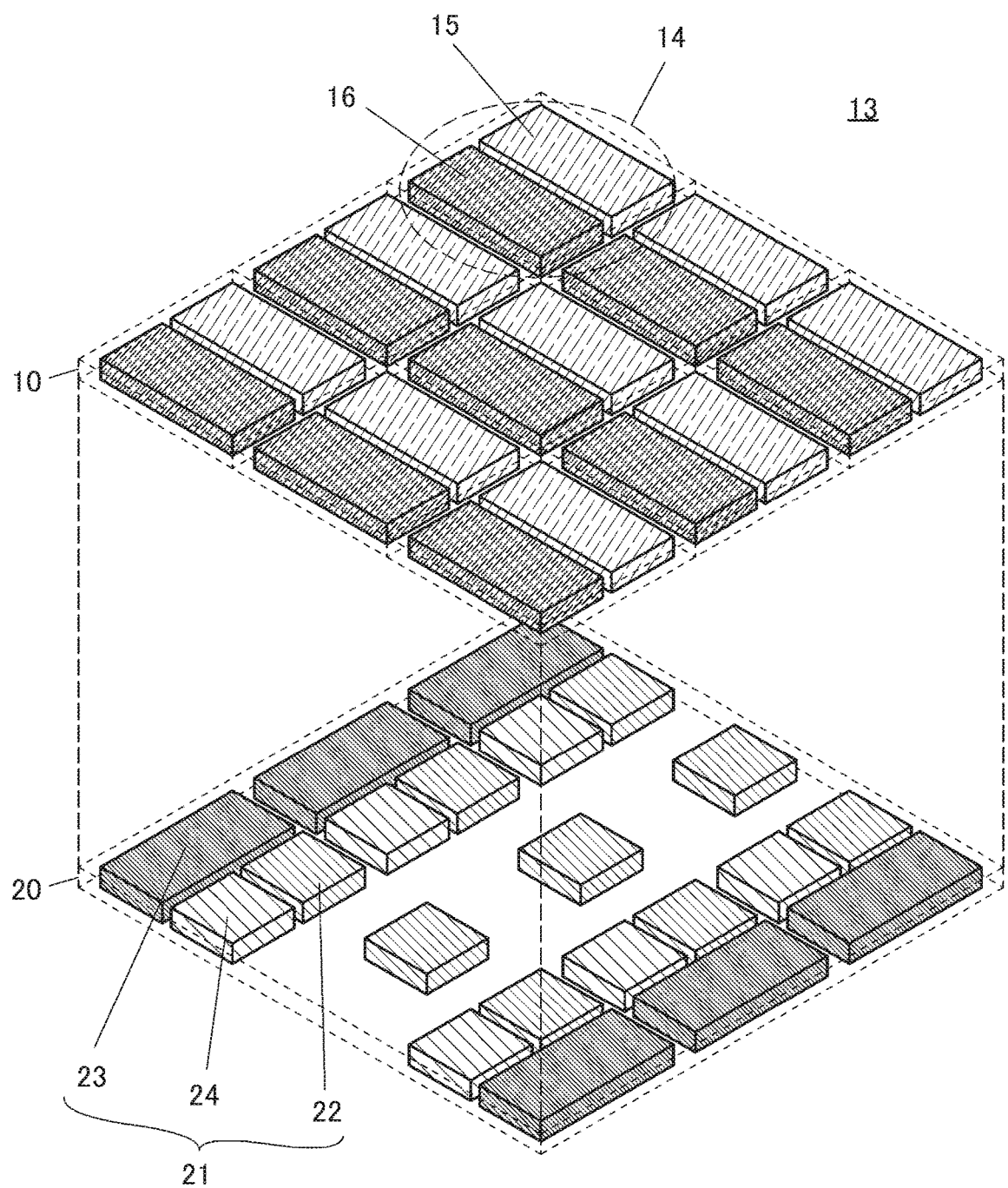
FIG. 3 is a diagram illustrating a pixel block.

FIG. 3 is a diagram illustrating components of the pixel block 13. The pixel block 13 includes 3×3 pixels 14. Therefore, the pixel block 13 includes nine pixel circuits 15 and nine memory circuits 16 in the layer 10. Furthermore, a plurality of binarization circuits 22, a plurality of product-sum operation circuits 23, and a plurality of binarization circuits 24 are provided as the arithmetic units 21 in a region (the layer 20) overlapped with the pixel circuits 15 or the memory circuits 16.

Figure 4:
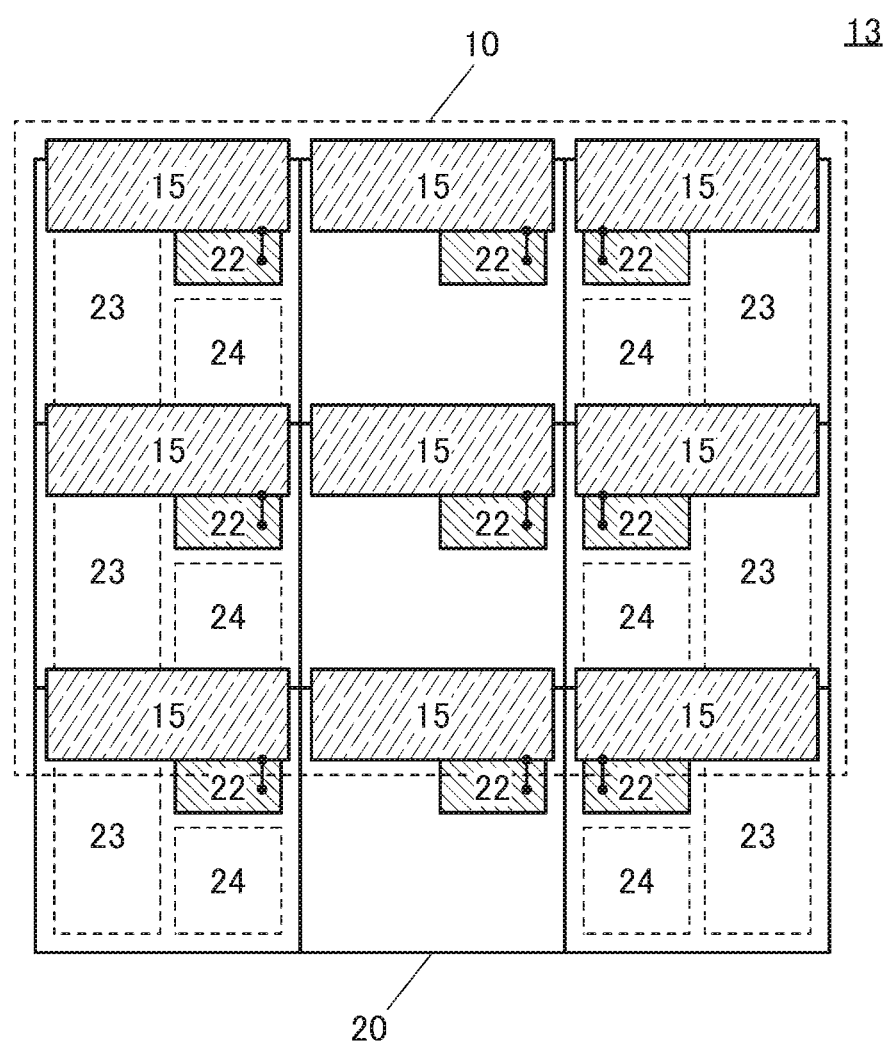
FIG. 4 is a diagram illustrating the pixel block.

The number of binarization circuits 22 is the same as that of pixel circuits 15, i.e., nine. The binarization circuit 22 is provided in a position including a region overlapped with the pixel circuit 15. FIG. 4 is a diagram illustrating a connection relationship among the pixel circuits 15 and the binarization circuits 22, in which one pixel circuit 15 is electrically connected to one binarization circuit 22 having an overlap region.

The binarization circuit 22 is a circuit that determines image data (analog data) obtained in the pixel circuit 15 by using a predetermined threshold value and binarizes the data, and a comparator can be used, for example.

A plurality of product-sum operation circuits 23 are provided in one pixel block 13. In this embodiment, an example in which six product-sum operation circuits 23 are provided is described. Note that the number of product-sum operation circuits 23 can be increased or decreased as appropriate depending on the purpose. An input terminal of the product-sum operation circuit 23 is electrically connected to the memory circuit 16 and the binarization circuit 22.

Figure 5:
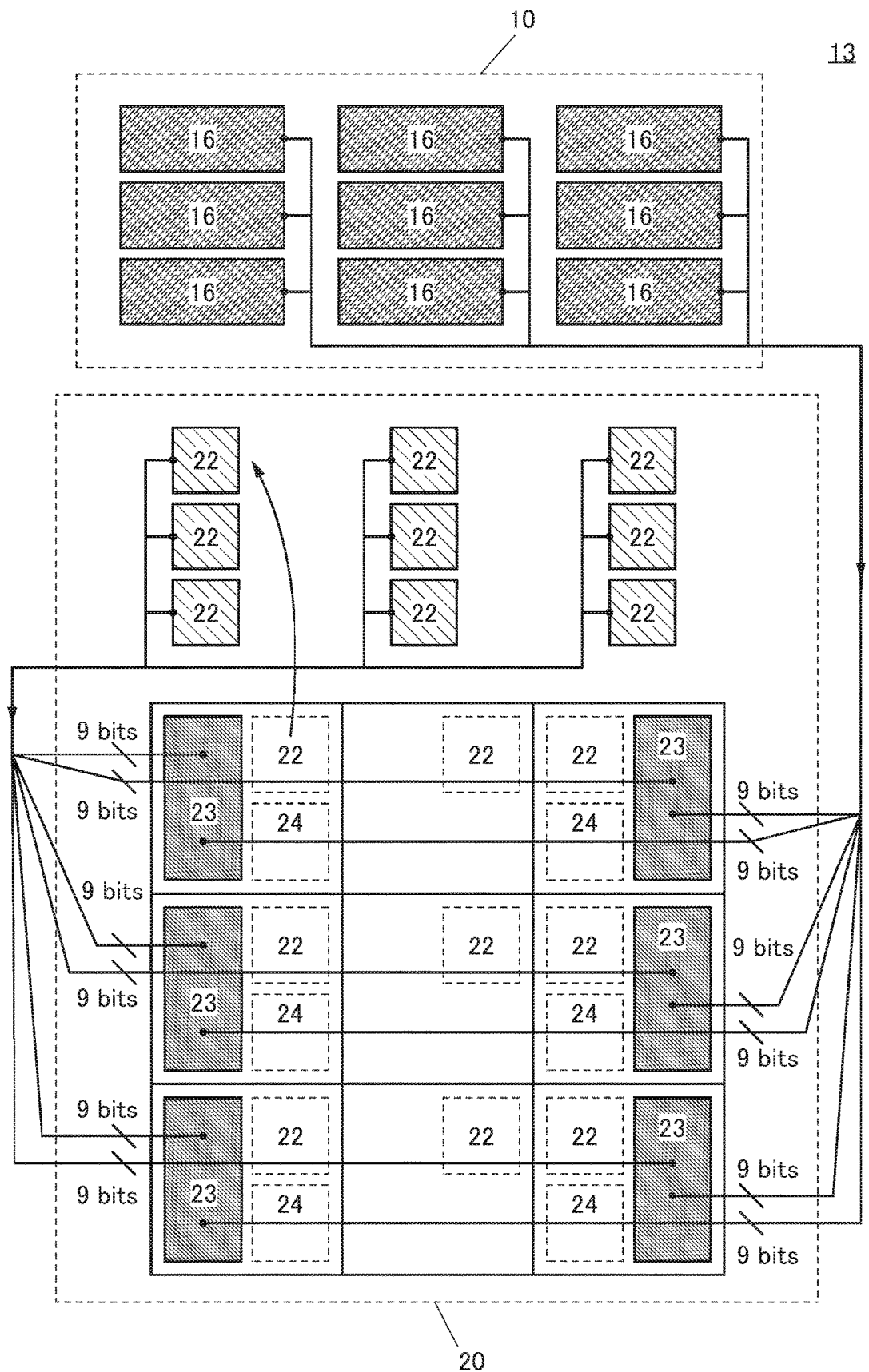
FIG. 5 is a diagram illustrating the pixel block.

FIG. 5 is a diagram illustrating a connection relationship among the product-sum operation circuits 23, the memory circuits 16, and the binarization circuits 22. Note that nine binarization circuits 22 are extracted to be illustrated in order to clearly show the connection relationship.

Nine memory circuits 16 are included in the pixel block 13, and each of the nine memory circuits 16 includes a plurality of memory cells. To each of the plurality of memory cells, a 1-bit weight coefficient can be written in advance. Each of the nine memory circuits 16 is electrically connected to each of six product-sum operation circuits 23. Therefore, 9-bit weight coefficients can be supplied to each of the product-sum operation circuits 23. The weight coefficient can be supplied from one memory circuit 16 to the six product-sum operation circuits 23; therefore, here, the operation can be performed when at least a 1-bit weight coefficient is written to one memory circuit 16.

Image data converted into 1-bit data can be output to each of the binarization circuits 22. Each of the nine binarization circuits 22 is electrically connected to each of the six product-sum operation circuits 23. Since image data can be supplied from one binarization circuit 22 to the six product-sum operation circuit 23, 9-bit image data is supplied to each of the product-sum operation circuits 23.

Figure 6A:
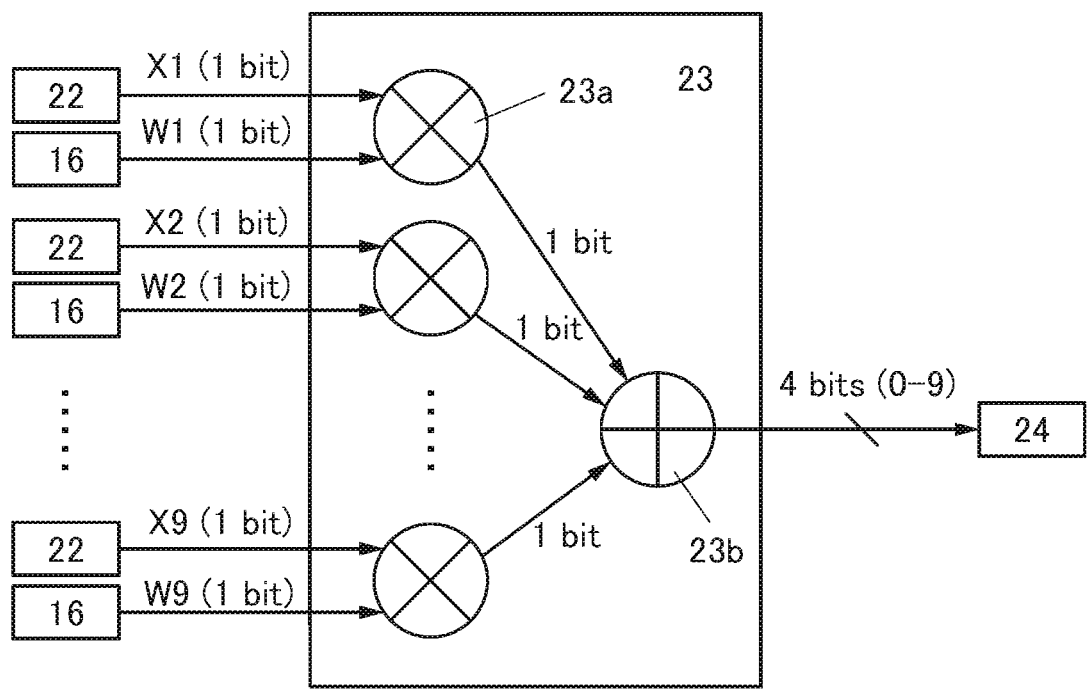
FIG. 6A is a diagram illustrating a product-sum operation circuit.

FIG. 6A is a diagram simply illustrating the structure and arithmetic operation of the product-sum operation circuit 23. The product-sum operation circuit 23 can have a structure including, for example, nine multipliers 23a and one adder 23b. Image data (X1 to X9) converted into 1-bit data in the binarization circuit 22 and a 1-bit weight coefficient (W1 to W9) read from the memory circuit 16 are input to each of the multipliers 23a, a multiplication operation is performed, and then 1-bit data is output to the adder 23b. The data input from each of the multipliers 23a is added in the adder 23b and then output to the binarization circuit 24. Here, the data output from the adder 23b (the product-sum operation circuit 23) has a value of 0 to 9 and thus is 4-bit data.

Figure 6B:
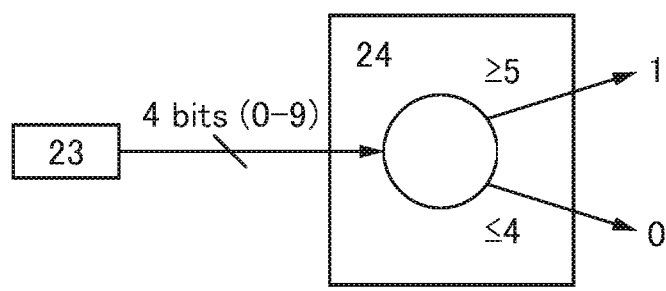
FIG. 6B is a diagram illustrating a binarization circuit.
Figure 7:
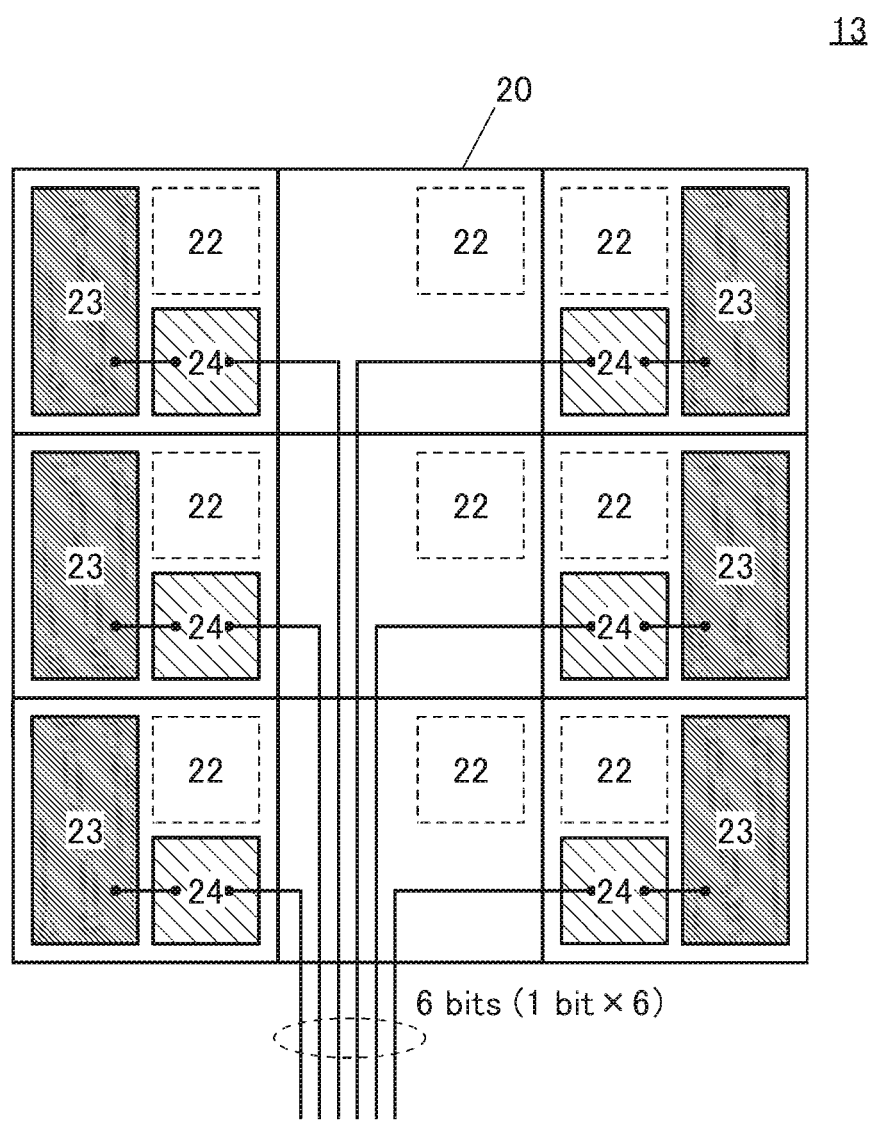
FIG. 7 is a diagram illustrating the pixel block.

FIG. 6B is a diagram illustrating the binarization circuit 24. The number of binarization circuits 24 is the same as that of the product-sum operation circuits 23, i.e., six. In addition, as illustrated in FIG. 6A, FIG. 6B, and FIG. 7, one binarization circuit 24 is electrically connected to one product-sum operation circuit 23. As illustrated in FIG. 6A and FIG. 6B, data input to the binarization circuit 24 is 4-bit digital data corresponding to 0 to 9. The binarization circuit 24 outputs 1 when the input data is determined to be greater than or equal to 5, and outputs 0 when the input data is determined to be less than or equal to 4. In other words, the binarization circuit 24 is a circuit having a function of converting 4-bit data into 1-bit data.

Figure 8:
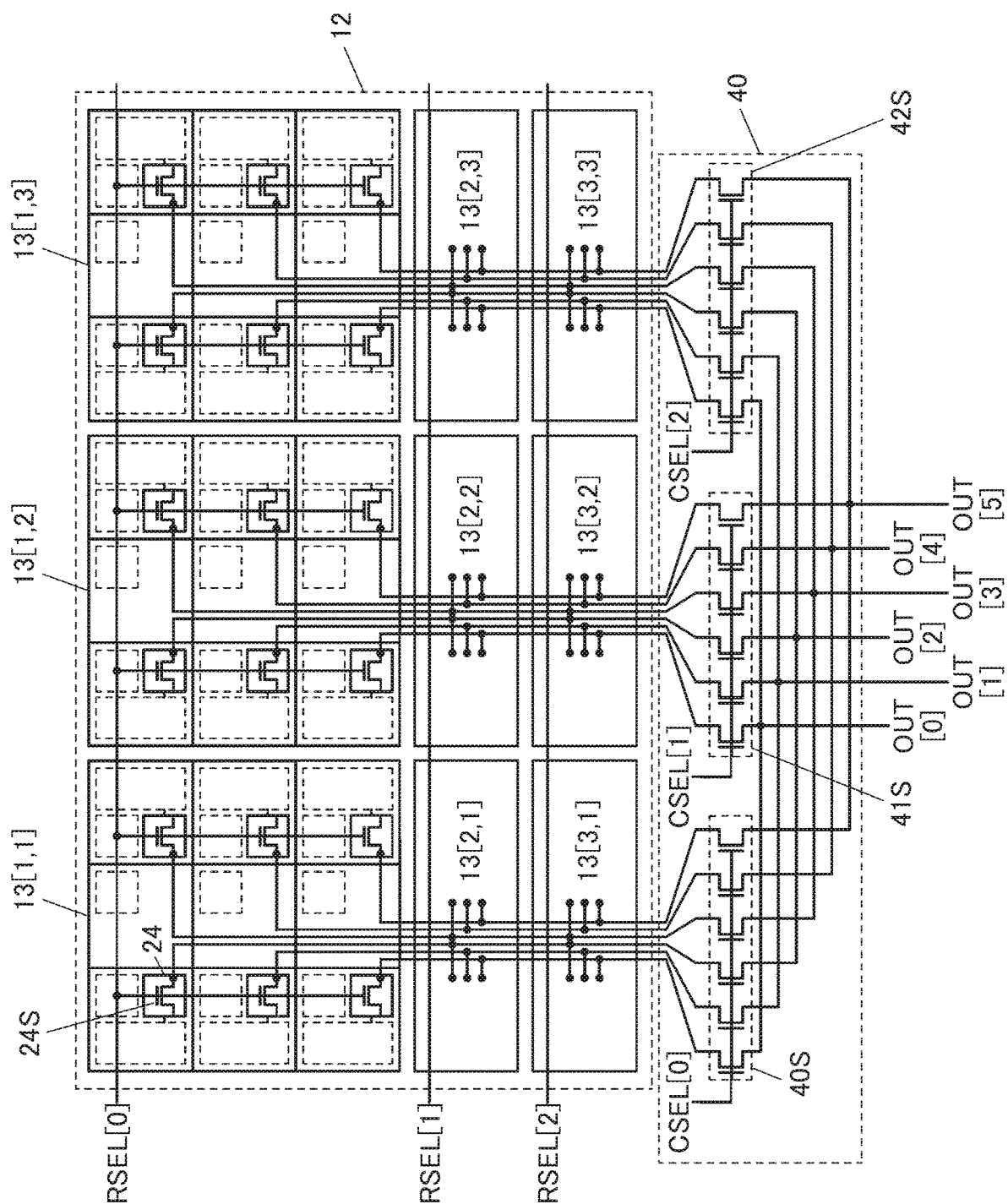
FIG. 8 is a diagram illustrating a pixel block and a read circuit.

In addition, as illustrated in FIG. 7, one pixel block 13 can output 6-bit arithmetic data. FIG. 8 is a diagram illustrating arithmetic data reading from the pixel block 12 (a pixel block 13[1,1] to a pixel block 13[3,3]).

The six binarization circuits 24 included in the pixel block 13 each include a selection transistor 24S that controls an output. Gates of the six selection transistors 24S are electrically connected to a wiring RSEL (a wiring RSEL[0], a wiring RSEL[1], or a wiring RSEL[2]). The wiring RSEL is shared by the pixel blocks 13 provided in a row direction. In addition, six output lines OUT (OUT[0] to OUT[5]) to which six binarization circuits 24 are electrically connected are shared by the pixel blocks 13 provided in a column direction.

A read circuit 40 is electrically connected to the six output lines OUT. The read circuit 40 includes a switch 40S, a switch 41S, and a switch 42S each of which is electrically connected to the six output lines OUT in the corresponding column.

The switch 40S to the switch 42S include a plurality of transistors. Gates of the transistors included in the switch 40S are electrically connected to a wiring CSEL[0]. Gates of the transistors included in the switch 41S are electrically connected to a wiring CSEL[1]. Gates of the transistors included in the switch 42S are electrically connected to a wiring CSEL[2].

Every three wirings of the switch 40S to the switch 42S on the output side are electrically connected to one output line OUT. With such a structure, data for each pixel block 13 can be output.

Note that the read circuit 40 can be provided in the layer 20 as a component of the circuit 35 or the circuit 36 illustrated in FIG. 1.

Figure 9:
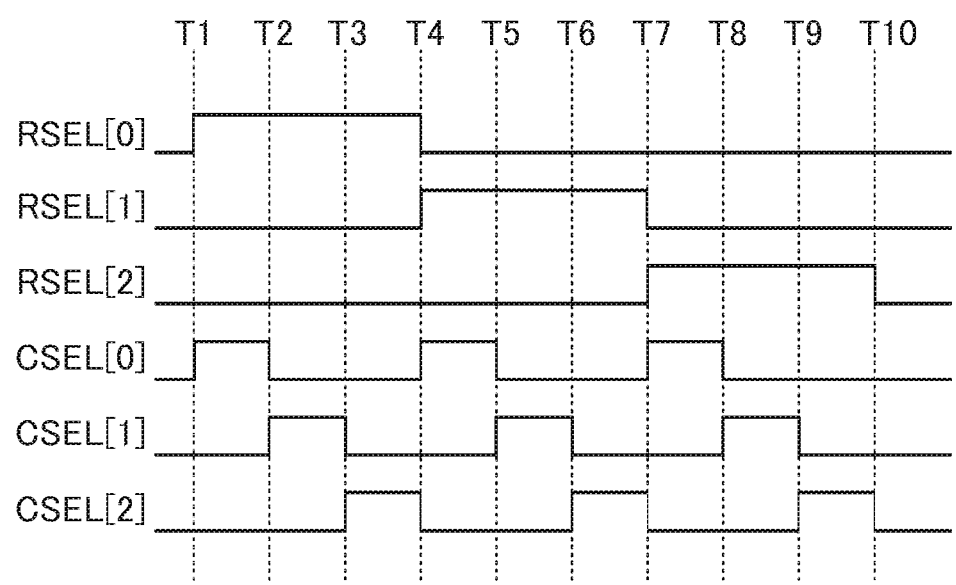
FIG. 9 is a timing chart showing the operation of the read circuit.

FIG. 9 is a timing chart showing arithmetic data reading from the pixel block 12 (the pixel block 13[1,1] to the pixel block 13[3,3]). Note that all the arithmetic operations are terminated in each pixel block 13 before Time T1, and arithmetic data is retained in the binarization circuits 24. In addition, in the following description, a potential (high potential) that brings a transistor into conduction is expressed as "H," and a potential (low potential) that brings a transistor out of conduction is expressed as "L."

The potential of the wiring RSEL[0] is set to "H" at Time T1, so that the selection transistors 24S included in all the binarization circuits 24 of the pixel blocks 13 provided in a zeroth row are brought into conduction and arithmetic data is output to the read circuit 40.

In addition, the potential of the wiring CSEL[0] is set to "H" at Time T1, so that the switch 40S whose gate is electrically connected to the wiring CSEL[0] is brought into conduction and arithmetic data of the pixel block 13[1,1] is output to the output line OUT[0] to the output line OUT[5].

The potential of the wiring CSEL[0] is set to "L" and the potential of the wiring CSEL[1] is set to "H" at Time T2, so that the switch 40S is brought out of conduction, the switch 41S whose gate is electrically connected to the wiring CSEL[1] is brought into conduction, and arithmetic data of the pixel block 13[1,2] is output to the output line OUT[0] to the output line OUT[5].

The potential of the wiring CSEL[1] is set to "L" and the potential of the wiring CSEL[2] is set to "H" at Time T3, so that the switch 41S is brought out of conduction, the switch 42S whose gate is electrically connected to the wiring CSEL[2] is brought into conduction, and arithmetic data of the pixel block 13[1,3] is output to the output line OUT[0] to the output line OUT[5].

The potential of the wiring RSEL[0] is set to "L" and the potential of the wiring CSEL[2] is set to "L" at Time T4, so that the output of the arithmetic data of the pixel blocks 13 (the pixel block 13[1,1] to the pixel block 13[1,3]) in the zeroth row is terminated.

The potential of the wiring RSEL[1] is set to "H" and operations similar to those described above are performed from Time T4 to Time T7, so that arithmetic data of the pixel blocks 13 (the pixel block 13[2,1] to the pixel block 13[2,3]) in a first row is output. In addition, the potential of the wiring RSEL[2] is set to "H" and operations similar to those described above are performed from Time T7 to Time T10, so that arithmetic data of the pixel blocks 13 (the pixel block 13[3,1] to the pixel block 13[3,3]) in a second row is output.

Here, when an arithmetic operation is completed in one clock and a read operation of one pixel block 13 is performed in one clock, one pixel block 12 can be read in 10 clocks in total. Note that when the read circuits 40 are as many as the columns of the pixel blocks 12, the pixel blocks 12 for one row can be read in parallel.

<Pixel Circuit>

Figure 10A:
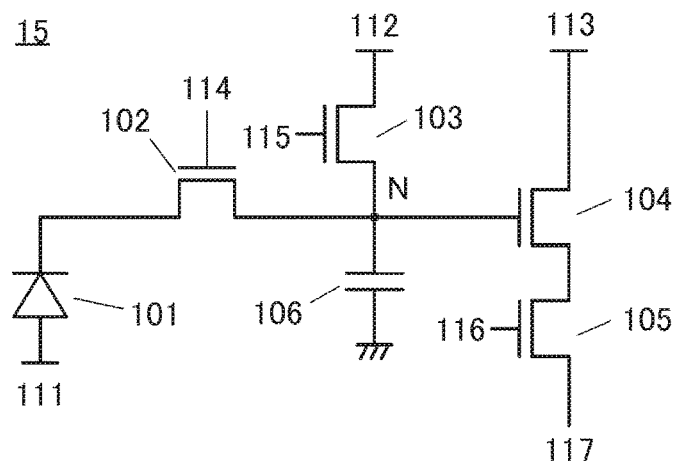
FIG. 10A to FIG. 10C are diagrams each illustrating a pixel circuit.

As illustrated in FIG. 10A, the pixel circuit 15 can include a photoelectric conversion device 101, a transistor 102, a transistor 103, a transistor 104, a transistor 105, and a capacitor 106.

One electrode of the photoelectric conversion device 101 is electrically connected to one of a source and a drain of the transistor 102. The other of the source and the drain of the transistor 102 is electrically connected to one of a source and a drain of the transistor 103, one electrode of the capacitor 106, and a gate of the transistor 104. One of a source and a drain of the transistor 104 is electrically connected to one of a source and a drain of the transistor 105.

The other electrode of the photoelectric conversion device 101 is electrically connected to a wiring 111. A gate of the transistor 102 is electrically connected to a wiring 114. The other of the source and the drain of the transistor 103 is electrically connected to a wiring 112. A gate of the transistor 103 is electrically connected to a wiring 115. The other of the source and the drain of the transistor 104 is electrically connected to a wiring 113. The other of the source and the drain of the transistor 105 is electrically connected to a wiring 117. A gate of the transistor 105 is electrically connected to a wiring 116.

Here, a point (wiring) where the other of the source and the drain of the transistor 102, the one of the source and the drain of the transistor 103, the one electrode of the capacitor 106, and the gate of the transistor 104 are electrically connected is referred to as a node N.

The wirings 111, 112, and 113 can each have a function of a power supply line. For example, the wiring 111 can function as a low potential power supply line, and the wiring 112 and the wiring 113 can function as high potential power supply lines. Note that the wiring 112 and the wiring 113 may be electrically connected to each other. The wirings 114, 115, and 116 can function as signal lines that control the conduction of the respective transistors. The wiring 117 can function as a wiring that electrically connects the pixel circuit 15 and the binarization circuit 22.

As the photoelectric conversion device 101, a photodiode can be used. In order to increase light detection sensitivity at low illuminance, an avalanche photodiode is preferably used.

The transistor 102 can have a function of controlling the potential of the node N. The transistor 103 can have a function of initializing the potential of the node N. The transistor 104 can have a function of making current flow in accordance with the potential of the node N. The transistor 105 can have a function of selecting a pixel.

Note that the connection direction of a pair of electrodes included in the photoelectric conversion device 101 may be reversed. In this case, the wiring 111 functions as a high potential power supply line and the wiring 112 functions as a low potential power supply line.

A transistor using a metal oxide in a channel formation region (an OS transistor) is preferably used as each of the transistors 102 and 103. The OS transistor has a feature of extremely low off-state current. When OS transistors are used as the transistors 102 and 103, a period during which charge can be retained at the node N can be greatly lengthened. Furthermore, a global shutter mode in which a charge accumulation operation is performed in all the pixels at the same time can be employed without complicating a circuit structure and an operation method.

Meanwhile, it is sometimes desired that the transistor 104 have excellent amplifying properties. In addition, a transistor having high mobility capable of operating at high speed is sometimes preferably used as the transistor 105. Accordingly, a transistor using silicon in a channel formation region (a Si transistor) may be employed as each of the transistors 104 and 105.

Note that without limitation to the above, an OS transistor and a Si transistor may be freely employed in combination. Alternatively, all the transistors may be OS transistors. Alternatively, all the transistors may be Si transistors. Examples of the Si transistor include a transistor including amorphous silicon and a transistor including crystalline silicon (microcrystalline silicon, low temperature polysilicon, or single crystal silicon).

Figure 10B:
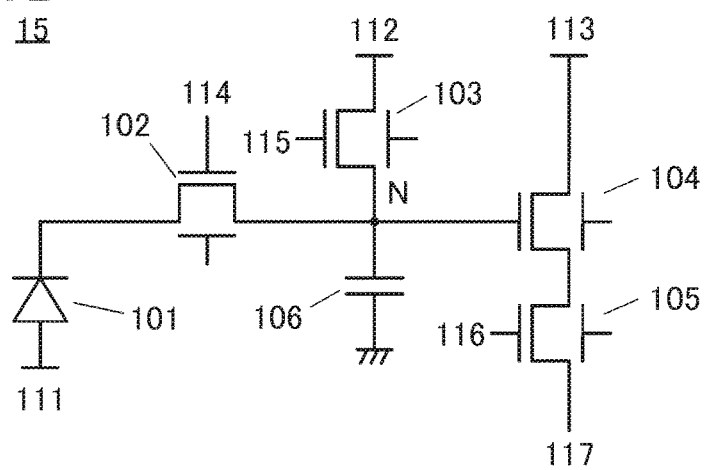

In addition, as illustrated in FIG. 10B, a structure in which each transistor is provided with a back gate (a second gate) may be employed. Electrical connection between the back gate and a front gate can increase the on-state current of the transistor. Furthermore, supplying an appropriate constant potential to the back gate can control the threshold voltage of the transistor. Note that the structure in which a transistor is provided with a back gate can be employed for other circuits in this specification. Alternatively, a circuit may include both a transistor with a back gate and a transistor without a back gate.

Figure 10C:
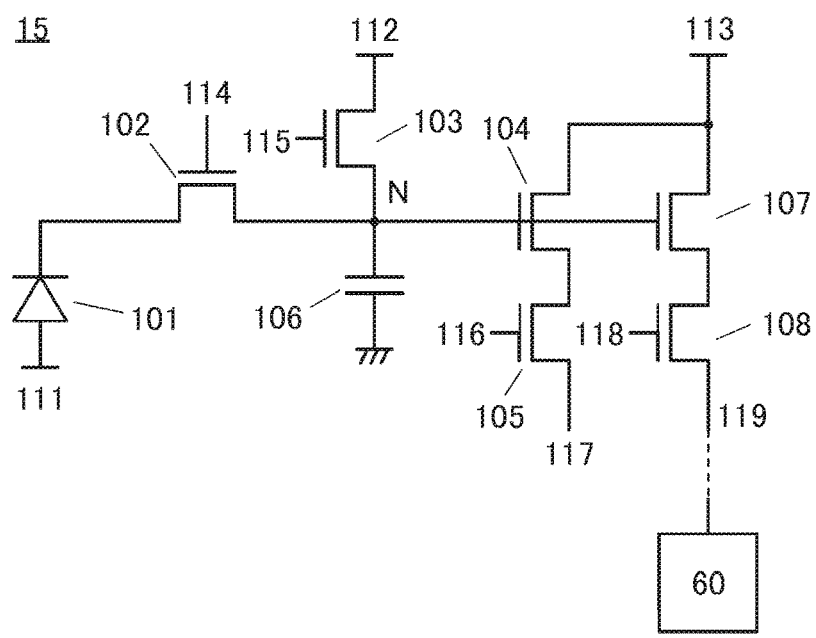

Alternatively, as illustrated in FIG. 10C, a transistor 107 and a transistor 108 may be added to the structure in FIG. 10A. A gate of the transistor 107 is electrically connected to the gate of the transistor 104. One of a source and a drain of the transistor 107 is electrically connected to one of a source and a drain of the transistor 108. The other of the source and the drain of the transistor 107 is electrically connected to the wiring 113. A gate of the transistor 108 is electrically connected to a wiring 118. The other of the source and the drain of the transistor 108 is electrically connected to a wiring 119.

Here, the wiring 118 can function as a signal line that controls the conduction of the transistor 108. In addition, the wiring 119 can be electrically connected to a circuit 60. The circuit 60 is an image read circuit, for which a CDS circuit (correlated double sampling circuit) or the like can be used, for example. With the use of the structure, image data can be output to the wiring 117 and the wiring 119. The image data output to the wiring 117 is input to the binarization circuit 22 and then subjected to a product-sum operation. The image data output to the wiring 119 is read to the outside through the circuit 60. These operations can be performed in parallel. Alternatively, only an arithmetic operation (image processing) or only image data reading can be performed.

Note that the circuit 60 can be provided in the layer 20 as a component of the circuit 35 or the circuit 36 illustrated in FIG. 1.

<Memory Circuit 1>

As illustrated in FIG. 2, the memory circuit 16 is provided in the pixel 14. Furthermore, the memory circuit 16 includes a plurality of memory cells, and 1-bit data corresponding to a weight coefficient is stored in the memory cell.

Figure 11A:
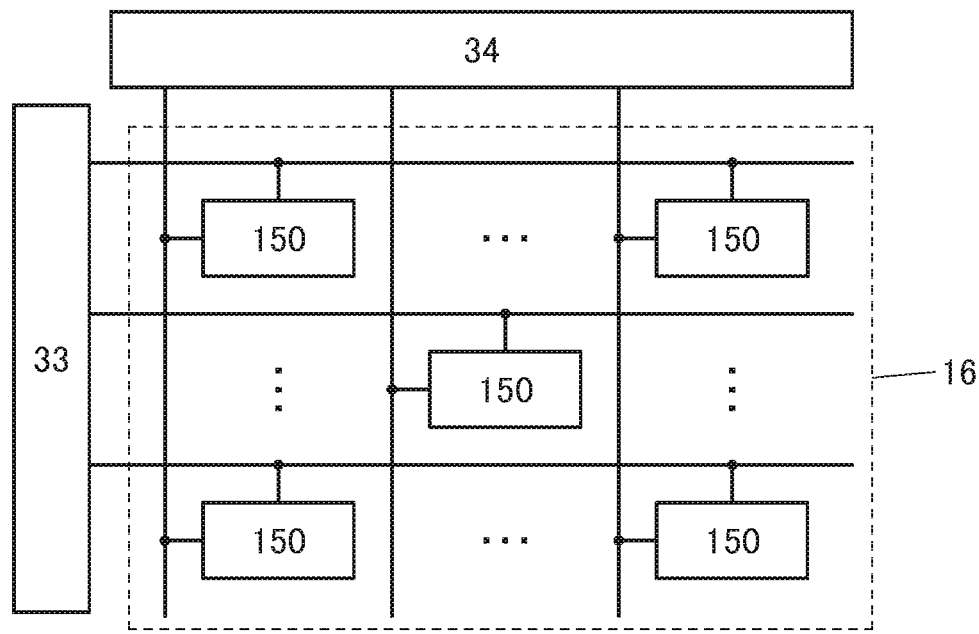
FIG. 11A is a diagram illustrating a memory circuit.

FIG. 11A is a diagram illustrating a connection relationship among memory cells 150 included in the memory circuit 16, the row driver 33, and the column driver 34. The plurality of memory cells 150 are provided in the layer 10 as the memory circuit 16. The row driver 33 and the column driver 34 are driver circuits for the memory cells 150 and can be provided in the layer 20. Note that a sense amplifier or the like may be used for data reading.

The memory circuit 16 includes m×n memory cells 150 in total; m memory cells (m is an integer greater than or equal to 1) in a column and n memory cells (n is an integer greater than or equal to 1) in a row, and the memory cells 150 are arranged in a matrix.

Figure 11B:
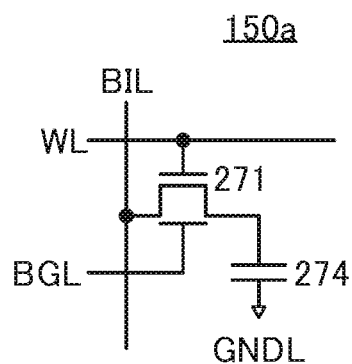
FIG. 11B to FIG. 11D are diagrams each illustrating a memory cell.
Figure 11C:
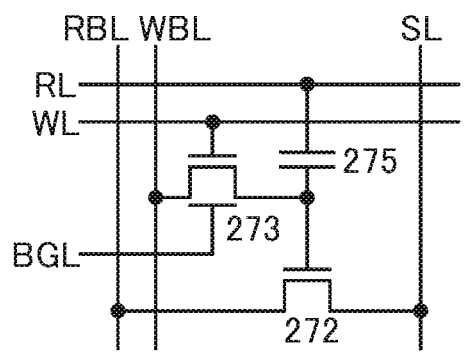
Figure 11D:
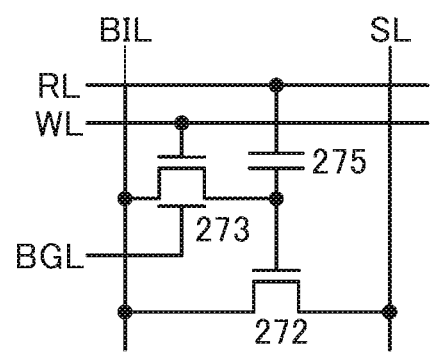

FIG. 11B to FIG. 11D are diagrams illustrating a memory cell 150a to a memory cell 150c that can be applied to the memory cells 150. Note that in the following description, a bit line and the like can be electrically connected to the column driver 34. In addition, a word line and the like can be electrically connected to the row driver 33. Note that although not illustrated here, the bit line and the like are also electrically connected to the product-sum operation circuit 23.

For each of the row driver 33 and the column driver 34, a decoder or a shift register can be used, for example. Note that a plurality of row drivers 33 and a plurality of column drivers 34 may be provided.

FIG. 11B illustrates a circuit configuration example of the memory cell 150a of a DRAM type. The memory cell 150a includes a transistor 271 and a capacitor 274.

One of a source and a drain of the transistor 271 is connected to one electrode of the capacitor 274. The other of the source and the drain of the transistor 271 is connected to a wiring BIL. A gate of the transistor 271 is connected to a wiring WL. A back gate of the transistor 271 is connected to a wiring BGL. The other electrode of the capacitor 274 is connected to a wiring GNDL. The wiring GNDL is a wiring for applying a low-level potential (reference potential).

The wiring BIL functions as a bit line. The wiring WL functions as a word line. The wiring BGL functions as a wiring for applying a potential to the back gate of the transistor 271. By applying an appropriate potential to the wiring BGL, the threshold voltage of the transistor 271 can be increased or decreased. Alternatively, the wiring BGL may be electrically connected to the wiring WL. By applying the same potential to the wiring WL and the wiring BGL, the on-state current of the transistor 271 can be increased.

Data writing and reading are performed in such a manner that a high-level potential is applied to the wiring WL to bring the transistor 271 into conduction so that the wiring BIL is electrically connected to the one electrode of the capacitor 274. For example, a sense amplifier is electrically connected to the wiring BIL, and the potential of the wiring BIL that is amplified by the sense amplifier can be read.

An OS transistor is preferably used as the transistor 271. In this specification and the like, a DRAM using an OS transistor is referred to as a DOSRAM (Dynamic Oxide Semiconductor Random Access Memory).

An OS transistor using an oxide semiconductor including indium, gallium, and zinc has a feature of extremely low off-state current. The use of an OS transistor as the transistor 271 enables the leakage current of the transistor 271 to be extremely low. That is, written data can be retained for a long time with the transistor 271; thus, the frequency of refresh of the memory cell can be reduced. Alternatively, a refresh operation for the memory cell can be unnecessary.

FIG. 11C illustrates a circuit structure example of the memory cell 150b that is of a gain cell type including two transistors and one capacitor (also referred to as "2Tr1C-type"). The memory cell 150b includes a transistor 273, a transistor 272, and a capacitor 275.

One of a source and a drain of the transistor 273 is connected to one electrode of the capacitor 275. The other of the source and the drain of the transistor 273 is connected to a wiring WBL. A gate of the transistor 273 is connected to the wiring WL. A back gate of the transistor 273 is connected to the wiring BGL. The other electrode of the capacitor 275 is connected to a wiring RL. One of a source and a drain of the transistor 272 is connected a wiring RBL. The other of the source and the drain of the transistor 272 is connected to a wiring SL. A gate of the transistor 272 is connected to the one electrode of the capacitor 275.

The wiring WBL functions as a write bit line. The wiring RBL functions as a read bit line. The wiring WL functions as a word line. The wiring RL functions as a wiring for applying a predetermined potential to the other electrode of the capacitor 275. A reference potential is preferably applied to the wiring RL at the time of data writing and during data retention.

The wiring BGL functions as a wiring for applying a potential to the back gate of the transistor 273. By applying an appropriate potential to the wiring BGL, the threshold voltage of the transistor 273 can be increased or decreased. Alternatively, the wiring BGL may be electrically connected to the wiring WL. By applying the same potential to the wiring WL and the wiring BGL, the current characteristics of the transistor 273 can be improved.

Data writing is performed in such a manner that a high-level potential is applied to the wiring WL to bring the transistor 273 into conduction so that the wiring WBL is electrically connected to the one electrode of the capacitor 275. Specifically, when the transistor 273 is in a conduction state, a potential corresponding to information to be recorded is applied to the wiring WBL, so that the potential is written to the one electrode of the capacitor 275 and the gate of the transistor 272. After that, a low-level potential is applied to the wiring WL to bring the transistor 273 out of conduction, so that the potential of the one electrode of the capacitor 275 and the potential of the gate of the transistor 272 are retained.

Data reading is performed by applying a predetermined potential to the wiring RL and the wiring SL. Current flowing between the source and the drain of the transistor 272 and the potential of the one of the source and the drain of the transistor 273 are determined by the potential of the gate of the transistor 272 and the potential of the other of the source and the drain of the transistor 273; thus, by reading the potential of the wiring RBL connected to the one of the source and the drain of the transistor 272, the potential retained at the one electrode of the capacitor 275 (or the gate of the transistor 272) can be read. In other words, information written to this memory cell can be read from the potential retained at the one electrode of the capacitor 275 (or the gate of the transistor 272). Alternatively, existence or absence of information written to this memory cell can be found.

Alternatively, as illustrated in FIG. 11D, a structure may be employed in which the wiring WBL and the wiring RBL are combined into one wiring BIL. The memory cell 150c illustrated in FIG. 11D has a structure in which one wiring BIL corresponds to the wiring WBL and the wiring RBL in the memory cell 150b and the other of the source and the drain of the transistor 273 and the one of the source and the drain of the transistor 272 are connected to the wiring BIL. In other words, the memory cell 150c has a structure in which one wiring BIL operates as a write bit line and a read bit line.

Note that also in each of the memory cell 150b and the memory cell 150c, an OS transistor is preferably used as the transistor 273. A memory device using a 2Tr1C-type memory cell using an OS transistor as the transistor 273, such as the memory cell 150b or the memory cell 150c, is referred to as a NOSRAM (Non-volatile Oxide Semiconductor Random Access Memory). Note that the circuit structure of the memory cell can be changed as appropriate.

<Memory Circuit 2>

Figure 12A:
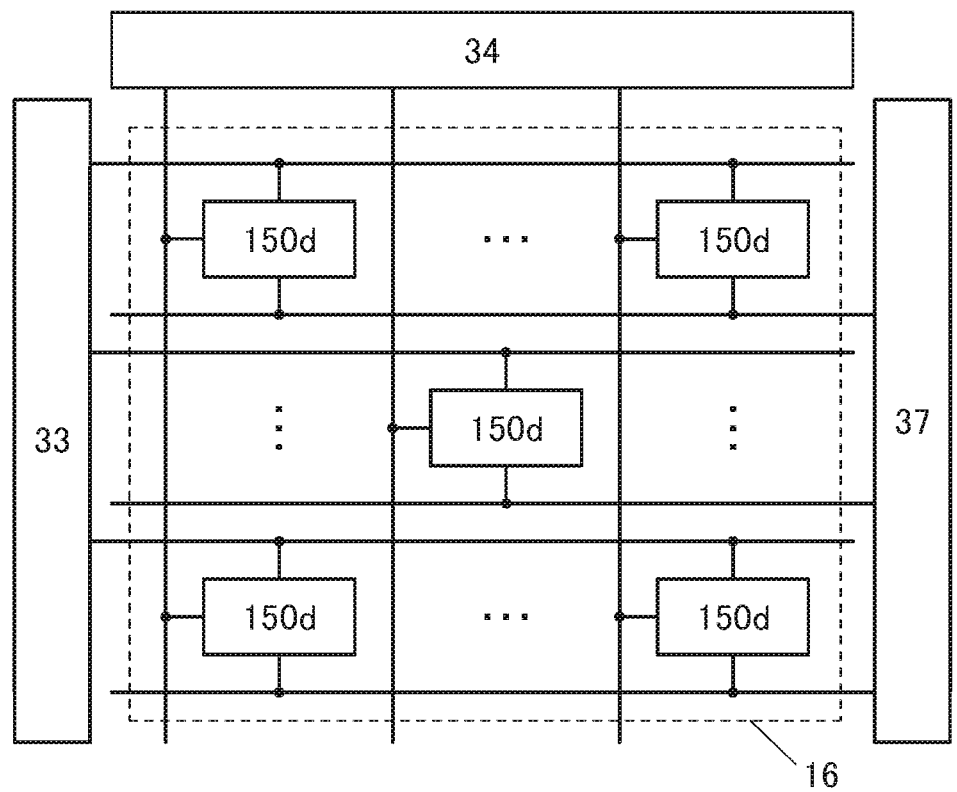
FIG. 12A is a diagram illustrating the memory circuit.

Alternatively, the memory circuit 16 may have a structure illustrated in FIG. 12A. A memory cell 150d illustrated in FIG. 12B can be used in the memory circuit 16 with the structure illustrated in FIG. 12A.

The memory cell 150d includes a transistor 276 and a capacitor 277. One of a source and a drain of the transistor 276 is connected to one electrode of the capacitor 277. The other of the source and the drain of the transistor 276 is connected to the wiring BIL. A gate of the transistor 276 is connected to the wiring WL. In addition, the other electrode of the capacitor 277 is connected to a wiring PL.

The wiring BIL functions as a bit line. The wiring WL functions as a word line. The wiring PL is a wiring for applying a plate potential required for data writing or data reading to the capacitor 277. A circuit 37 illustrated in FIG. 12A is a circuit that supplies a plate potential and can be provided in the layer 20 as a component of the circuit 35 or the circuit 36. In addition, a sense amplifier may be electrically connected to the wiring BIL. The potential of the wiring BIL that is amplified by the sense amplifier can be read.

A Si transistor, an OS transistor, or the like can be used as the transistor 276. In the case where an OS transistor is used as the transistor 276, it is preferable to provide a back gate that is electrically connected to the wiring BGL, as illustrated in FIG. 12C. By applying an appropriate potential to the wiring BGL, the threshold voltage of the transistor 271 can be increased or decreased. Alternatively, the wiring BGL may be electrically connected to the wiring WL. By applying the same potential as the potential of the wiring WL to the wiring BGL, the current characteristics of the transistor 271 can be improved.

In addition, OS transistors have characteristics of high breakdown voltage. Thus, with the use of an OS transistor as the transistor 276, high voltage can be applied to the transistor 276 even when the transistor 276 is miniaturized. Miniaturization of the transistor 276 can reduce the occupation area of the memory cell 150*d*.

The capacitor 277 contains a material that can have ferroelectricity as a dielectric layer between the two electrodes. In the following description, the dielectric layer of the capacitor 277 is referred to as a ferroelectric layer. In addition, a capacitor including a ferroelectric layer can be referred to as a ferroelectric capacitor. Furthermore, a structure in which a switch such as a transistor is combined with a ferroelectric capacitor can be referred to as a ferroelectric memory.

Examples of the material that can have ferroelectricity include a material where an element J1 (here, the element J1 is zirconium (Zr), silicon (Si), aluminum (Al), gadolinium (Gd), yttrium (Y), lanthanum (La), strontium (Sr), or the like) is added to hafnium oxide, zirconium oxide, $HfZrO_X$ (X is a real number greater than 0), or hafnium oxide and a material where an element J2 (here, the element J2 is hafnium (Hf), silicon (Si), aluminum (Al), gadolinium (Gd), yttrium (Y), lanthanum (La), strontium (Sr), or the like) is added to zirconium oxide. Alternatively, as the material that can have ferroelectricity, piezoelectric ceramics with a perovskite structure, such as lead titanate (PT), barium strontium titanate (BST), strontium titanate, lead zirconate titanate (PZT), strontium bismuth tantalate (SBT), bismuth ferrite (BFO), or barium titanate, may be used. Alternatively, as the material that can have ferroelectricity, a mixture or a compound containing a plurality of materials selected from the materials described above can be used, for example. Alternatively, the ferroelectric layer can have a stacked-layer structure of a plurality of materials selected from the materials described above.

In particular, as the material that can have ferroelectricity, a material that contains hafnium oxide, or hafnium oxide and zirconium oxide can have ferroelectricity even the material is processed into a thin film with several nanometers. When the ferroelectric layer can be formed of a thin film, compatibility with a transistor miniaturization step can be improved.

Alternatively, in the case where $HfZrO_X$ is used as the material that can have ferroelectricity, it is preferable to deposit $HfZrO_X$ by an atomic layer deposition (ALD) method, especially a thermal ALD method. In addition, in the case where the material that can have ferroelectricity is deposited by a thermal ALD method, it is preferable to use a material that does not contain hydrocarbon (also referred to as Hydro Carbon or HC) as a precursor. In the case where either one or both hydrogen and carbon are contained in the material that can have ferroelectricity, crystallization of the material that can have ferroelectricity is inhibited in some cases. Therefore, it is preferable to use a precursor that does not contain hydrocarbon as described above so that the concentration of either one or both hydrogen and carbon in the material that can have ferroelectricity is reduced. For example, a chlorine-based material can be given as the precursor that does not contain hydrocarbon. Note that in the case where a material containing hafnium oxide and zirconium oxide ($HfZrO_X$) is used as the material that can have ferroelectricity, $HfCl_4$ and/or $ZrCl_4$ is used as the precursor.

Note that in the case where a film using the material that can have ferroelectricity is deposited, impurities in the film, here, at least one or more of hydrogen, hydrocarbon, and carbon are thoroughly eliminated, so that a highly purified intrinsic film having ferroelectricity can be formed. Note that the highly purified intrinsic film having ferroelectricity has extremely high manufacturing process compatibility with a highly purified intrinsic oxide semiconductor to be described in a later embodiment. Thus, a highly productive method for manufacturing a semiconductor apparatus can be provided.

In addition, in the case where $HfZrO_X$ is used as the material that can have ferroelectricity, it is preferable to deposit hafnium oxide and zirconium oxide alternately by a thermal ALD method so that their composition ratio is 1:1.

In addition, in the case where the material that can have ferroelectricity is deposited by a thermal ALD method, $H_2O$ or $O_3$ can be used as an oxidizing agent. Note that the oxidizing agent of the thermal ALD method is not limited thereto. For example, one or more selected from $O_2$, $O_3$, $N_2O$, $NO_2$, $H_2O$, and $H_2O_2$ may be contained as the oxidizing agent of the thermal ALD method.

In addition, the crystalline structure of the material that can have ferroelectricity is not particularly limited. For example, as the crystalline structure of the material that can have ferroelectricity, one or more selected from a cubic crystalline structure, a tetragonal crystalline structure, an orthorhombic crystalline structure, and a monoclinic crystalline structure are used. In particular, the material that can have ferroelectricity preferably has an orthorhombic crystalline structure because the material exhibits ferroelectricity. Alternatively, the material that can have ferroelectricity may have a hybrid structure including an amorphous structure and a crystalline structure.

Figure 13A:
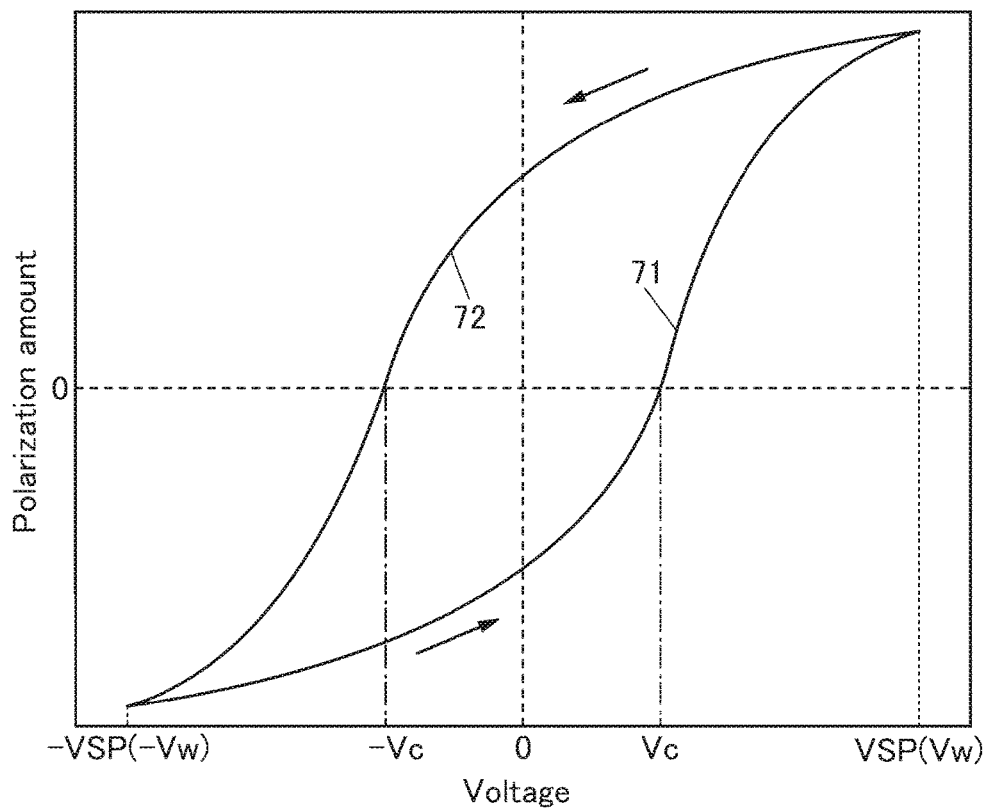
FIG. 13A is a diagram showing hysteresis characteristics of a ferroelectric layer.

FIG. 13A is a graph showing an example of hysteresis characteristics of the ferroelectric layer. In FIG. 13A, the horizontal axis represents voltage to be applied to the ferroelectric layer. The voltage can be a difference between the potential of the one electrode of the capacitor 277 and the potential of the other electrode of the capacitor 277, for example. In addition, in FIG. 13A, the vertical axis represents the polarization amount of the ferroelectric layer.

As shown in FIG. 13A, the hysteresis characteristics of the ferroelectric layer can be shown by a curve 71 and a curve 72. Voltages at intersections of the curve 71 and the curve 72 are VSP and −VSP. VSP and −VSP can have different polarities.

When voltage applied to the ferroelectric layer increases after voltage that is lower than or equal to −VSP is applied to the ferroelectric layer, the polarization amount of the ferroelectric layer increases along the curve 71. Meanwhile, when voltage applied to the ferroelectric layer decreases after voltage that is higher than or equal to VSP is applied to the ferroelectric layer, the polarization amount of the ferroelectric layer decreases along the curve 72. Here, VSP and −VSP can each be referred to as saturated polarization voltage. Note that for example, VSP is sometimes referred to as first saturated polarization voltage, and −VSP is sometimes referred to as second saturated polarization voltage. In addition, although the absolute value of the first saturated polarization voltage equals the absolute value of the second saturated polarization voltage in FIG. 13A, the absolute value of the first saturated polarization voltage and the absolute value of the second saturated polarization voltage may differ from each other.

Here, voltage (coercive voltage) at which the polarization amount of the ferroelectric layer becomes 0 when the polarization amount of the ferroelectric layer changes along the curve 71 is denoted by Vc. In addition, voltage (coercive voltage) at which the polarization amount of the ferroelectric layer becomes 0 when the polarization amount of the ferroelectric layer changes along the curve 72 is denoted by −Vc. The value of Vc and the value of −Vc can be values between −VSP and VSP. Note that for example, Vc is sometimes referred to as first coercive voltage, and −Vc is sometimes referred to as second coercive voltage. In addition, although an example in which the absolute value of the first coercive voltage equals the absolute value of the second coercive voltage is shown in FIG. 13A, the absolute value of the first coercive voltage and the absolute value of the second coercive voltage may differ from each other.

As described above, the voltage to be applied to the ferroelectric layer of the capacitor 277 can be represented by a difference between the potential of the one electrode of the capacitor 277 and the potential of the other electrode of the capacitor 277. The other electrode of the capacitor 277 is electrically connected to the wiring PL. Therefore, by controlling the potential of the wiring PL, the voltage to be applied to the ferroelectric layer of the capacitor 277 can be controlled.

Example of Method for Driving Memory Cell

Figure 12B:
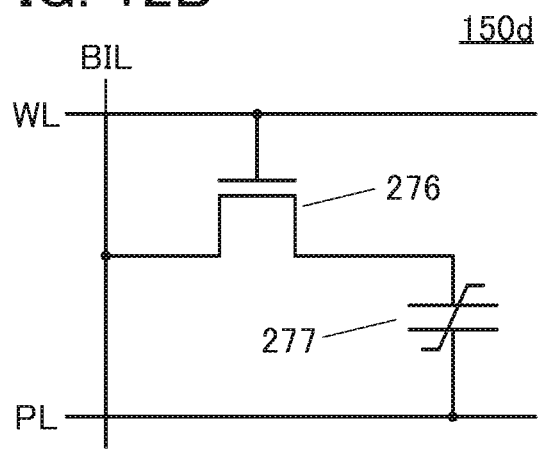
FIG. 12B and FIG. 12C are diagrams each illustrating the memory cell.
Figure 12C:
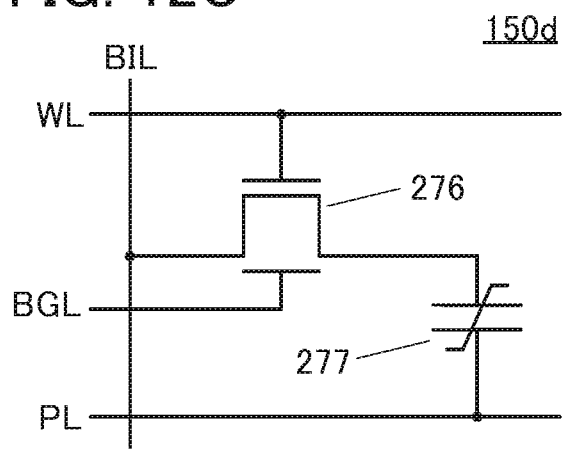

An example of a method for driving the memory cell 150d illustrated in FIG. 12B is described below. In the following description, the voltage to be applied to the ferroelectric layer of the capacitor 277 is a difference between the potential of the one electrode of the capacitor 277 and the potential of the other electrode of the capacitor 277 (the wiring PL). In addition, the transistor 276 is an n-channel transistor.

Figure 13B:
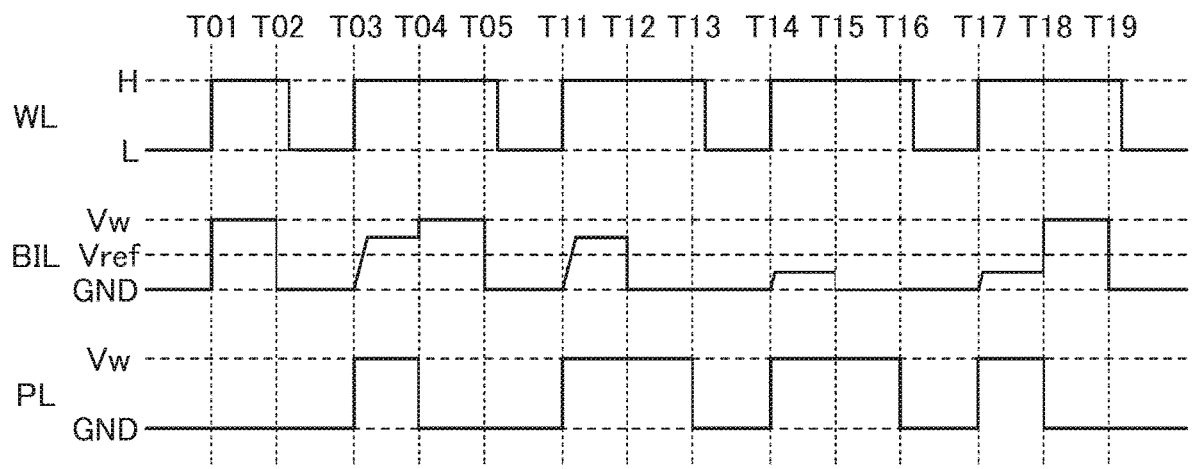
FIG. 13B is a timing chart showing the operation of the memory cell.

FIG. 13B is a timing chart showing an example of the method for driving the memory cell 150d illustrated in FIG. 12B. FIG. 13B shows an example in which binary digital data is written to and read from the memory cell 150d.

Note that a sense amplifier is electrically connected to the wiring BIL, and Vref is supplied as a reference potential to the sense amplifier. For example, in the case where the potential of the wiring BIL is higher than Vref, data "1" can be read. Alternatively, in the case where the potential of the wiring BIL is lower than Vref, data "0" can be read. First, an operation of writing the data "1" to the memory cell 150d from Time T01 to Time T03 is described.

When the potential of the wiring WL is set to a high potential H from Time T01 to Time T02, the transistor 276 is set in an on state. In addition, the potential of the wiring BIL is set to Vw. Since the transistor 276 is in the on state, the potential of the one electrode of the capacitor 277 becomes Vw. Furthermore, the potential of the wiring PL is set to GND. Through the operation, the voltage to be applied to the ferroelectric layer of the capacitor 277 becomes "Vw-GND." Accordingly, the data "1" can be written to the memory cell 150d. Here, Vw is preferably higher than or equal to VSP, and can equal VSP, for example.

In addition, although GND can be, for example, a ground potential or 0 V, GND may be a different potential.

Then, when the potential of the wiring BIL and the potential of the wiring PL are set to GND at Time T02, the voltage to be applied to the ferroelectric layer of the capacitor 277 becomes 0 V. When the voltage "Vw-GND" to be applied to the ferroelectric layer of the capacitor 277 is higher than or equal to VSP from Time T01 to Time T02, the polarization amount of the ferroelectric layer of the capacitor 277 from Time T02 to Time T03 changes to the position of 0 V along the curve 72 illustrated in FIG. 13A. Accordingly, the polarization direction in the ferroelectric layer of the capacitor 277 is kept.

After the potential of the wiring BIL and the potential of the wiring PL are set to GND, the potential of the wiring WL is set to a low potential L, so that the transistor 276 is set in an off state. Accordingly, the write operation is completed, and the data "1" is retained in the memory cell 150d.

Next, a data read operation from Time T03 to Time T04 is described.

When the potential of the wiring WL is set to the high potential H from Time T03 to Time T04, the transistor 276 is set in an on state. In addition, the potential of the wiring PL is set to Vw. When the potential of the wiring PL is set to Vw, the voltage to be applied to the ferroelectric layer of the capacitor 277 becomes "GND-Vw."

At this time, since the voltage to be applied to the ferroelectric layer of the capacitor 277 is inverted from "Vw-GND" into "GND-Vw," polarization inversion occurs in the ferroelectric layer of the capacitor 277. Current flows through the wiring BIL during the polarization inversion; thus, the potential of the wiring BIL becomes higher than Vref. Therefore, through the operation of the sense amplifier, the data "1" retained in the memory cell 150d can be read. Note that although the case where Vref is higher than GND and lower than Vw is described, Vref may be higher than Vw, for example.

Next, a data rewrite operation from Time T04 to Time T05 is described.

The data "1" retained in the memory cell 150d is lost because the read operation is destructive reading by inversion of the polarization direction. Therefore, when the potential of the wiring BIL is set to Vw and the potential of the wiring PL is set to GND from Time T04 to Time T05, the data "1" is rewritten to the memory cell 150d.

The potential of the wiring BIL and the potential of the wiring PL are set to GND at Time T05. After that, the potential of the wiring WL is set to the low potential L. Accordingly, the rewrite operation is completed, and the data "1" is retained in the memory cell 150d.

Next, a read operation and an operation of writing the data "0" to the memory cell 150d from Time T11 to Time T13 are described.

The potential of the wiring WL is set to the high potential H and the potential of the wiring PL is set to Vw from Time T11 to Time T12. Since the data "1" is retained in the memory cell 150d, the potential of the wiring BIL becomes higher than Vref, and the data "1" retained in the memory cell 150d is read.

The potential of the wiring BIL is set to GND from Time T12 to Time T13. Since the transistor 276 is in the on state, the potential of the one electrode of the capacitor 277 is set to GND. Furthermore, the potential of the wiring PL is set to Vw. Through the operation, the voltage to be applied to the ferroelectric layer of the capacitor 277 becomes "GND-Vw." Accordingly, the data "0" can be written to the memory cell 150d.

Then, when the potential of the wiring BIL and the potential of the wiring PL are set to GND at Time T13, the voltage to be applied to the ferroelectric layer of the capacitor 277 becomes 0 V. When the voltage "GND-Vw" to be applied to the ferroelectric layer of the capacitor 277 is lower than or equal to −VSP from Time T12 to Time T13, the polarization amount of the ferroelectric layer of the capacitor 277 from Time T13 to Time T14 changes to the position of 0 V along the curve 71 illustrated in FIG. 13A. Accordingly, the polarization direction in the ferroelectric layer of the capacitor 277 is kept.

After the potential of the wiring BIL and the potential of the wiring PL are set to GND, the potential of the wiring WL is set to the low potential L, so that the transistor 276 is set in an off state. Accordingly, the write operation is completed, and the data "0" is retained in the memory cell 150d.

Next, a data read operation from Time T14 to Time T15 is described.

When the potential of the wiring WL is set to the high potential H from Time T14 to Time T15, the transistor 276 is set in an on state. In addition, the potential of the wiring PL is set to Vw. When the potential of the wiring PL is set to Vw, the voltage to be applied to the ferroelectric layer of the capacitor 277 becomes "GND-Vw."

At this time, since the voltage to be applied to the ferroelectric layer of the capacitor 277 is the same as "GND-Vw" during the data writing, polarization inversion does not occur in the ferroelectric layer of the capacitor 277. Thus, the amount of current flowing through the wiring BIL becomes smaller than that when the polarization inversion occurs in the ferroelectric layer of the capacitor 277. Therefore, the amount of increase in the potential of the wiring BIL becomes smaller. Specifically, the potential of the wiring BIL becomes lower than or equal to Vref, and through the operation of the sense amplifier, the data "0" retained in the memory cell 150d can be read.

Next, a data rewrite operation from Time T15 to Time T17 is described.

The potential of the wiring BIL is set to GND and the potential of the wiring PL is set to Vw from Time T15 to Time T16. Through the operation, the data "0" is rewritten to the memory cell 150d.

The potential of the wiring BIL and the potential of the wiring PL are set to GND from Time T16 to Time T17. After that, the potential of the wiring WL is set to the low potential L. Accordingly, the rewrite operation is completed, and the data "0" is retained in the memory cell 150d.

Next, data reading and an operation of writing the data "1" to the memory cell 150d from Time T17 to Time T19 are described.

The potential of the wiring WL is set to the high potential H and the potential of the wiring PL is set to Vw from Time T17 to Time T18. Since the data "0" is retained in the memory cell 150d, the potential of the wiring BIL becomes lower than Vref, and the data "0" retained in the memory cell 150d is read.

The potential of the wiring BIL is set to Vw from Time T18 to Time T19. Since the transistor 276 is in the on state, the potential of the one electrode of the capacitor 277 is set to Vw. Furthermore, the potential of the wiring PL is set to GND. Through the operation, the voltage to be applied to the ferroelectric layer of the capacitor 277 becomes "Vw-GND." Accordingly, the data "1" can be written to the memory cell 150d.

The potential of the wiring BIL and the potential of the wiring PL are set to GND at or after Time T19. After that, the potential of the wiring WL is set to the low potential L.

Accordingly, the write operation is completed, and the data "1" is retained in the memory cell 150d.

Although the above is an operation example of the memory cell 150d, operations such as data writing, reading, and rewriting may be performed by a different method.

<Layout>

Figure 14A:
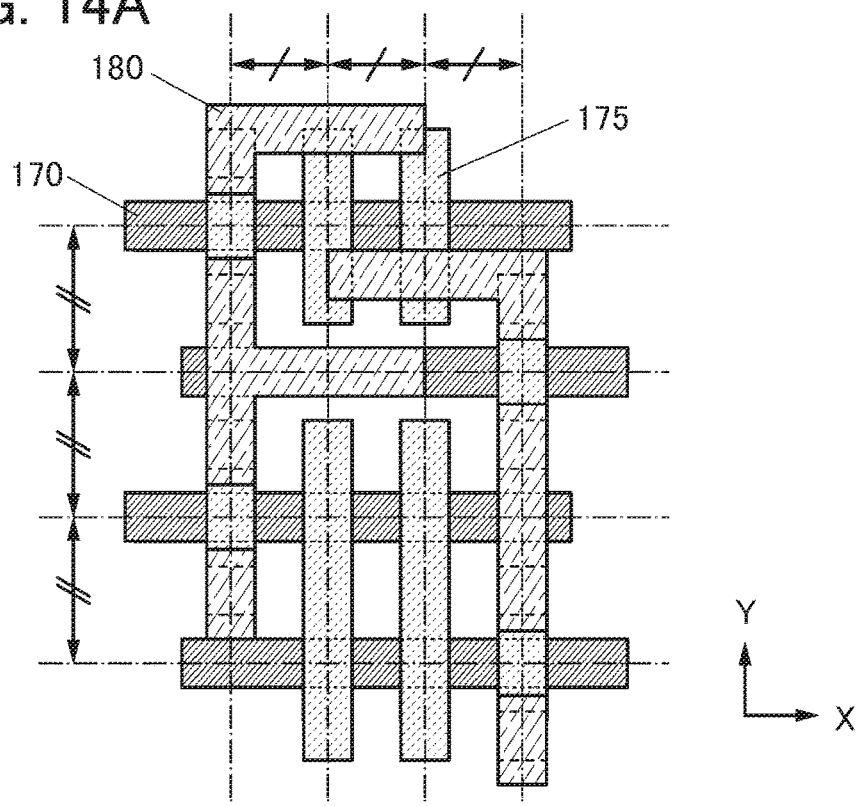
FIG. 14A and FIG. 14B are diagrams each illustrating the layout of the pixel circuit.
Figure 14B:
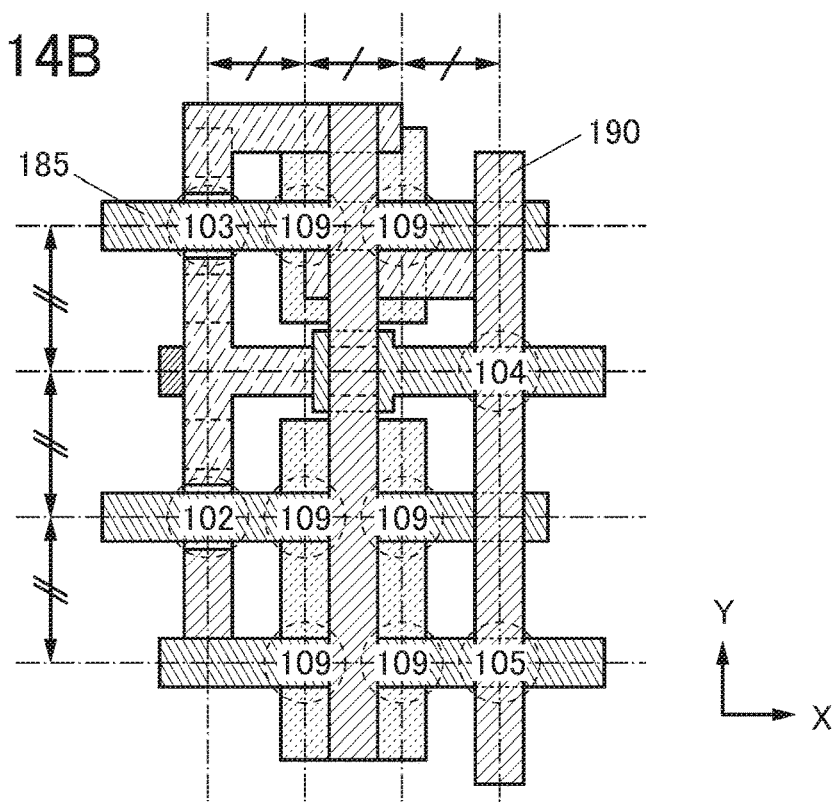

FIG. 14A and FIG. 14B are examples of a layout (top view) that can be used for the pixel circuit according to one embodiment of the present invention. FIG. 14A and FIG. 14B each show the layout of the pixel circuit illustrated in FIG. 10B. A back gate wiring 170, a metal oxide layer 175, and a source-drain wiring 180 are illustrated in FIG. 14A. Here, the metal oxide layer 175 is a layer where the channel formation region of the OS transistor is provided.

In order to increase the resolution of the imaging device, it is necessary to miniaturize the pixel circuit. Since adjacent components have influence on each other in a miniaturization process, the random arrangement of components increases variations in wiring width and the like. Therefore, as illustrated in FIG. 14A, it is preferable that components be arranged to be spaced evenly in a horizontal direction (X direction) and a vertical direction (Y direction).

FIG. 14B illustrates the structure of FIG. 14A to which a gate wiring 185 and a wiring 190 electrically connected to the gate wiring 185 are added. When the components overlap one another in such a manner, the transistor 102, the transistor 103, the transistor 104, and the transistor 105 illustrated in FIG. 10B are formed. In addition to them, a plurality of transistors 109 are formed. With such a structure of the transistors 109, which are dummy transistors not involved in a circuit operation, the uniformity in wiring width and the like can be improved, so that variations in transistor characteristics and the like can be suppressed.

According to one embodiment of the present invention described in this embodiment, an imaging device that has an image processing function and is capable of operating at high speed can be provided.

This embodiment can be combined with the description of the other embodiments as appropriate.

Embodiment 2

In this embodiment, an imaging device having a structure different from that in Embodiment 1 is described with reference to drawings. The imaging device described in Embodiment 1 has a structure in which a product-sum operation is performed on image data once and arithmetic data is extracted, whereas the imaging device described in this embodiment has a structure in which a product-sum operation is performed on image data more than once and arithmetic data is extracted.

Since the basic structures of the pixel 14 and the pixel blocks (the pixel block 12 and the pixel block 13) are common to those in Embodiment 1, the detailed description thereof is omitted.

Figure 15:
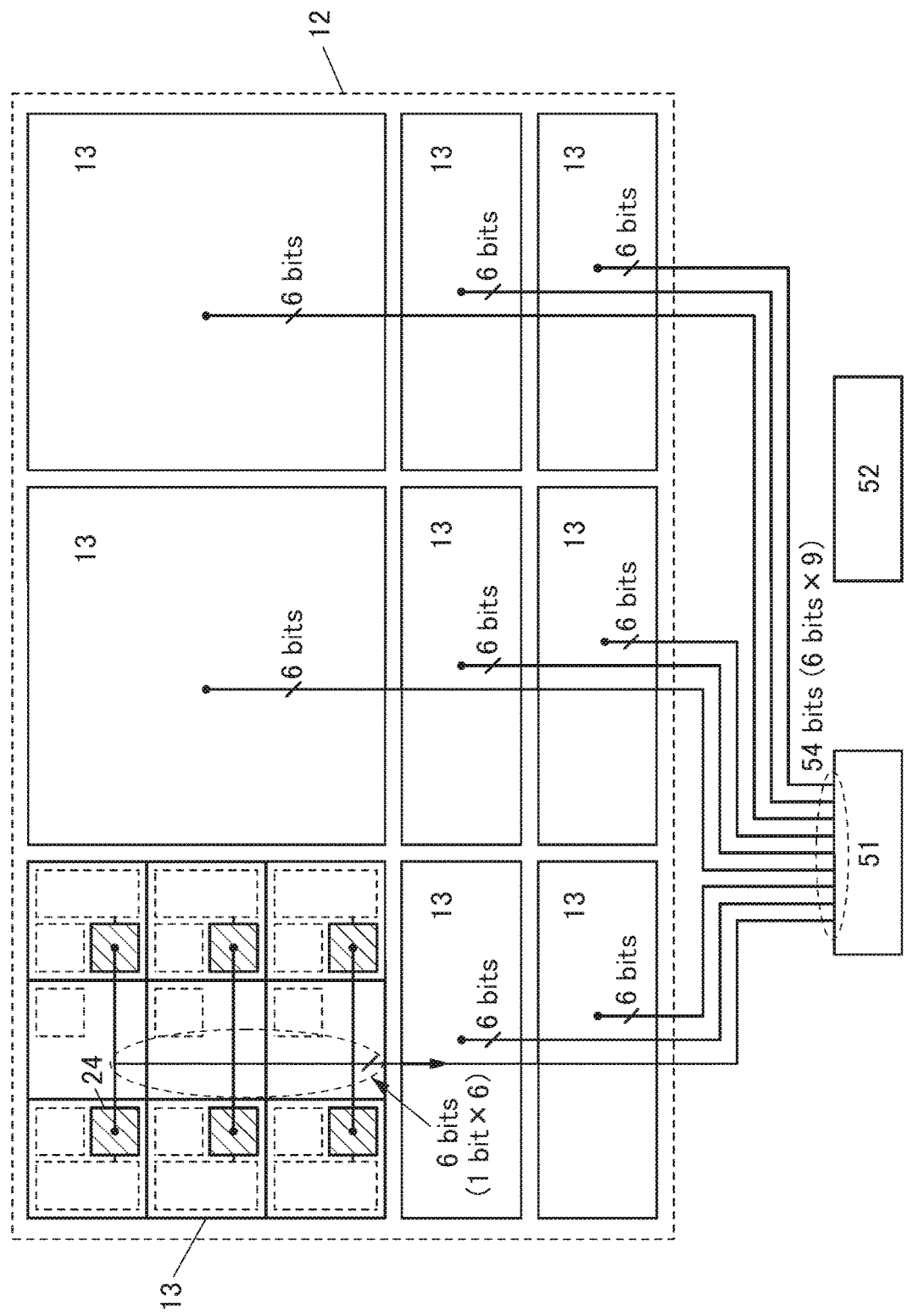
FIG. 15 is a diagram illustrating an operation of reading data from the pixel blocks.

The imaging device includes two registers as components for performing a product-sum operation more than once and extracting arithmetic data. FIG. 15 is a diagram illustrating a connection relationship between the pixel block 12 and a register 51, which is one of the two registers (the register 51 and a register 52). Note that it is also possible to provide a selection circuit between the pixel block 13 and the register 51 to reduce the number of wirings.

The pixel block 12 illustrated in FIG. 15 corresponds to a simplified diagram of the pixel block 12 illustrated in FIG. 8, which shows that arithmetic data output from each pixel block 13 after the first product-sum operation is 6-bit (1 bit×6) arithmetic data. The 6-bit arithmetic data output from each pixel block 13 is input and stored in the register 51. Here, since the 6-bit arithmetic data is output from each of the nine pixel blocks 13 and input to the register 51, 54-bit (6 bits×9) arithmetic data in total is stored in the register 51.

Figure 16:
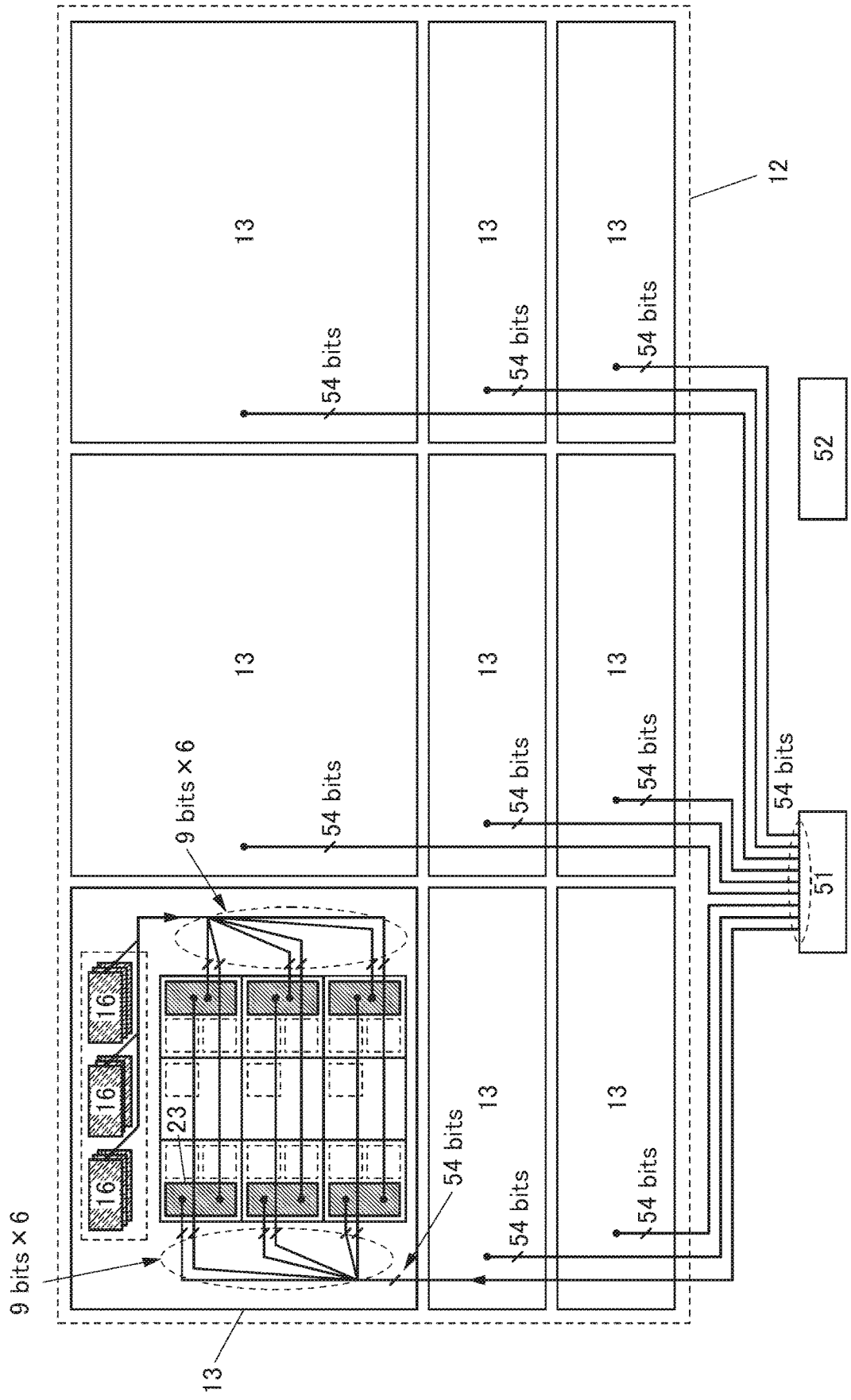
FIG. 16 is a diagram illustrating an operation of distributing data to the pixel blocks.

Next, as illustrated in FIG. 16, the 54-bit arithmetic data stored in the register 51 is redistributed to each pixel block 13. Six product-sum operation circuits 23, which are illustrated in FIG. 6A and capable of processing 9-bit data, are provided in each pixel block 13, and 9-bit arithmetic data is distributed to each product-sum operation circuit 23. In addition, 9-bit weight coefficients are supplied from the nine memory circuits 16 included in the pixel block 13 to each product-sum operation circuit 23. Thus, the second product-sum operation can be performed in each product-sum operation circuit 23.

Figure 17A:
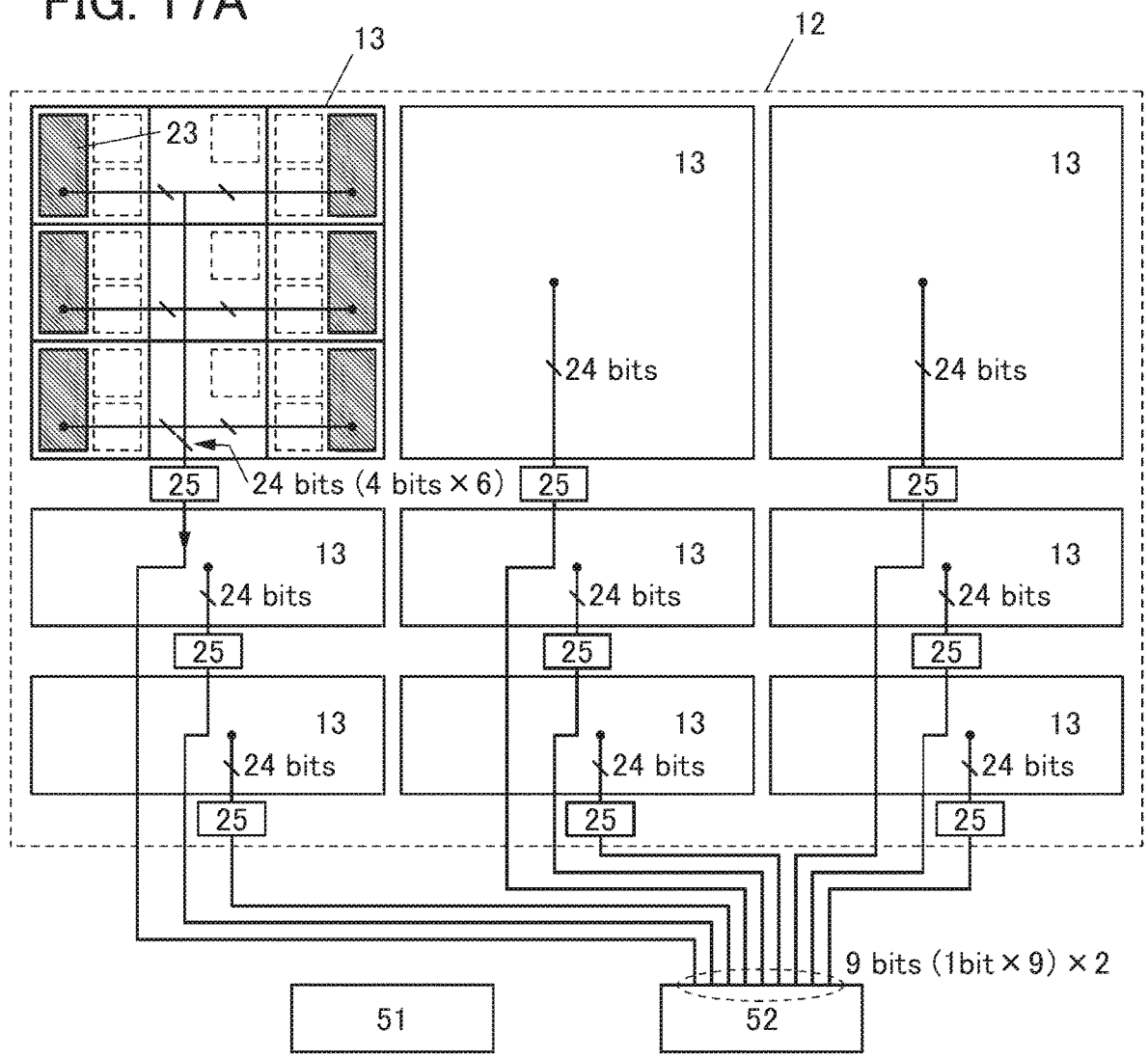
FIG. 17A is a diagram illustrating an operation of reading data from the pixel blocks.

Next, as illustrated in FIG. 17A, 4-bit arithmetic data output from each product-sum operation circuit 23 is input to the corresponding one of circuits 25 that are as many as the pixel blocks 13. Here, since the number of product-sum operation circuits 23 is six, arithmetic data input to the circuit 25 is 24-bit (4 bits×6) arithmetic data.

Figure 17B:
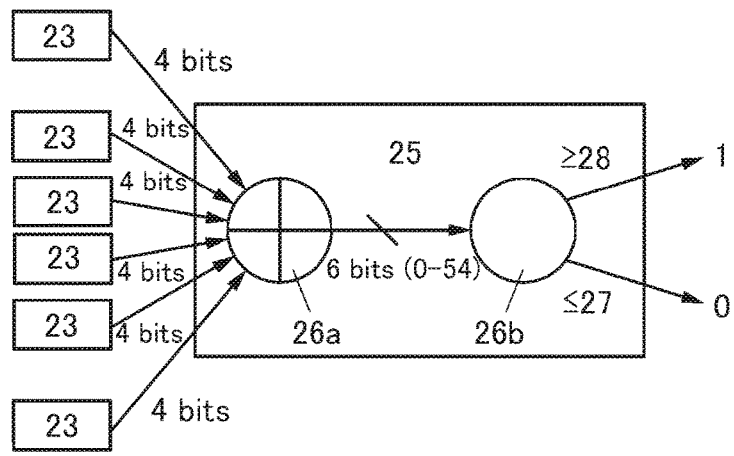
FIG. 17B is a diagram illustrating a circuit 25.

FIG. 17B is a diagram illustrating the circuit 25. The circuit 25 includes an adder circuit 26a and a binarization circuit 26b. Since 4-bit (corresponding to 0 to 9) arithmetic data is input to the adder circuit 26a from each of the six product-sum operation circuits 23, an output of the adder circuit 26a is 6-bit (corresponding to 0 to 54) arithmetic data. The 6-bit data is input to the binarization circuit 26b. The binarization circuit 26b can convert the input data into 1-bit data, outputs 1 when the data is more than or equal to 28, and outputs 0 when the data is less than or equal to 27. Note that although the circuit 25 is illustrated in the pixel block 12 in FIG. 17, the circuit 25 may be provided outside the pixel block 12.

The 1-bit arithmetic data output from each of the circuits 25 (9-bit data in total) is input to and stored in the register 52. Here, 9-bit arithmetic data can be read as needed. Note that it is also possible to provide a selection circuit between the circuit 25 and the register 52 to reduce the number of wirings.

In this embodiment, product-sum operations repeated by a further change in the weight coefficient are described. After the above operation, the 54-bit arithmetic data redistributed from the register 51 is stored in the product-sum operation circuit 23 included in the pixel block 13, and a product-sum operation can be performed again by a change in the weight coefficient supplied from the memory circuit 16 so that different arithmetic data can be obtained. Then, the arithmetic data is stored in the register 52 like the arithmetic data obtained by the product-sum operation performed before. Therefore, 18-bit arithmetic data in total is stored in the register 52.

Figure 18A:
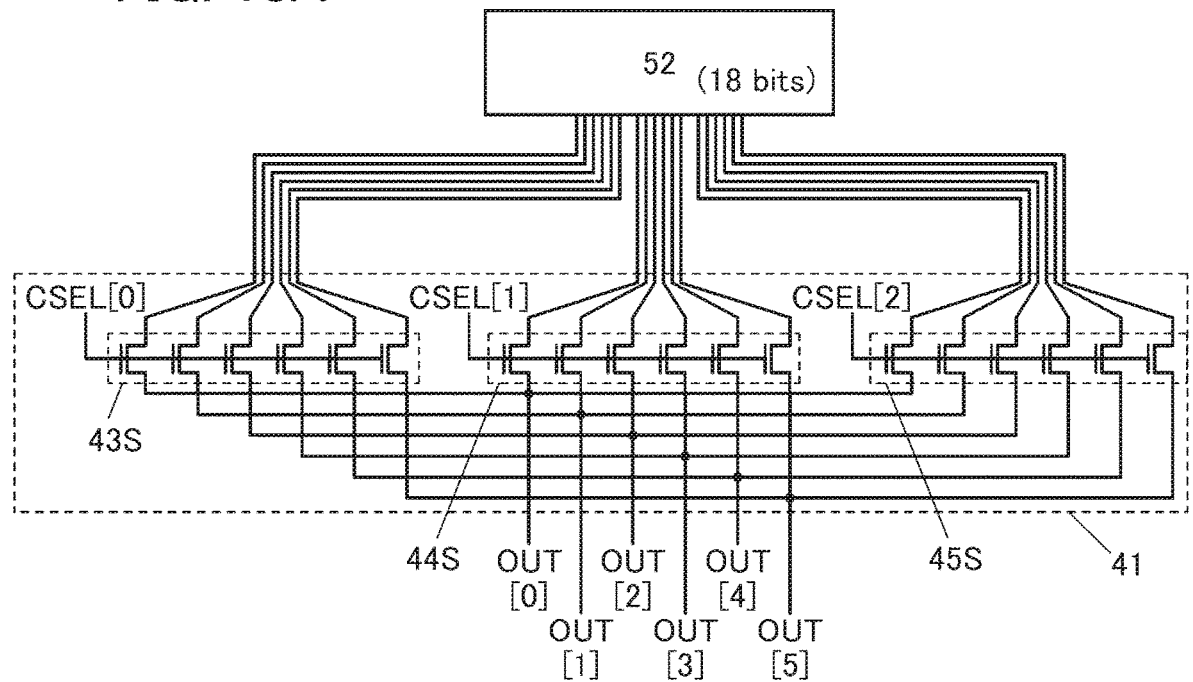
FIG. 18A is a diagram illustrating a read circuit.

FIG. 18A is a diagram illustrating a read circuit 41 connected to the output side of the register 52. On the output side of the register 52, a plurality of sets of six output lines are provided so that arithmetic data can be read every six bits. The read circuit 41 is electrically connected to the six output lines. The read circuit 41 includes a switch 43S, switch 44S, and a switch 45S each of which is electrically connected to the six output lines.

The switch 43S to the switch 45S include a plurality of transistors. Gates of the transistors included in the switch 43S are electrically connected to the wiring CSEL[0]. Gates of the transistors included in the switch 44S are electrically connected to the wiring CSEL[1]. Gates of the transistors included in the switch 45S are electrically connected to the wiring CSEL [2].

Three of wirings of the switch 43S to the switch 45S on the output side are electrically connected to each output line OUT (OUT[0] to OUT[5]). With such a structure, arithmetic data can be output every six bits.

Note that the register 51, the register 52, and the read circuit 41 can be provided in the layer 20 as components of the circuit 35 or the circuit 36 illustrated in FIG. 1.

Figure 18B:
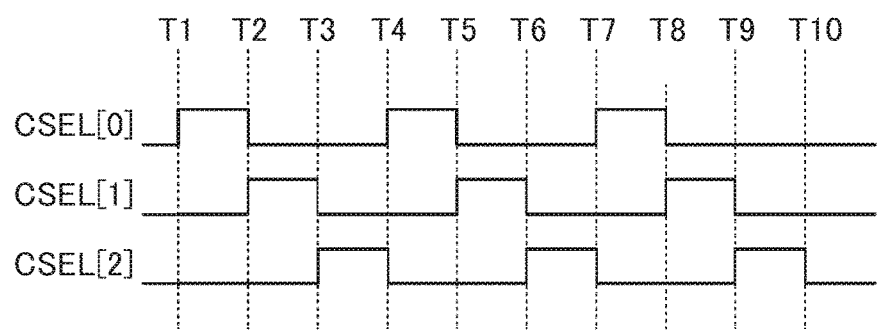
FIG. 18B is a timing chart showing the operation of the read circuit.

FIG. 18B is a timing chart showing reading of arithmetic data stored in the register 52. Note that all the arithmetic data (18-bit arithmetic data) is stored in the register 52 before Time Ti. In addition, in the following description, a potential (high potential) that brings a transistor into conduction is expressed as "H," and a potential (low potential) that brings a transistor out of conduction is expressed as "L."

The potential of the wiring CSEL[0] is set to "H" at Time T1, so that the switch 43S whose gate is electrically connected to the wiring CSEL[0] is brought into conduction and 6-bit arithmetic data of the first time is output to the output line OUT[0] to the output line OUT[5].

The potential of the wiring CSEL[0] is set to "L" and the potential of the wiring CSEL[1] is set to "H" at Time T2, so that the switch 43S is brought out of conduction, the switch 44S whose gate is electrically connected to the wiring CSEL[1] is brought into conduction, and 6-bit arithmetic data of the second time that is different from the data of the first time is output to the output line OUT[0] to the output line OUT[5].

The potential of the wiring CSEL[1] is set to "L" and the potential of the wiring CSEL[2] is set to "H" at Time T3, so that the switch 44S is brought out of conduction, the switch whose gate is electrically connected to the wiring CSEL[2] is brought into conduction, and 6-bit arithmetic data of the third time that is different from the data of the first time and the second time is output to the output line OUT[0] to the output line OUT[5].

Here, an operation until 54-bit arithmetic data is stored in the register 51 is performed in a first clock, an operation until 9-bit arithmetic data of the first time is stored in the register 52 is performed in a second clock, and an operation until 9-bit arithmetic data of the second time is stored in the register 52 is performed in a third clock. Then, reading of 6-bit arithmetic data of the first time from the register 52 is performed in a fourth clock, reading of 6-bit arithmetic data of the second time is performed in a fifth clock, and reading of 6-bit arithmetic data of the third time is performed in a sixth clock, so that all the operations can be terminated in the six clocks.

The operations in the first to third clocks and the operations in the fourth to sixth clocks can be performed in parallel, and when a period from Time T1 to Time T2 corresponds to the fourth clock, a period from Time T2 to Time T3 corresponds to the fifth clock, and a period from Time T3 to Time T4 corresponds to the sixth clock in the timing chart shown in FIG. 18B, the next reading of 18-bit arithmetic data can be performed in a period from Time T4 to Time T7. Furthermore, the subsequent reading of 18-bit arithmetic data can be performed in a period from Time T7 to Time T10.

Note that although the reading operation of arithmetic data from the pixel block 12 in Embodiment 1 and this embodiment corresponds to an operation of Stride 3 and a pooling process is omitted, a pooling process may be performed to further compress the arithmetic data.

According to one embodiment of the present invention described in this embodiment, an imaging device that has an image processing function and is capable of operating at high speed can be provided.

This embodiment can be combined with the description of the other embodiments as appropriate.

Embodiment 3

In this embodiment, structure examples and the like of the imaging device according to one embodiment of the present invention are described.

Structure Example

Figure 19A:
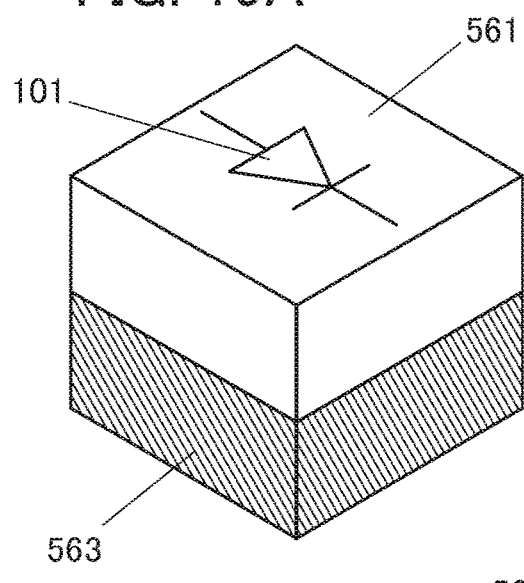
FIG. 19A to FIG. 19D are diagrams illustrating pixel structures of an imaging device.

FIG. 19A is a diagram illustrating a structure example of a pixel in an imaging device, and a stacked-layer structure of a layer 561 and a layer 563 can be employed.

Figure 20A:
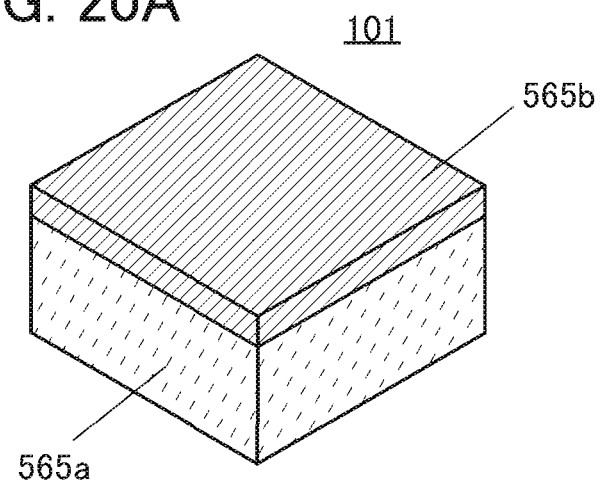
FIG. 20A to FIG. 20C are diagrams illustrating structures of a photoelectric conversion device.

The layer 561 includes the photoelectric conversion device 101. The photoelectric conversion device 101 can include a layer 565a and a layer 565b, as illustrated in FIG. 20A. Note that the layer may be rephrased to a region in some cases.

The photoelectric conversion device 101 illustrated in FIG. 20A is a pn junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn junction photodiode can be formed typically using single crystal silicon. A photodiode in which single crystal silicon is used for a photoelectric conversion layer has comparatively wide spectral sensitivity to light from ultraviolet light to near-infrared light and can detect light of a variety of wavelengths by being combined with an optical conversion layer to be described later.

Alternatively, a compound semiconductor may be used for the photoelectric conversion layer of the pn junction photodiode. As the compound semiconductor, gallium arsenic phosphide (GaAsP), gallium phosphide (GaP), indium gallium arsenide (InGaAs), lead sulfide (PbS), lead selenide (PbSe), indium arsenide (InAs), indium antimonide (InSb), mercury cadmium telluride (HgCdTe), or the like can be used, for example.

The compound semiconductor is preferably a compound semiconductor including a Group 13 element (aluminum, gallium, indium, or the like) and a Group 15 element (nitrogen, phosphorus, arsenic, antimony, or the like) (such a compound semiconductor is also referred to as a Group III-V compound semiconductor) or a compound semiconductor including a Group 12 element (magnesium, zinc, cadmium, mercury, or the like) and a Group 16 element (oxygen, sulfur, selenium, tellurium, or the like) (such a compound semiconductor is also referred to as a Group II-VI compound semiconductor).

The compound semiconductor can change the bandgap depending on the combination of constituent elements or the atomic ratio of the constituent elements and thus enables formation of a photodiode having sensitivity to a wide wavelength range from ultraviolet light to infrared light.

Note that the wavelength of ultraviolet light can be generally defined as the vicinity of 0.01 μm to the vicinity of 0.38 μm; the wavelength of visible light can be generally defined as the vicinity of 0.38 μm to the vicinity of 0.75 μm; the wavelength of near-infrared light can be generally defined as the vicinity of 0.75 μm to the vicinity of 2.5 μm; the wavelength of mid-infrared light can be generally defined as the vicinity of 2.5 μm to the vicinity of 4 μm; and the wavelength of far-infrared light can be generally defined as the vicinity of 4 μm to the vicinity of 1000 μm.

For example, to form a photodiode having sensitivity to light from ultraviolet light to visible light, GaP or the like can be used for the photoelectric conversion layer. In addition, to form a photodiode having sensitivity to light from ultraviolet light to near-infrared light, silicon, GaAsP, or the like can be used for the photoelectric conversion layer. Furthermore, to form a photodiode having sensitivity to light from visible light to mid-infrared light, InGaAs or the like can be used for the photoelectric conversion layer. Furthermore, to form a photodiode having sensitivity to light from near-infrared light to mid-infrared light, PbS, InAs, or the like can be used for the photoelectric conversion layer. Moreover, to form a photodiode having sensitivity to light from mid-infrared light to far-infrared light, PbSe, InSb, HgCdTe, or the like can be used for the photoelectric conversion layer.

Note that the photodiodes using the above compound semiconductors may be pin junction photodiodes as well as pn junction photodiodes. Furthermore, the pn junction and the pin junction may have a heterojunction structure without being limited to a homojunction structure.

For example, in the heterojunction, a first compound semiconductor can be used as one layer of the pn junction structure, and a second compound semiconductor that is different from the first compound semiconductor can be used as the other layer. Furthermore, a first compound semiconductor can be used as any one or two layers of the pin junction structure, and a second compound semiconductor that is different from the first compound semiconductor can be used as the other layer(s). Note that one of the first compound semiconductor and the second compound semiconductor may be a semiconductor of a single element, such as silicon.

Note that different materials may be used for different pixels in forming photoelectric conversion layers of photodiodes. With this structure, an imaging device including any two kinds of pixels or three kinds of pixels among a pixel that detects ultraviolet light, a pixel that detects visible light, a pixel that detects infrared light, and the like can be formed.

Alternatively, the photoelectric conversion device 101 included in the layer 561 may have a stack of a layer 566a, a layer 566b, a layer 566c, and a layer 566d, as illustrated in FIG.

Figure 20B:
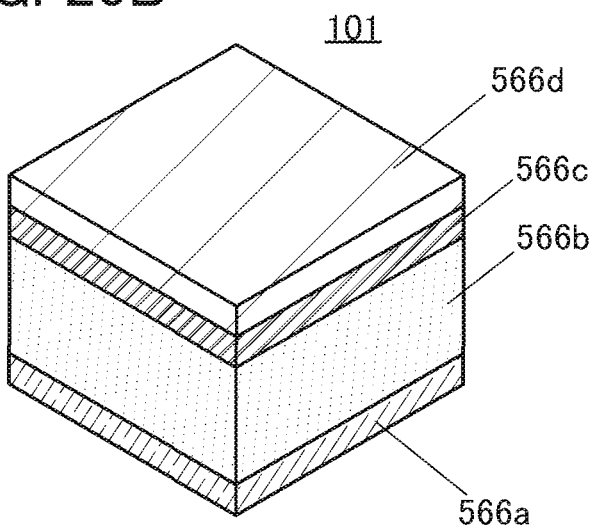

The photoelectric conversion device 101 illustrated in FIG. 20B is an example of an avalanche photodiode; the layer 566a and the layer 566d correspond to electrodes, and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

The layers 566b and 566c of the photoelectric conversion portion can have, for example, a structure of a pn-junction photodiode containing a selenium-based material in a photoelectric conversion layer. A selenium-based material, which is a p-type semiconductor, is preferably used for the layer 566b, and gallium oxide or the like, which is an n-type semiconductor, is preferably used for the layer 566c.

A photoelectric conversion device using a selenium-based material has characteristics of high external quantum efficiency with respect to visible light. In the photoelectric conversion device, the amount of amplification of electrons with respect to the amount of incident light can be increased by utilizing avalanche multiplication. In addition, a selenium-based material has a high light-absorption coefficient and thus has advantages in production; for example, a photoelectric conversion layer can be manufactured using a thin film. A thin film of a selenium-based material can be formed by a vacuum evaporation method, a sputtering method, or the like.

As the selenium-based material, crystalline selenium (single crystal selenium or polycrystalline selenium) or amorphous selenium can be used. These selenium-based materials have sensitivity to light from ultraviolet light to visible light. Furthermore, a compound of copper, indium, and selenium (CIS), a compound of copper, indium, gallium, and selenium (CIGS), or the like can be used. These compounds have sensitivity to light from ultraviolet light to near-infrared light.

An n-type semiconductor is preferably formed using a material with a wide band gap and a light-transmitting property with respect to visible light. For example, zinc oxide, gallium oxide, indium oxide, tin oxide, mixed oxide thereof, or the like can be used. In addition, these materials have a function of a hole-injection blocking layer, so that dark current can be decreased.

Figure 20C:
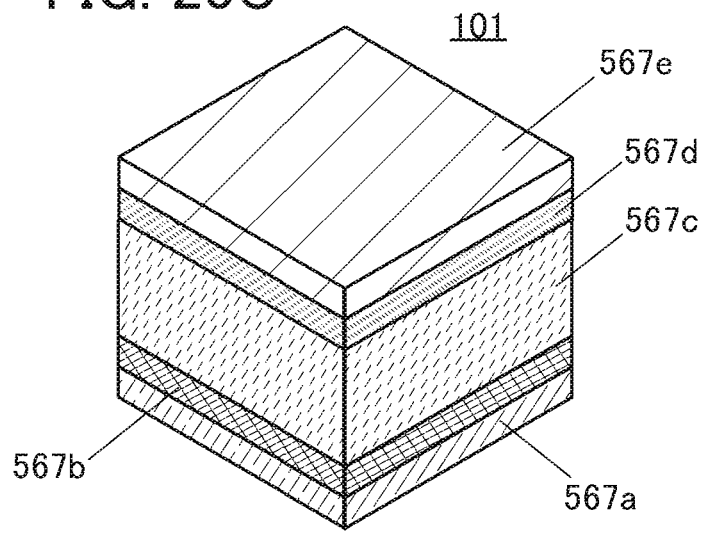

Alternatively, the photoelectric conversion device 101 included in the layer 561 may have a stack of a layer 567a, a layer 567b, a layer 567c, a layer 567d, and a layer 567e, as illustrated in FIG. 20C. The photoelectric conversion device 101 illustrated in FIG. 20C is an example of an organic optical conductive film; the layer 567a is a lower electrode, the layer 567e is an upper electrode having a light-transmitting property, and the layers 567b, 567c, and 567d correspond to a photoelectric conversion portion.

One of the 1 layers 567b and 567d in the photoelectric conversion portion can be a hole-transport layer and the other can be an electron-transport layer. In addition, the layer 567c can be the photoelectric conversion layer.

For the hole-transport layer, molybdenum oxide or the like can be used, for example. For the electron-transport layer, fullerene such as $C_{60}$ or $C_{70}$, a derivative thereof, or the like can be used, for example.

As the photoelectric conversion layer, a mixed layer of an n-type organic semiconductor and a p-type organic semiconductor (a bulk heterojunction structure) can be used. There are a variety of organic semiconductors, and a material having sensitivity to light with an intended wavelength is selected as the photoelectric conversion layer.

For the layer 563 illustrated in FIG. 19A, a silicon substrate can be used, for example. The silicon substrate includes a Si transistor and the like. With the use of the Si transistor, as well as a pixel circuit, a circuit for driving the pixel circuit, a circuit for reading an image signal, an image processing circuit, a neural network, a communication circuit, or the like can be formed.

Furthermore, a memory circuit such as a DRAM (Dynamic Random Access Memory), a CPU (Central Processing Unit), an MCU (Micro Controller Unit), or the like may be formed. Note that the above circuits except the pixel circuit are each referred to as a functional circuit in this embodiment.

For example, some or all of the transistors included in the functional circuits (the arithmetic unit 21, the row driver 31, the column driver 32, the row driver 33, the column driver 34, the circuit 35, the circuit 36, and the like) provided in the layer 20 described in Embodiment 1 can be provided in the layer 563.

Figure 19B:
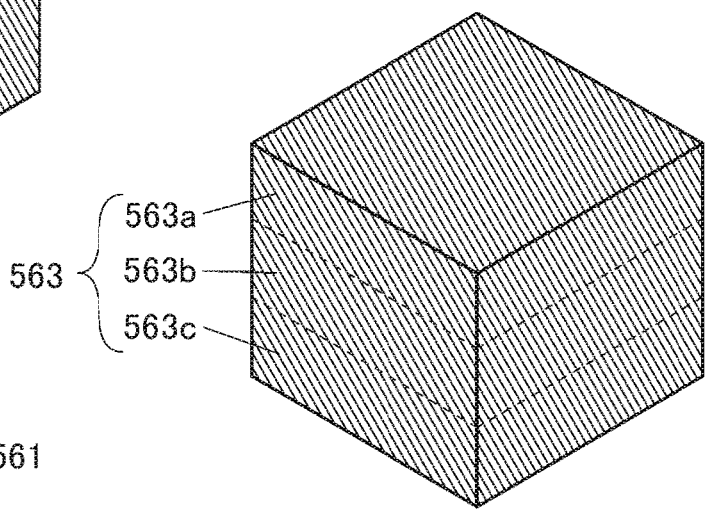

Alternatively, the layer 563 may be a stack of a plurality of layers, as illustrated in FIG. 19B. Although FIG. 19B illustrates an example in which the layer 563 is composed of three layers 563a, 563b, and 563c, the layer 563 may be a stack of two layers. Alternatively, the layer 563 may be a stack of four or more layers. These layers can be stacked through a bonding process or the like, for example. With this structure, the pixel circuit and the functional circuits can be distributed in a plurality of layers, and the pixel circuit and the functional circuits can be provided to overlap each other; thus, a small advanced imaging device can be manufactured.

Figure 19C:
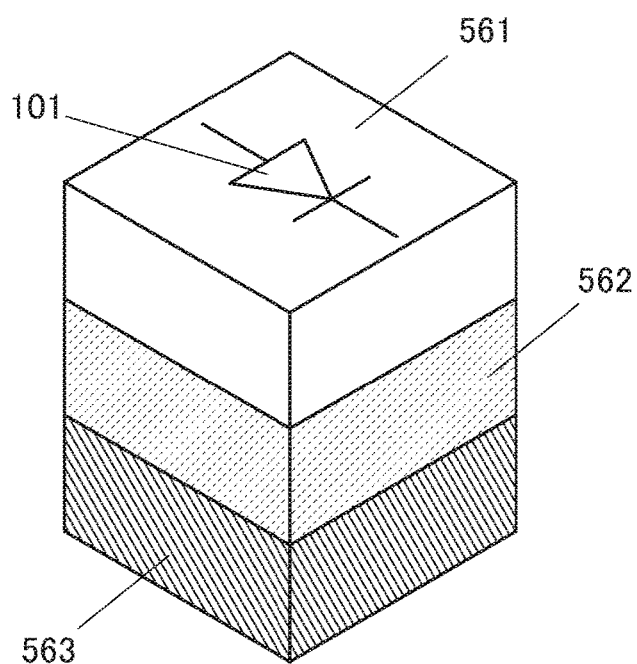

Furthermore, the pixel may have a stacked-layer structure of the layer 561, a layer 562, and the layer 563, as illustrated in FIG. 19C.

The layer 562 corresponds to the layer 10 described in Embodiment 1, and can include OS transistors. One or more of the functional circuits described above may be formed using OS transistors. Alternatively, one or more of the functional circuits may be formed using Si transistors included in the layer 563 and the OS transistors included in the layer 562. Alternatively, the layer 563 may be a support substrate such as a glass substrate, and the pixel circuit and the functional circuits may be formed using the OS transistors included in the layer 562.

A normally-off CPU (also referred to as "NoffCPU (registered trademark)") can be achieved using an OS transistor and a Si transistor, for example. Note that the NoffCPU is an integrated circuit including a normally-off transistor, which is in a non-conduction state (also referred to as an off state) even when gate voltage is 0 V.

In the NoffCPU, power supply to a circuit that does not need to operate can be stopped so that the circuit can be set in a standby state. The circuit set in the standby state because of the stop of power supply does not consume power. Thus, the power usage of the NoffCPU can be minimized. Moreover, the NoffCPU can retain data necessary for an operation, such as setting conditions, for a long time even when power supply is stopped. The return from the standby state requires only restart of power supply to the circuit and does not require rewriting of setting conditions or the like. In other words, a high-speed return from the standby state is possible. As described here, the power consumption of the NoffCPU can be reduced without a significant decrease in operating speed.

Figure 19D:
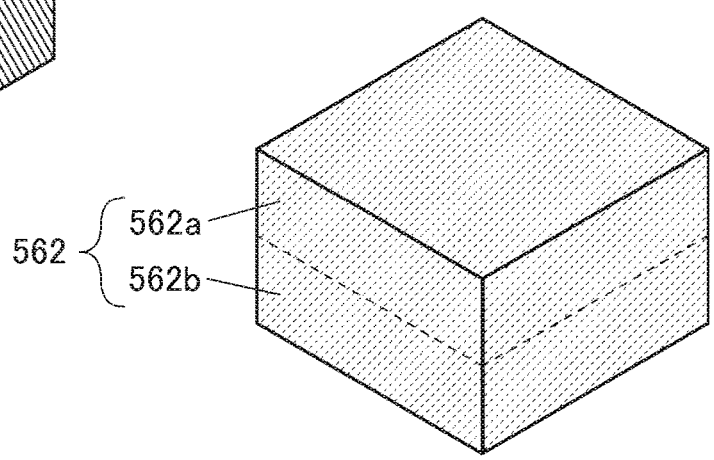

Alternatively, the layer 562 may be a stack of a plurality of layers, as illustrated in FIG. 19D. Although FIG. 19D illustrates an example in which the layer 562 is composed of two layers 562a and 562b, the layer 562 may be a stack of three or more layers. These layers can be formed to be stacked over the layer 563, for example. Alternatively, the layer 562 may be formed by bonding a layer formed over the layer 563 and a layer formed over the layer 561.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS, a CAC-OS, or the like described later can be used, for example. A CAAC-OS has a crystal structure including stable atoms and is suitable for a transistor or the like that puts emphasis on reliability. In addition, a CAC-OS exhibits excellent mobility characteristics and thus is suitable for a transistor or the like that is driven at high speed.

In an OS transistor, a semiconductor layer has a large energy gap, and thus the OS transistor exhibits extremely low off-state current characteristics of several yoctoamperes per micrometer (the value of current per micrometer of channel width). In addition, an OS transistor has features such that impact ionization, an avalanche breakdown, a short-channel effect, and the like do not occur, which are different from those of a Si transistor, and enables formation of a circuit having high breakdown voltage and high reliability. Moreover, variations in electrical characteristics due to crystallinity unevenness, which are caused in Si transistors, are less likely to occur in OS transistors.

A semiconductor layer included in an OS transistor can be, for example, a film represented by an In-M-Zn-based oxide that contains indium, zinc, and M (M is one or more selected from metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements in a sputtering target used to form an In-M-Zn oxide by a sputtering method satisfy In M and Zn M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements contained in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has low density of defect states and can be referred to as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set lower than or equal to $2\times10^{18}$ atoms/cm$^3$, preferably lower than or equal to $2\times10^{17}$ atoms/cm$^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set lower than or equal to $1\times10^{18}$ atoms/cm$^3$, preferably lower than or equal to $2\times10^{16}$ atoms/cm$^3$.

Furthermore, when nitrogen is contained in the oxide semiconductor that constitutes the semiconductor layer, electrons serving as carriers are generated and the carrier density is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set lower than or equal to $5\times10^{18}$ atoms/cm$^3$.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. When a channel formation region in the oxide semiconductor includes oxygen vacancies, the transistor sometimes has normally-on characteristics. Furthermore, in some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

Moreover, the semiconductor layer may have a non-single-crystal structure, for example. The non-single-crystal structure includes, for example, a CAAC-OS (C-Axis Aligned Crystalline Oxide Semiconductor) including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide semiconductor film having an amorphous structure has a completely amorphous structure and no crystal part, for example.

Note that the semiconductor layer may be a mixed film including two or more kinds selected from a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more kinds of regions selected from the above regions in some cases.

The composition of a CAC (Cloud-Aligned Composite)-OS, which is one embodiment of a non-single-crystal semiconductor layer, will be described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite oxide semiconductor having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1+x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of an oxide semiconductor. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in a plan—View direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{x2}Zn_{y2}O_{Z2}$ or $InO_{X1}$ is a main component are phase-separated from each other, and the regions including the respective elements as the main components form a mosaic pattern.

Here, a region where $In_{x2}Zn_{y2}O_{Z2}$ or $InO_{X1}$ is a main component is a region whose conductivity is higher than that of a region where $GaO_{X3}$ or the like is a main component. In other words, when carriers flow through regions where $In_{x2}Zn_{y2}O_{Z2}$ or $InO_{X1}$ is a main component, the conductivity of an oxide semiconductor is exhibited. Accordingly, when the regions where $In_{x2}Zn_{y2}O_{Z2}$ or $InO_{X1}$ is a main component are distributed like a cloud in an oxide semiconductor, high field-effect mobility ($\mu$) can be achieved.

In contrast, a region where $GaO_{X3}$ or the like is a main component is a region whose insulating property is higher than that of a region where $In_{x2}Zn_{y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{x2}Zn_{y2}O_{Z2}$ or $InO_{X1}$ complement each other, so that high on-state current ($I_{on}$) and high field-effect mobility ($\mu$) can be achieved.

In addition, a semiconductor apparatus using the CAC-OS has high reliability. Thus, the CAC-OS is suitable for a constituent material of a variety of semiconductor apparatuses.

<Stacked-Layer Structure 1>

Next, a stacked-layer structure of the imaging device is described using a cross-sectional view. Note that components such as insulating layers and conductive layers are described below as examples, and other components may be further included. Alternatively, some components described below may be omitted. In addition, a stacked-layer structure described below can be formed by a bonding process, a polishing process, or the like as needed.

Figure 21:
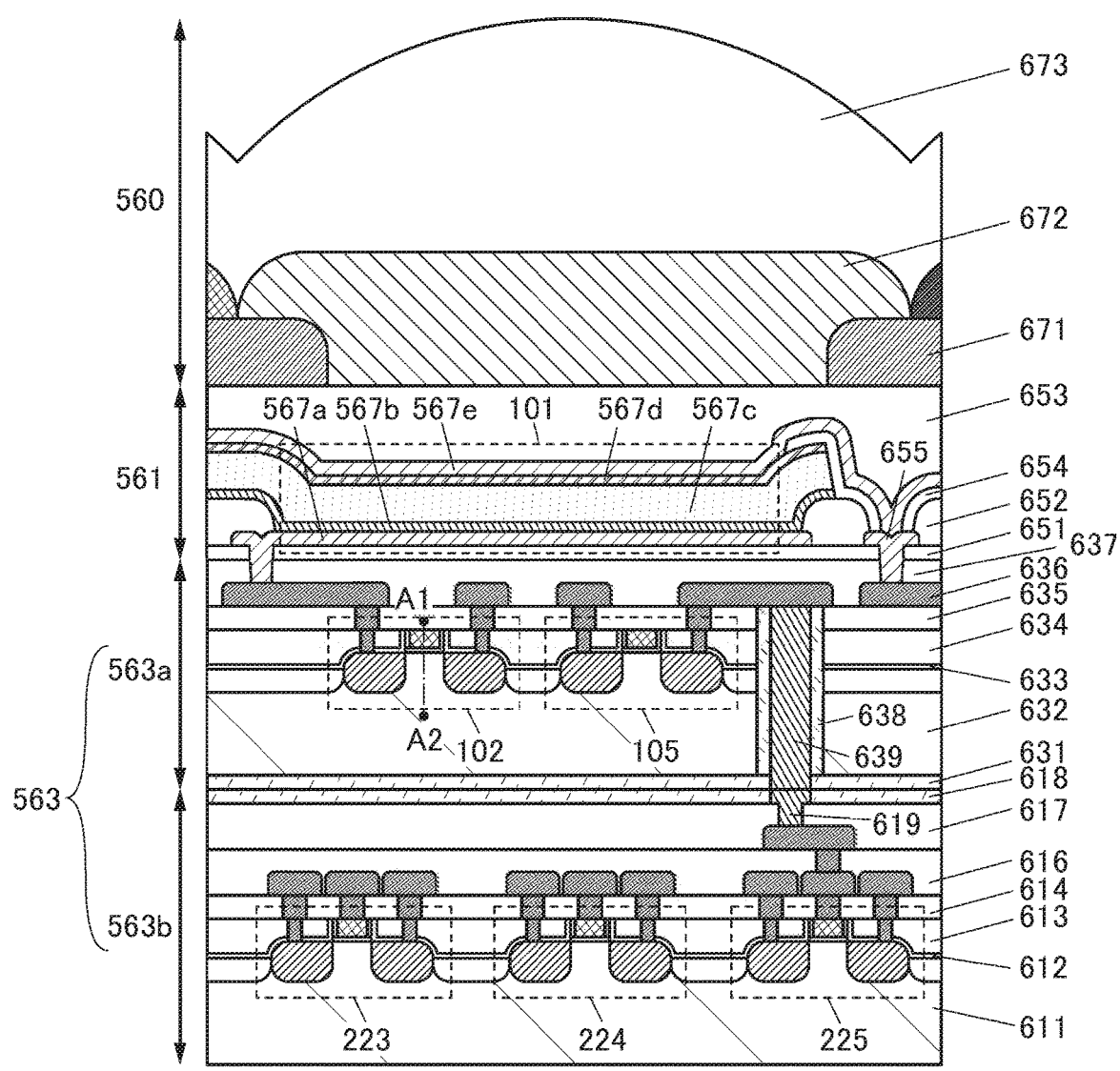
FIG. 21 is a cross-sectional view illustrating a pixel.

FIG. 21 is an example of a cross-sectional view of a stack including a layer 560, the layer 561, and the layer 563 and having a bonding surface between the layer 563a and the layer 563b of the layer 563.

<Layer 563b>

The layer 563b can include a functional circuit provided on a silicon substrate 611. Here, a transistor 223, a transistor 224, and a transistor 225 are illustrated as some of the transistors included in the functional circuit. Note that the transistor 225 is an example of a transistor included in the binarization circuit 22.

The silicon substrate 611 and insulating layers 612, 613, 614, 616, 617, and 618 are provided in the layer 563b. The insulating layer 612 has a function of a protective film. The insulating layers 613, 614, 616, and 617 each have functions of an interlayer insulating film and a planarization film. The insulating layer 618 and a conductive layer 619 each have a function of a bonding layer. The conductive layer 619 is electrically connected to a gate of the transistor 225.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As a dielectric layer of a capacitor, a silicon nitride film, a silicon oxide film, an aluminum oxide film, or the like can be used. The bonding layers will be described later.

Note that as a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing the above metal element as its component; an alloy containing a combination of the above metal elements; or the like is selected and used as appropriate. The conductor is not limited to a single layer, and may be a plurality of layers including different materials.

<Layer 563a>

The layer 563a includes the components of the pixel 14. The layer 563a may further include the components of the functional circuit. Here, the transistor 102 and the transistor 105 included in the pixel circuit 15 are illustrated as some of the components of the pixel 14. The cross-sectional view illustrated in FIG. 21 does not illustrate electrical connection between these transistors.

A silicon substrate 632 and insulating layers 631, 633, 634, 635, 637, and 638 are provided in the layer 563a. In addition, conductive layers 636 and 639 are provided.

The insulating layer 631 and the conductive layer 639 each have a function of a bonding layer. The insulating layers 634, 635, and 637 each have functions of an interlayer insulating film and a planarization film. The insulating layer 633 has a function of a protective film. The insulating layer 638 has a function of insulating the silicon substrate 632 from the conductive layer 639. The insulating layer 638 can be formed using a material similar to that for another insulating layer. Alternatively, the insulating layer 638 may be formed using the same material as that for the insulating layer 631.

The conductive layer 639 is electrically connected to the other of the source and the drain of the transistor 105 and the conductive layer 619. In addition, the conductive layer 636 is electrically connected to the wiring 111 (see FIG. 10A).

Figure 22A:
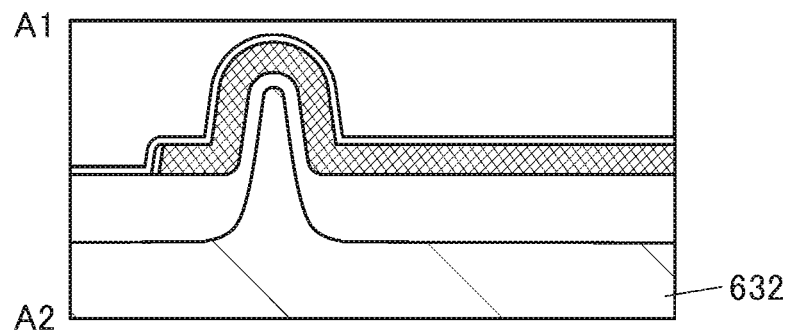
FIG. 22A to FIG. 22C are diagrams illustrating Si transistors.
Figure 22B:
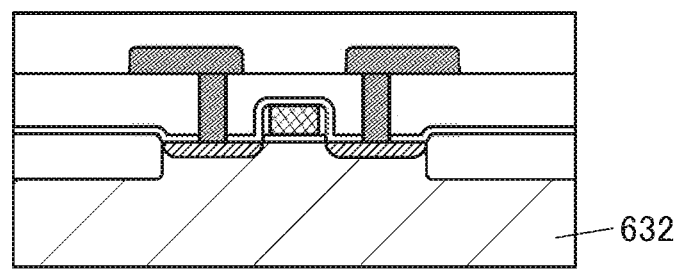

Si transistors illustrated in FIG. 21 are fin-type transistors including channel formation regions in the silicon substrates (the silicon substrates 611 and 632). FIG. 22A illustrates a cross section (a cross section along A1-A2 in the layer 563a in FIG. 21) in a channel width direction. Note that the Si transistors may each be a planar-type transistor, as illustrated in FIG. 22B.

Figure 22C:
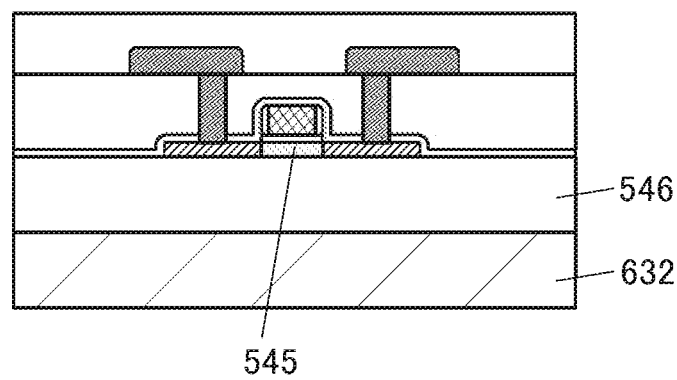

Alternatively, as illustrated in FIG. 22C, a transistor including a semiconductor layer 545 of a silicon thin film may be used. The semiconductor layer 545 can be single crystal silicon (SOI (Silicon on Insulator)) formed on an insulating layer 546 on the silicon substrate 632, for example.

<Layer 561>

The layer 561 includes the photoelectric conversion device 101. The photoelectric conversion device 101 can be formed over the layer 563a. FIG. 21 illustrates the photoelectric conversion device 101 having a structure in which the organic photoconductive film illustrated in FIG. 20C is used as the photoelectric conversion layer. Note that here, the layer 567a is a cathode, and the layer 567e is an anode.

Insulating layers 651, 652, 653, and 654 and a conductive layer 655 are provided in the layer 561.

The insulating layers 651, 653, and 654 each have functions of an interlayer insulating film and a planarization film. In addition, the insulating layer 654 is provided to cover an end portion of the photoelectric conversion device 101 and has a function of preventing short-circuit between the layer 567e and the layer 567a. The insulating layer 652 has a function of an element isolation layer. An organic insulating film or the like is preferably used as the element isolation layer.

The layer 567a corresponding to the cathode of the photoelectric conversion device 101 is electrically connected to one of the source and the drain of the transistor 102 included in the layer 563a. The layer 567e corresponding to the anode of the photoelectric conversion device 101 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can inhibit the influx of light into an adjacent pixel. As the light-blocking layer 671, a metal layer of aluminum, tungsten, or the like can be used. The metal layer and a dielectric film having a function of an anti-reflection film may be stacked.

Figure 31A:
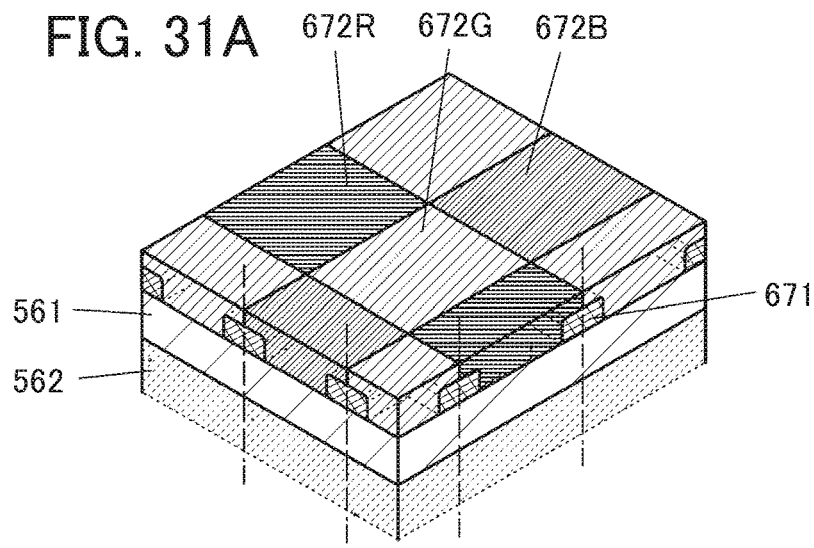
FIG. 31A to FIG. 31C are perspective views (cross-sectional views) illustrating pixels.

When the photoelectric conversion device 101 has sensitivity to visible light, a color filter can be used as the optical conversion layer 672. When color filters with colors of R (red), G (green), B (blue), Y (yellow), C (cyan), M (magenta), and the like are assigned to respective pixels, a color image can be obtained. For example, as illustrated in a perspective view (including a cross section) of FIG. 31A, a color filter 672R (red), a color filter 672G (green), and a color filter 672B (blue) can be assigned to different pixels.

In addition, when a wavelength cut filter is used as the optical conversion layer 672 in the appropriate combination of the photoelectric conversion device 101 and the optical conversion layer 672, the imaging device can capture images in a variety of wavelength regions.

For example, when an infrared filter that blocks light having a wavelength shorter than or equal to that of visible light is used as the optical conversion layer 672, an infrared imaging device can be obtained. Alternatively, when a filter that blocks light having a wavelength shorter than or equal to that of near infrared light is used as the optical conversion layer 672, a far-infrared imaging device can be obtained. Alternatively, when an ultraviolet filter that blocks light having a wavelength longer than or equal to that of visible light is used as the optical conversion layer 672, an ultraviolet imaging device can be obtained.

Figure 31B:
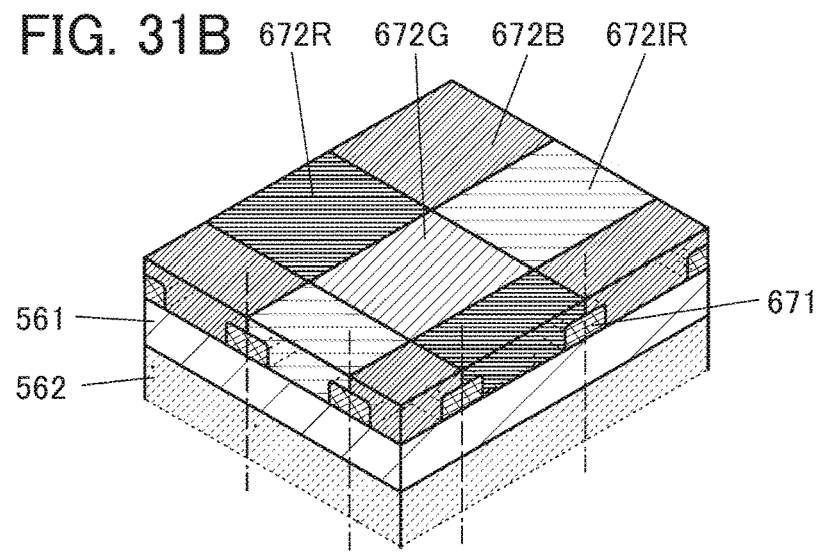

Note that different optical conversion layers may be provided in one imaging device. For example, as illustrated in FIG. 31B, the color filter 672R (red), the color filter 672G (green), the color filter 672B (blue), and an infrared filter 672IR can be assigned to different pixels. With this structure, a visible light image and an infrared light image can be obtained simultaneously.

Figure 31C:
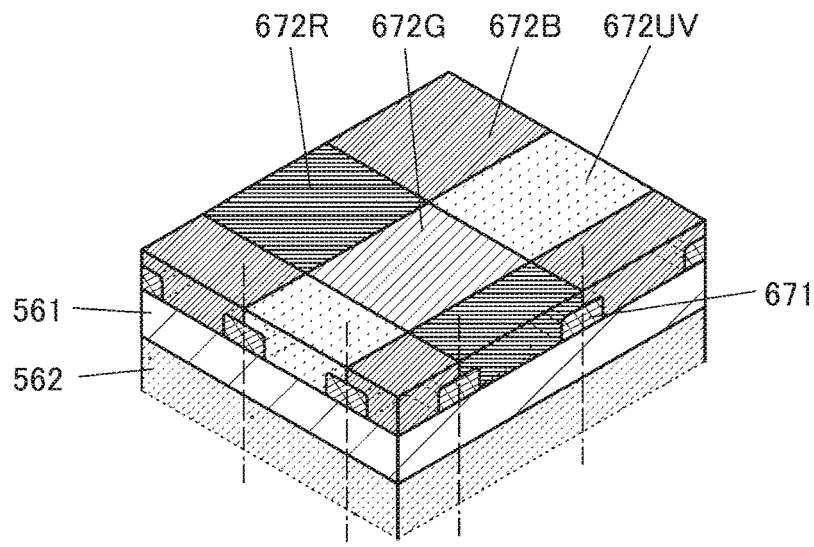

Alternatively, as illustrated in FIG. 31C, the color filter 672R (red), the color filter 672G (green), the color filter 672B (blue), and an ultraviolet filter 672UV can be assigned to different pixels. With this structure, a visible light image and an ultraviolet light image can be obtained simultaneously.

In addition, when a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

The scintillator contains a substance that, when irradiated with radiation such as X-rays or gamma-rays, absorbs energy of the radiation to emit visible light or ultraviolet light. For example, a resin or ceramics in which $Gd_2O_2S{:}Tb$, $Gd_2O_2S{:}Pr$, $Gd_2O_2S{:}Eu$, $BaFCl{:}Eu$, $NaI$, $CsI$, $CaF_2$, $BaF_2$, $CeF_3$, $LiF$, $LiI$, $ZnO$, or the like is dispersed can be used.

Image capturing utilizing infrared light or ultraviolet light can provide the imaging device with an inspection function, a security function, a sensor function, or the like. For example, by image capturing utilizing infrared light, non-destructive inspection of products, sorting of agricultural products (a sugar content meter function or the like), vein authentication, medical inspection, or the like can be performed. Furthermore, by image capturing utilizing ultraviolet light, ultraviolet light released from a light source or a frame can be detected, so that the light source, a heat source, a production apparatus, or the like can be controlled, for example.

The microlens array 673 is provided over the optical conversion layer 672. Light passing through each individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like having a high light transmitting property with respect to light with an intended wavelength.

<Bonding>

Next, bonding of the layer 563b and the layer 563a will be described.

The insulating layer 618 and the conductive layer 619 are provided in the layer 563b. The conductive layer 619 includes a region embedded in the insulating layer 618. Furthermore, surfaces of the insulating layer 618 and the conductive layer 619 are planarized to be level with each other.

The insulating layer 631 and the conductive layer 639 are provided in the layer 563a. The conductive layer 639 includes a region embedded in the insulating layer 631. Furthermore, surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layers 619 and 639, Cu, Al, Sn, Zn, W, Ag, Pt, Au, or the like can be used, for example. Preferably, Cu, Al, W, or Au is used for easy bonding. In addition, for the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding can be performed at a boundary between the layer 563b and the layer 563a.

Note that the conductive layer 619 and the conductive layer 639 may each have a multilayer structure of a plurality of layers; in this case, outer layers (bonding surfaces) are formed of the same metal material. Furthermore, the insulating layer 618 and the insulating layer 631 may each have a multilayer structure of a plurality of layers; in this case, outer layers (bonding surfaces) are formed of the same insulating material.

Through the bonding, electrical connection between the conductive layer 619 and the conductive layer 639 can be obtained. Moreover, connection between the insulating layer 618 and the insulating layer 631 with mechanical strength can be obtained.

For bonding metal layers to each other, a surface activated bonding method in which an oxide film, a layer adsorbing impurities, and the like on surfaces are removed by sputtering treatment or the like and the cleaned and activated surfaces are brought into contact to be bonded to each other can be used. Alternatively, a diffusion bonding method in which surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used in which, after high planarity is obtained by polishing or the like, surfaces of the insulating layers subjected to hydrophilicity treatment with oxygen plasma or the like are brought into contact to be temporarily bonded to each other, and then dehydrated by heat treatment to perform final bonding. The hydrophilic bonding method can also cause bonding at an atomic level; thus, mechanically excellent bonding can be obtained.

When the layer 563b and the layer 563a are bonded to each other, the insulating layers and the metal layers coexist on their bonding surfaces; therefore, the surface activated bonding method and the hydrophilic bonding method are performed in combination, for example.

For example, it is possible to use a method in which the surfaces are made clean after polishing, the surfaces of the metal layers are subjected to anti-oxidation treatment and then hydrophilicity treatment, and bonding is performed. Furthermore, hydrophilicity treatment may be performed on the surfaces of the metal layers being hardly oxidizable metal such as Au. Note that a bonding method other than the above methods may be used.

The bonding allows the circuit included in the layer 563b to be electrically connected to the components of the pixel 14 included in the layer 563a.

Modification Example of Stacked-Layer Structure 1

Figure 23:
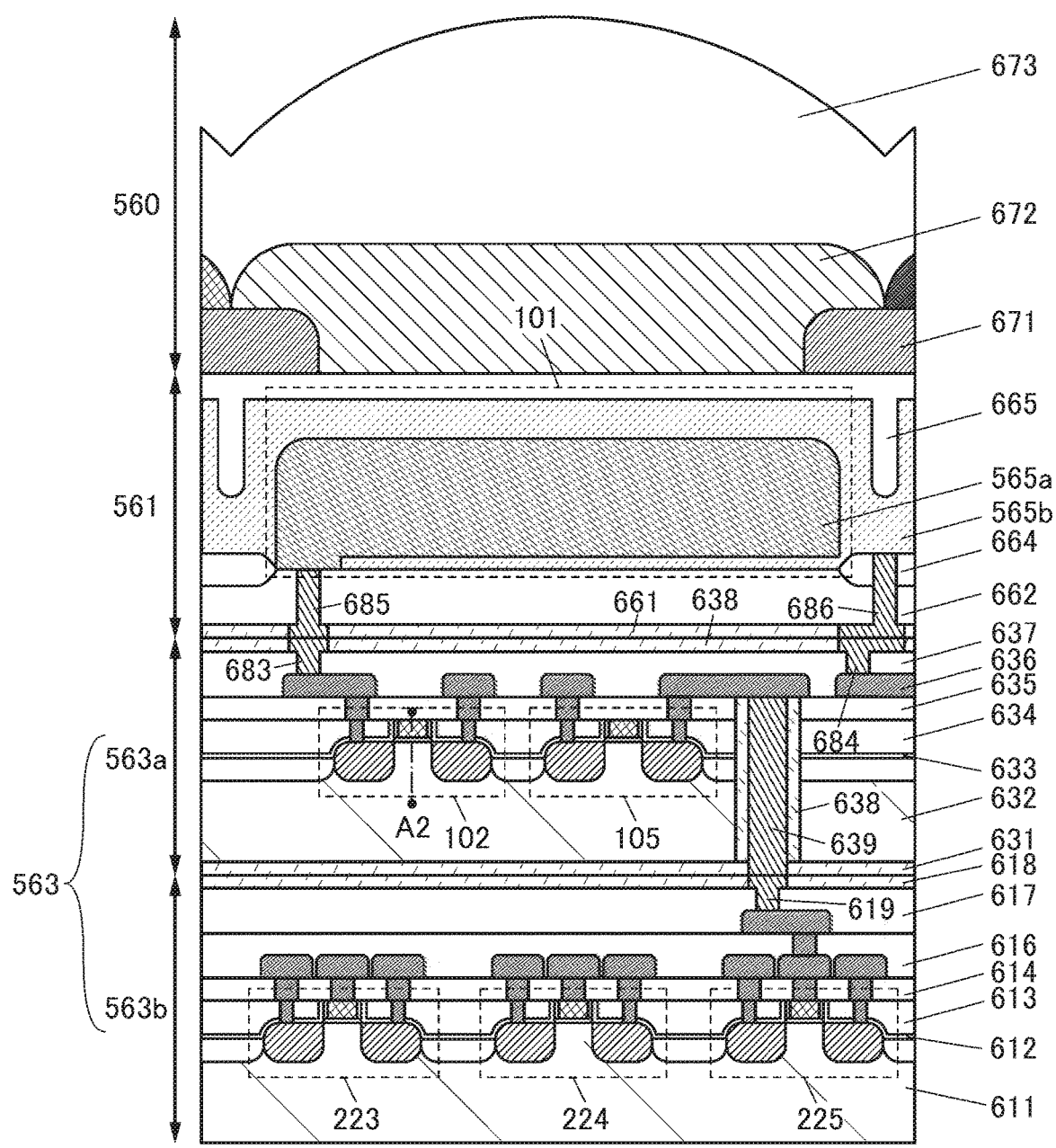
FIG. 23 is a cross-sectional view illustrating a pixel.

FIG. 23 is a modification example of the stacked-layer structure illustrated in FIG. 21 and differs from FIG. 21 in the structure of the photoelectric conversion device 101 included in the layer 561 and part of the structure of the layer 563a; a bonding surface is also included between the layer 561 and the layer 563a.

The layer 561 includes the photoelectric conversion device 101, insulating layers 661, 662, 664, and 665, and conductive layers 685 and 686.

The photoelectric conversion device 101 is a pn junction photodiode and includes the layer 565b corresponding to a p-type region and the layer 565a corresponding to an n-type region. Note that an example where a pn junction photodiode is formed over a silicon substrate is described here. The photoelectric conversion device 101 is a pinned photodiode, which can suppress dark current and reduce noise with the thin p-type region (part of the layer 565b) provided on the surface side (current extraction side) of the layer 565a.

The insulating layer 661 and the conductive layers 685 and 686 each have a function of a bonding layer. The insulating layer 662 has functions of an interlayer insulating film and a planarization film. The insulating layer 664 has a function of an element isolation layer.

The silicon substrate is provided with a groove that separates pixels, and the insulating layer 665 is provided on the top surface of the silicon substrate and in the groove. Providing the insulating layer 665 can inhibit the outflow of carriers generated in the photoelectric conversion device 101 to an adjacent pixel. In addition, the insulating layer 665 also has a function of inhibiting entry of stray light. Therefore, color mixture can be inhibited with the insulating layer 665. Note that an anti-reflection film may be provided between the top surface of the silicon substrate and the insulating layer 665.

The insulating layer 664 can be formed by a LOCOS (LOCal Oxidation of Silicon) method. Alternatively, the insulating layer 664 may be formed by an STI (Shallow Trench Isolation) method or the like. As the insulating layer 665, for example, an inorganic insulating film of silicon oxide, silicon nitride, or the like or an organic insulating film of a polyimide resin, an acrylic resin, or the like can be used. Note that the insulating layer 665 may have a multilayer structure. In addition, a space may be provided in part of the insulating layer 665. The space may contain a gas such as the air or an inert gas. Alternatively, the space may be in a reduced pressure state.

The layer 565a (corresponding to the n-type region and the cathode) of the photoelectric conversion device 101 is electrically connected to the conductive layer 685. The layer 565b (corresponding to the p-type region and the anode) is electrically connected to the conductive layer 686. The conductive layers 685 and 686 each include a region embedded in the insulating layer 661. Furthermore, surfaces of the insulating layer 661 and the conductive layers 685 and 686 are planarized to be level with each other.

In the layer 563a, the insulating layer 638 is formed over the insulating layer 637. In addition, a conductive layer 683 electrically connected to the one of the source and the drain of the transistor 102 and a conductive layer 684 electrically connected to the conductive layer 636 are formed.

The insulating layer 638 and the conductive layers 683 and 684 each have a function of a bonding layer. The conductive layers 683 and 684 each include a region embedded in the insulating layer 638. Furthermore, surfaces of the insulating layer 638 and the conductive layers 683 and 684 are planarized to be level with each other.

Here, the conductive layers 683, 684, 685, and 686 are the same bonding layers as the conductive layers 619 and 639. In addition, the insulating layers 638 and 661 are the same bonding layers as the insulating layers 618 and 631.

Thus, when the conductive layer 683 and the conductive layer 685 are bonded to each other, the layer 565a (corresponding to the n-type region and the cathode) of the photoelectric conversion device 101 can be electrically connected to the one of the source and the drain of the transistor 102. In addition, when the conductive layer 684 and the conductive layer 686 are bonded to each other, the layer 565b (corresponding to the p-type region and the anode) of the photoelectric conversion device 101 can be electrically connected to the wiring 111 (see FIG. 10A). Furthermore, when the insulating layer 638 and the insulating layer 661 are bonded to each other, electrical bonding and mechanical bonding of the layer 561 and the layer 563a can be performed.

Figure 24:
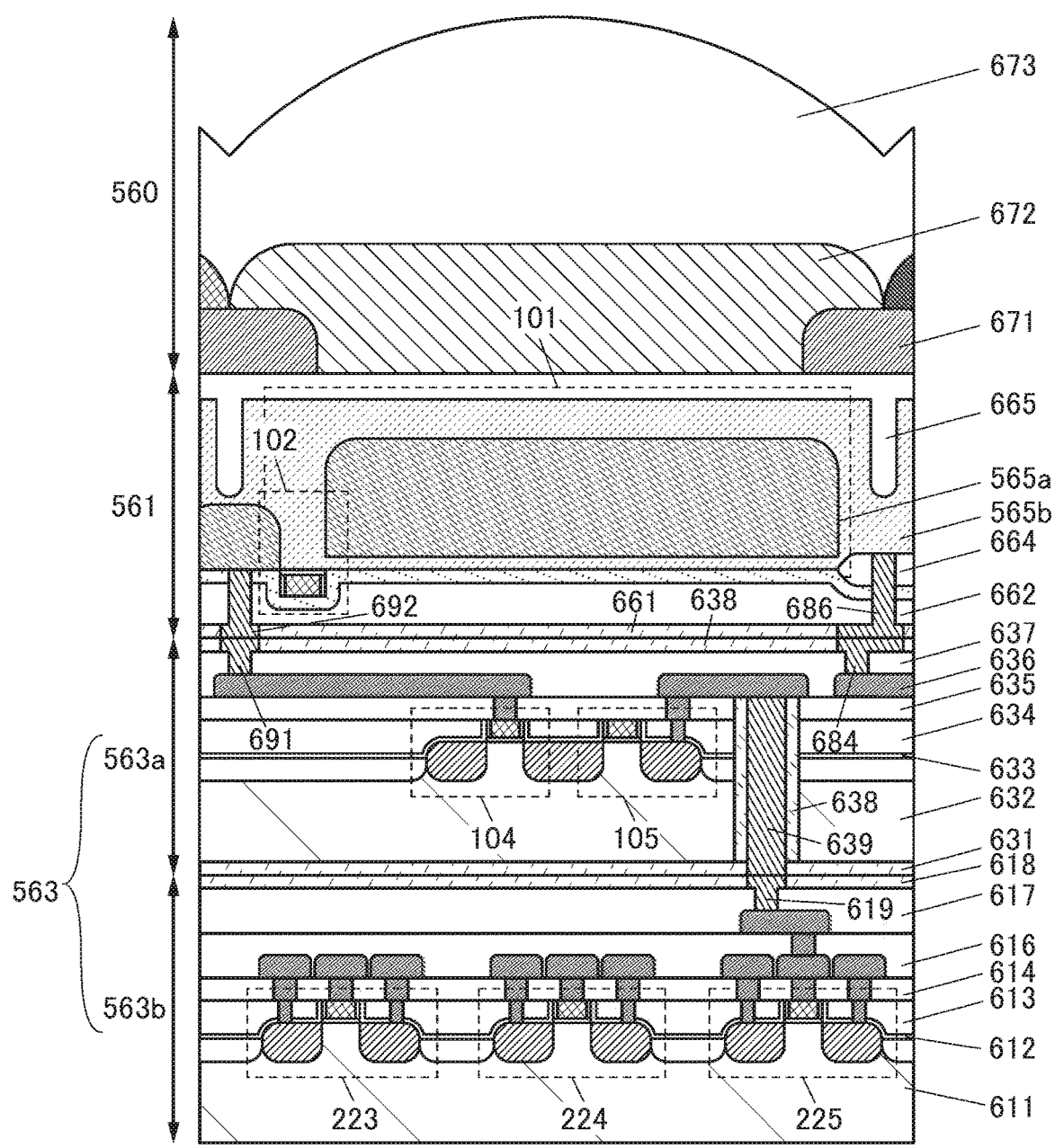
FIG. 24 is a cross-sectional view illustrating a pixel.

In addition, FIG. 24 illustrates a modification example different from the above, and is a structure in which the transistor 102 is provided in the layer 561. In this structure, the one of the source and the drain of the transistor 102 is directly connected to the photoelectric conversion device 101 and the other of the source and the drain thereof functions as the node N. With this structure, electric charge accumulated in the photoelectric conversion device 101 can be completely transferred, so that an imaging device with little noise can be achieved.

Here, the other of the source and the drain of the transistor 102 included in the layer 561 is electrically connected to a conductive layer 692. In addition, the gate of the transistor 104 included in the layer 563 is electrically connected to a conductive layer 691. The conductive layers 691 and 692 are the same bonding layers as the conductive layers 619 and 639.

<Stacked-Layer Structure 2>

Figure 25:
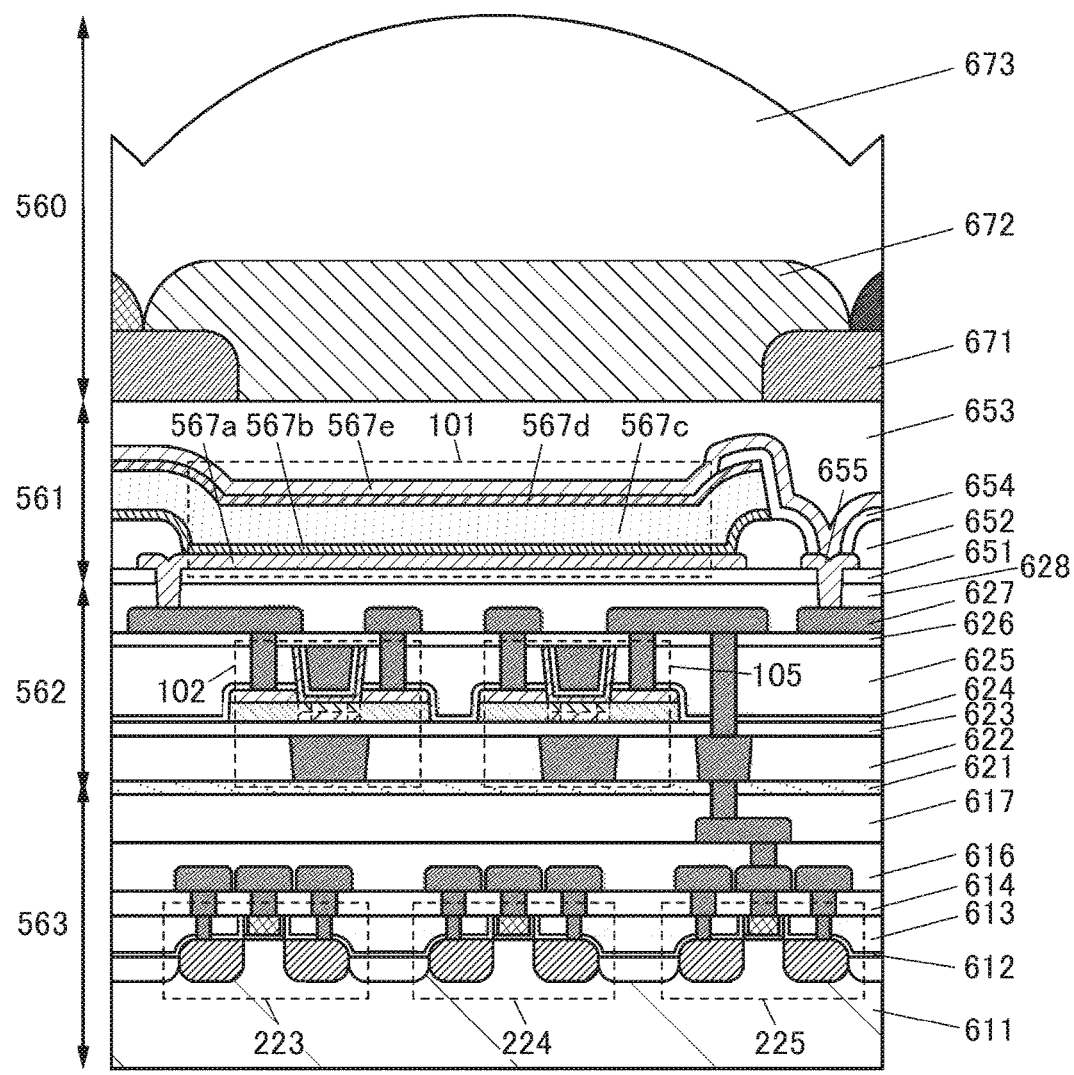
FIG. 25 is a cross-sectional view illustrating a pixel.

FIG. 25 is an example of a cross-sectional view of a stack including the layers 560, 561, 562, and 563 and not including a bonding surface. Si transistors are provided in the layer 563. OS transistors are provided in the layer 562. Note that since the structures of the layer 563, the layer 561, and the layer 560 are the same as the structures illustrated in FIG. 21, the description thereof is omitted here.

<Layer 562>

The layer 562 is formed over the layer 563. The layer 562 includes OS transistors. Here, the transistor 102 and the transistor 105 are illustrated. In the cross-sectional view illustrated in FIG. 25, electrical connection between the transistors is not illustrated.

Insulating layers 621, 622, 623, 624, 625, 626, and 628 are provided in the layer 562. Moreover, a conductive layer 627 is provided. The conductive layer 627 can be electrically connected to the wiring 111 (see FIG. 10A).

The insulating layer 621 has a function of a blocking layer. The insulating layers 622, 623, 625, 626, and 628 each have functions of an interlayer insulating film and a planarization film. The insulating layer 624 has a function of a protective film.

As the blocking layer, a film that has a function of preventing hydrogen diffusion is preferably used. In a Si device, hydrogen is necessary to terminate dangling bonds; however, hydrogen in the vicinity of an OS transistor is one of the factors in generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

The other of the source and the drain of the transistor 105 is electrically connected to the gate of the transistor 225 through a plug. Furthermore, the conductive layer 627 is electrically connected to the wiring 111 (see FIG. 10A).

The one of the source and the drain of the transistor 102 is electrically connected to the cathode of the photoelectric conversion device 101 included in the layer 561. The conductive layer 627 is electrically connected to the anode of the photoelectric conversion device 101 included in the layer 561.

Figure 26A:
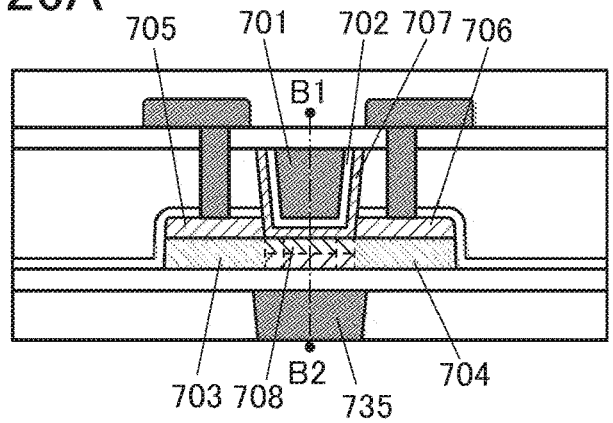
FIG. 26A to FIG. 26D are diagrams illustrating OS transistors.

The details of an OS transistor are illustrated in FIG. 26A. The OS transistor illustrated in FIG. 26A has a self-aligned structure in which a source electrode 705 and a drain electrode 706 are formed through provision of an insulating layer over a stack of an oxide semiconductor layer and a conductive layer and provision of an opening portion reaching the oxide semiconductor layer.

The OS transistor can have a structure including a gate electrode 701 and a gate insulating film 702 in addition to a channel formation region 708, a source region 703, and a drain region 704 that are formed in the oxide semiconductor layer. At least the gate insulating film 702 and the gate electrode 701 are provided in the opening portion. An oxide semiconductor layer 707 may also be provided in the opening portion.

Figure 26B:
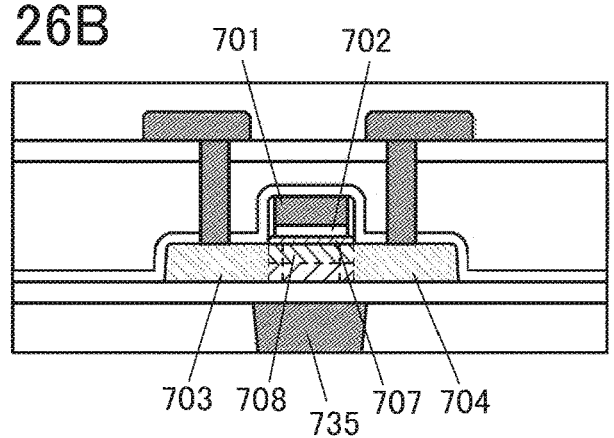

As illustrated in FIG. 26B, the OS transistor may have a self-aligned structure in which the source region 703 and the drain region 704 are formed in a semiconductor layer with the gate electrode 701 as a mask.

Figure 26C:
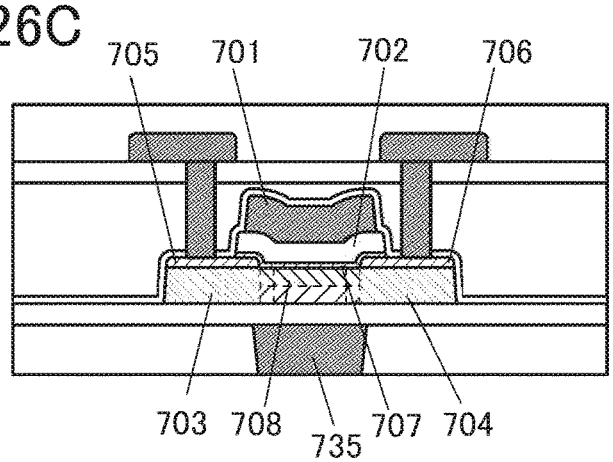

Alternatively, as illustrated in FIG. 26C, the OS transistor may be a non-self-aligned top-gate transistor including a region where the gate electrode 701 and the source electrode 705 or the drain electrode 706 overlap each other.

Figure 26D:
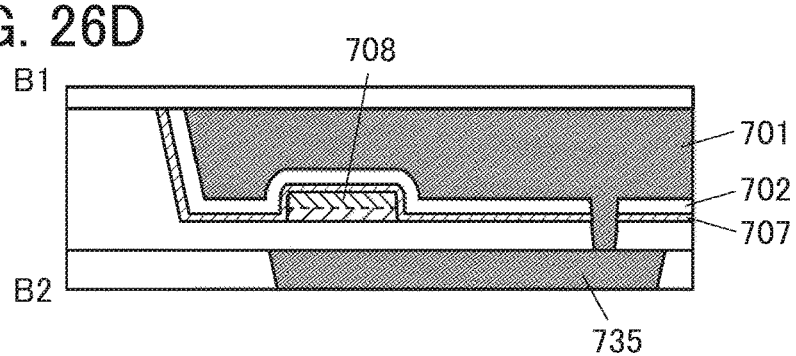

Although a structure in which the OS transistor includes a back gate 735 is illustrated, a structure without a back gate may be employed. As illustrated in a cross-sectional view of a transistor in a channel width direction in FIG. 26D, the back gate 735 may be electrically connected to a front gate of the transistor that is provided to face the back gate 735. Note that FIG. 26D illustrates an example of a B1-B2 cross section of the transistor in FIG. 26A, and the same applies to transistors having other structures. Alternatively, a structure where a fixed potential different from the potential supplied to the front gate is supplied to the back gate 735 may be employed.

Modification Example of Stacked-Layer Structure 2

Figure 27:
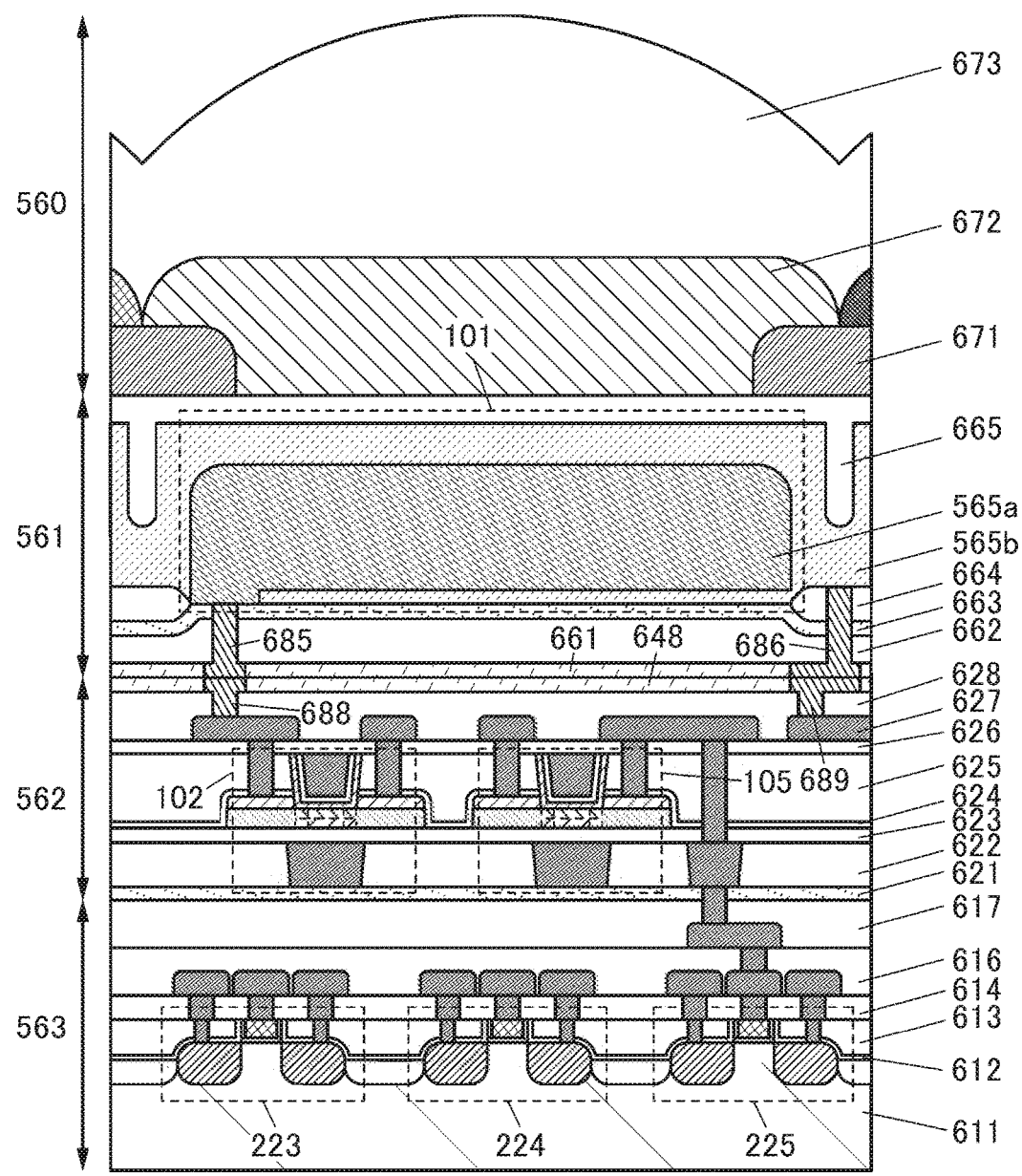
FIG. 27 is a cross-sectional view illustrating a pixel.

FIG. 27 is a modification example of the stacked-layer structure illustrated in FIG. 25 and differs from FIG. 25 in the structure of the photoelectric conversion device 101 included in the layer 561 and part of the structure of the layer 562; a bonding surface is included between the layer 561 and the layer 562.

The photoelectric conversion device 101 included in the layer 561 is a pn junction photodiode and has a structure similar to that illustrated in FIG. 23.

In the layer 562, an insulating layer 648 is formed over the insulating layer 628. In addition, a conductive layer 688 electrically connected to the one of the source and the drain of the transistor 102 and a conductive layer 689 electrically connected to the conductive layer 627 are formed.

The insulating layer 648 and the conductive layers 688 and 689 each have a function of a bonding layer. The conductive layers 688 and 689 each include a region embedded in the insulating layer 648. Furthermore, surfaces of the insulating layer 648 and the conductive layers 688 and 689 are planarized to be level with each other.

Here, the conductive layers 688 and 689 are the same bonding layers as the conductive layers 619 and 639. In addition, the insulating layer 648 is the same bonding layer as the insulating layers 618 and 631.

Thus, when the conductive layer 688 and the conductive layer 685 are bonded to each other, the layer 565a (corresponding to the n-type region and the cathode) of the photoelectric conversion device 101 can be electrically connected to the one of the source and the drain of the transistor 102. In addition, when the conductive layer 689 and the conductive layer 686 are bonded to each other, the layer 565b (corresponding to the p-type region and the anode) of the photoelectric conversion device 101 can be electrically connected to the wiring 111 (see FIG. 10A). Furthermore, when the insulating layer 648 and the insulating layer 661 are bonded to each other, electrical bonding and mechanical bonding of the layer 561 and the layer 562 can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and manufacturing cost is high. An OS transistor can be formed to be stacked over a semiconductor substrate on which a device is formed, and thus a bonding step can be reduced.

Note that the structure illustrated in FIG. 24 in which the transistor 102 is provided in the layer 561 may be applied to this structure.

Figure 28:
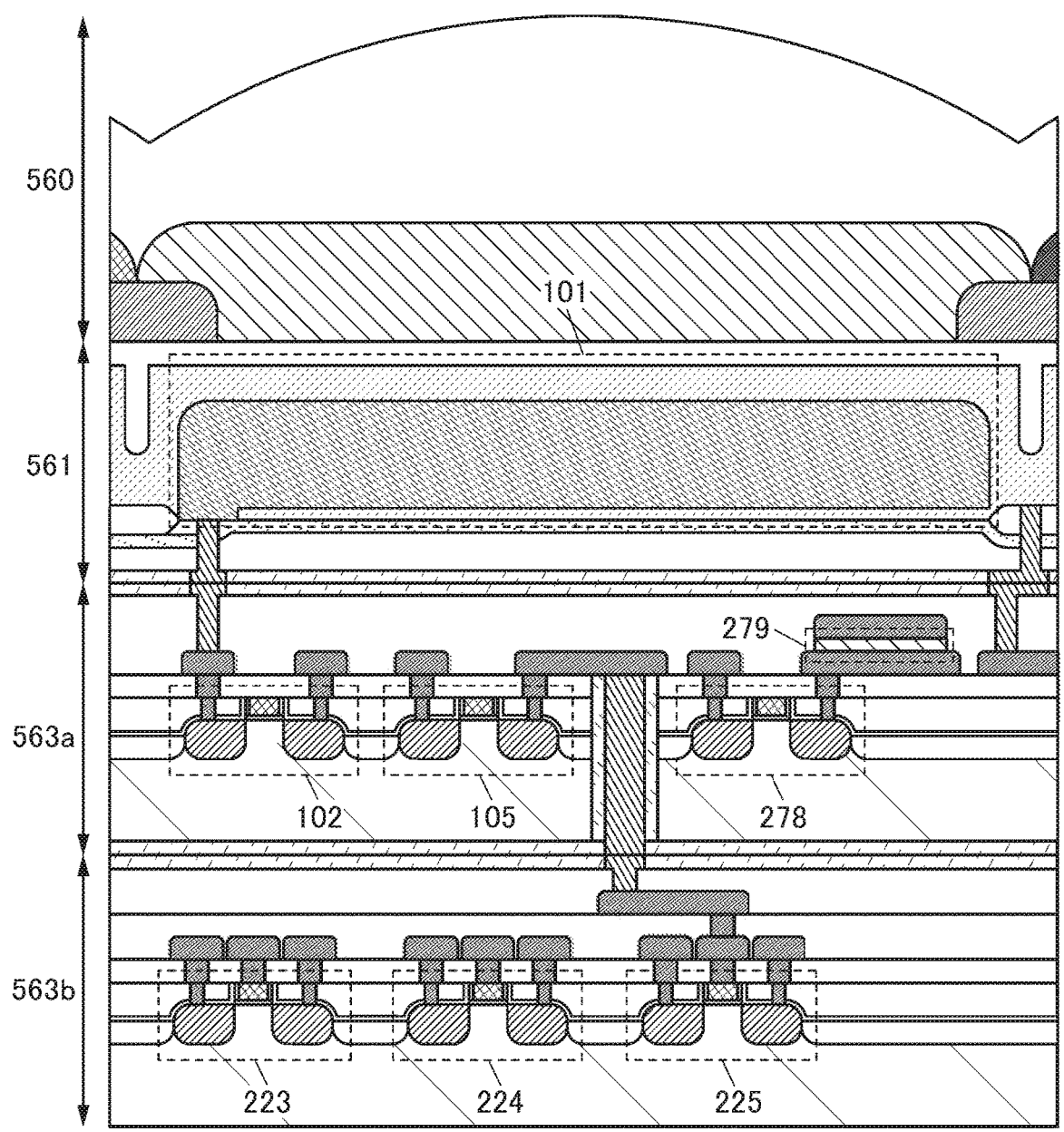
FIG. 28 is a cross-sectional view illustrating a pixel.

FIG. 28 illustrates a structure in which the transistors 102, 105, and the like, which are components of the pixel circuit, and a transistor 278 and a capacitor 279, which are components of the memory cell 150, are provided in the layer 563a. In this case, the transistor included in the memory cell 150 can be formed as a Si transistor. When a combination of the transistor 271 and the capacitor 274 of the memory cell 150a illustrated in FIG. 11B is used for the transistor 278 and the capacitor 279, a DRAM operation is possible. Alternatively, when a combination of the transistor 276 and the capacitor 277 of the memory cell 150d illustrated in FIG. 12B or FIG. 12C is used for the transistor 278 and the capacitor 279, a ferroelectric memory operation is possible.

Figure 29:
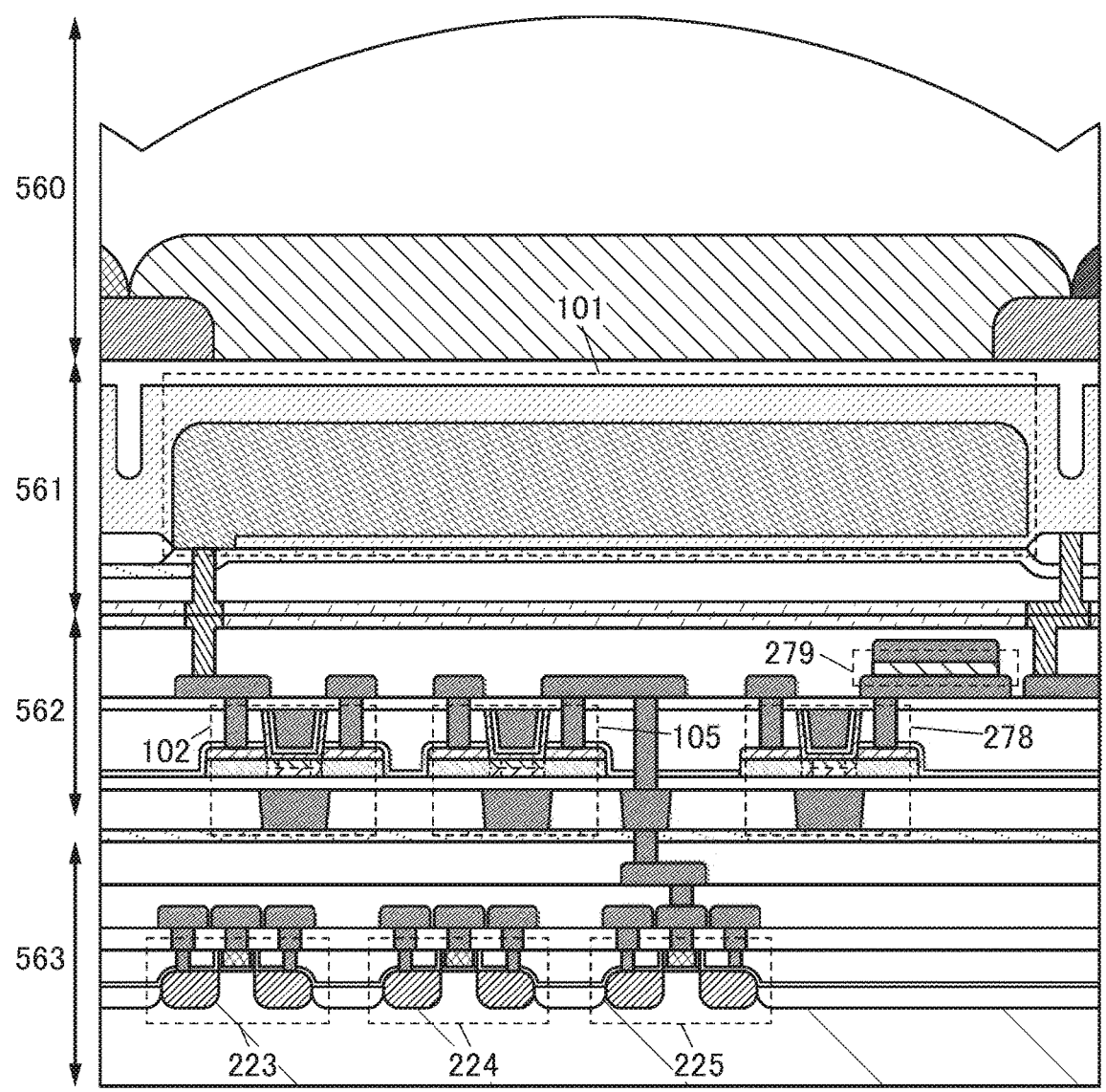
FIG. 29 is a cross-sectional view illustrating a pixel.

In addition, the memory cell 150 can be provided in the layer 562 including the OS transistor. FIG. 29 illustrates a structure in which the transistors 102, 105, and the like, which are the components of the pixel circuit, and the transistor 278 and the capacitor 279, which are the components of the memory cell 150, are provided over the same surface of the layer 562. When the combination of the transistor 271 and the capacitor 274 of the memory cell 150a illustrated in FIG. 11B is used for the transistor 278 and the capacitor 279, a DOSRAM operation is possible. Alternatively, when the combination of the transistor 276 and the capacitor 277 of the memory cell 150d illustrated in FIG. 12B or FIG. 12C is used for the transistor 278 and the capacitor 279, a ferroelectric memory operation is possible.

Figure 30:
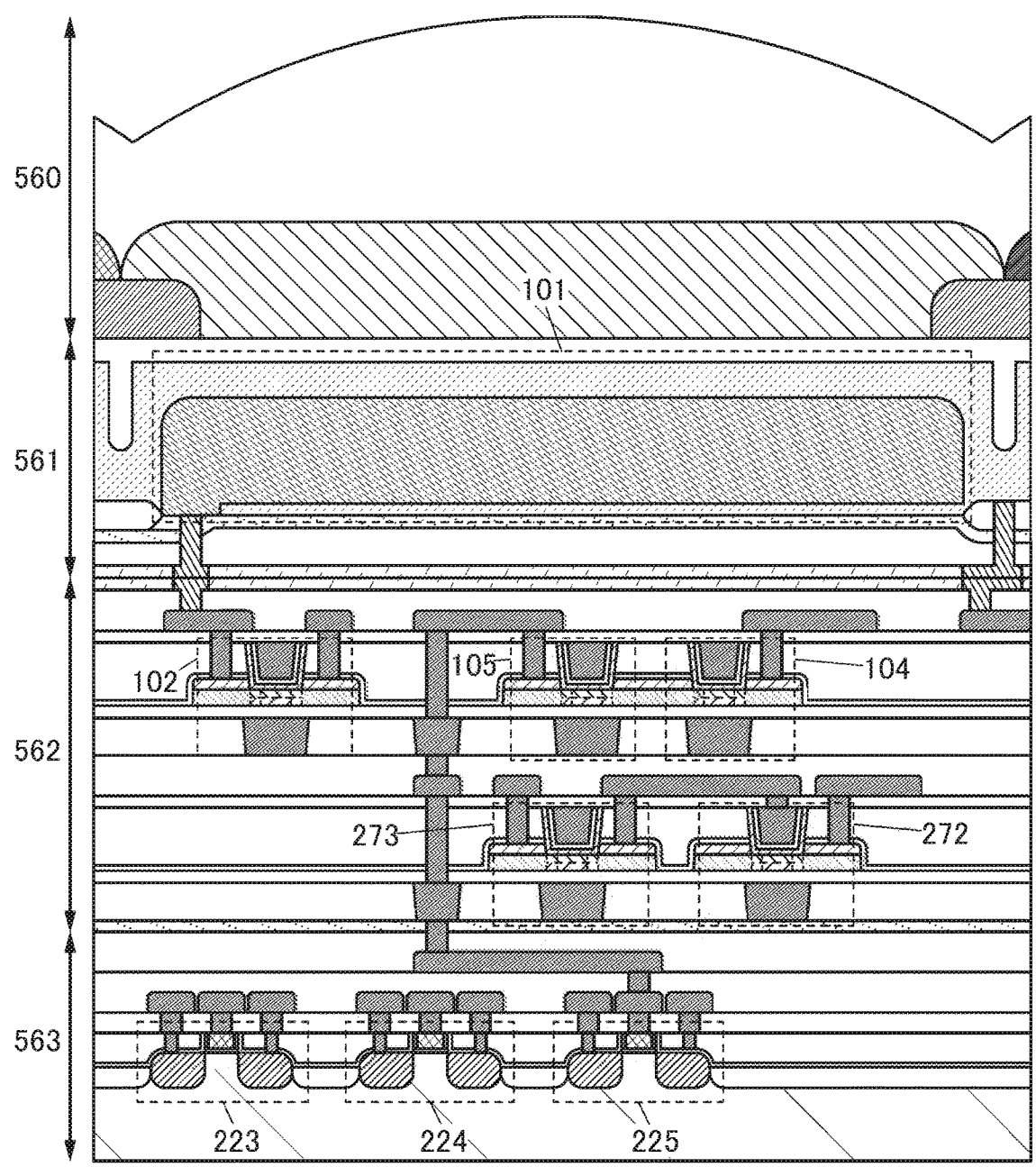
FIG. 30 is a cross-sectional view illustrating a pixel.

In addition, FIG. 30 illustrates a structure in which the transistors 102, 104, 105, and the like, which are components of the pixel circuit, and the transistors 272, 273, and the like, which are components of the memory cell 150b illustrated in FIG. 11C or the memory cell 150c illustrated in FIG. 11D, are stacked to have an overlap region in the layer 562. With this structure, the circuit area can be reduced and a small advanced imaging device can be formed. Furthermore, the structure can shorten the length of wirings electrically connecting the stacked components, which enables a high-speed operation with low power consumption.

Note that the structure illustrated in FIG. 24 in which the transistor 102 is provided in the layer 561 may be applied to the structures illustrated in FIG. 29 and FIG. 30. The structure of the photoelectric conversion device 101 illustrated in FIG. 25 may also be applied.

<Package and Module>

Figure 32A:
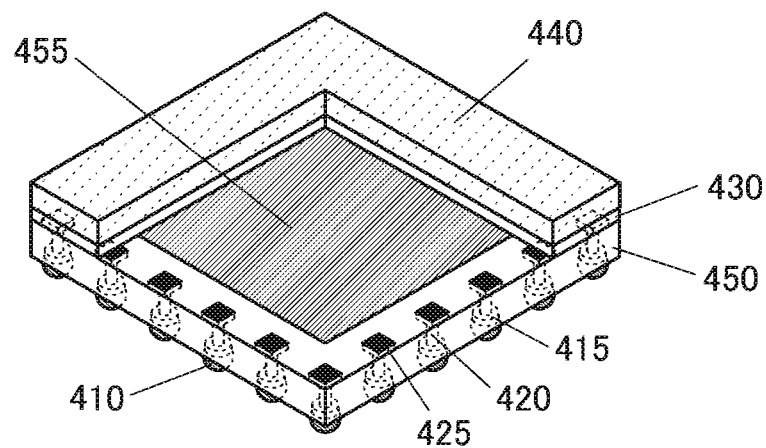
FIG. 32A is a diagram illustrating a package in which an imaging device is placed.

FIG. 32A is an external perspective view of a package containing an image sensor chip. The package is a CSP (Chip Size Package), which includes a bare chip 450 of an image sensor, cover glass 440, an adhesive 430 that bonds them, and the like.

Electrode pads 425 provided on the outside of a pixel array 455 are electrically connected to back electrodes 415 via through electrodes 420. The electrode pads 425 are electrically connected to a circuit constituting the image sensor, with wirings or wires. Note that the bare chip 450 may be a stacked chip in which a circuit having a variety of functions is stacked.

The example in FIG. 32 illustrates a BGA (Ball Grid Array) with a structure in which bumps 410 are formed with solder balls on the back electrodes 415. Note that, without being limited to the BGA, an LGA (Land Grid Array), a PGA (Pin Grid Array), or the like may be employed. Alternatively, a package in which the bare chip 450 is mounted on a QFN (Quad Flat No-lead package) or a QFP (Quad Flat Package) may be used.

Figure 32B:
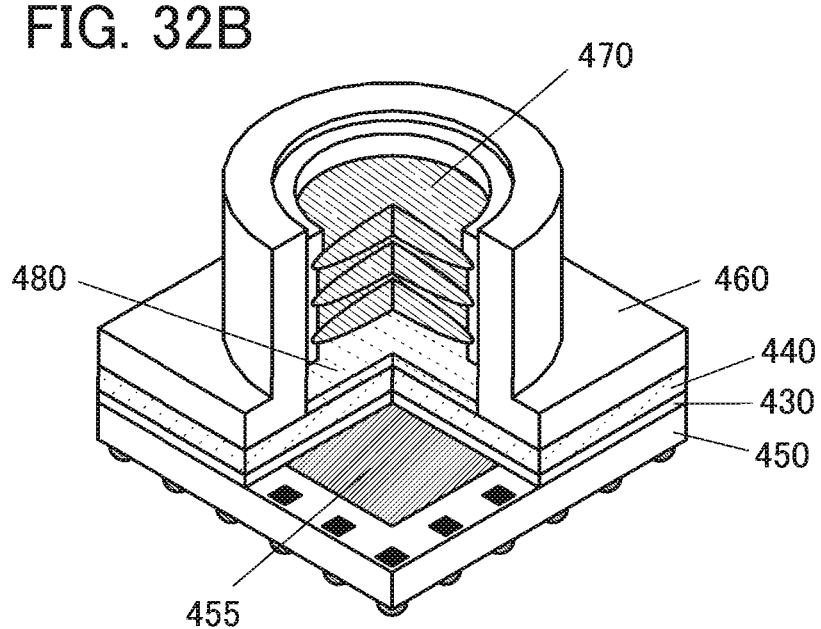
FIG. 32B is a diagram illustrating a module in which an imaging device is placed.

In addition, FIG. 32B is an external perspective view from the top surface side of a camera module with a combination of an image sensor chip and a lens. The camera module includes a lens cover 460, a plurality of lenses 470, and the like over the structure of FIG. 32A. Furthermore, an optical filter 480 that absorbs light with a certain wavelength is provided as needed between the lens 470 and the cover glass 440. For example, in the case where the image sensor mainly performs visible light imaging, an infrared cut filter or the like can be used as the optical filter 480.

The image sensor chip placed in a package having the above form can be easily mounted on a printed circuit board and the like; therefore, the image sensor chip can be incorporated into a variety of semiconductor apparatuses and electronic devices.

This embodiment can be combined with the description of the other embodiments as appropriate.

Embodiment 4

As electronic devices that can use the imaging device according to one embodiment of the present invention, display devices, personal computers, image memory devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 33A to FIG. 33F illustrate specific examples of these electronic devices.

Figure 33A:
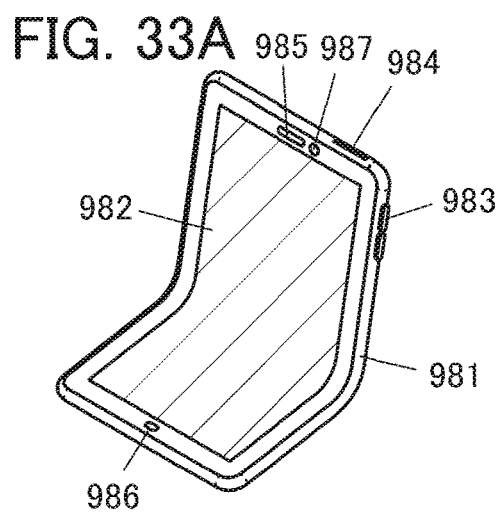
FIG. 33A to FIG. 33F are diagrams illustrating electronic devices.

FIG. 33A is an example of a cellular phone, which includes a housing 981, a display portion 982, operation buttons 983, an external connection port 984, a speaker 985, a microphone 986, a camera 987, and the like. The display portion 982 of the cellular phone is provided with a touch sensor. All operations including making a call and inputting text can be performed by touch on the display portion 982 with a finger, a stylus, or the like. The imaging device according to one embodiment of the present invention and the operation method thereof can be employed in the cellular phone.

Figure 33B:
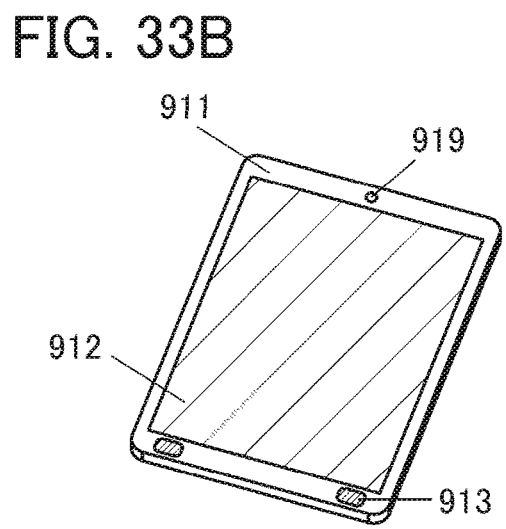

FIG. 33B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device according to one embodiment of the present invention and the operation method thereof can be employed in the portable data terminal.

Figure 33C:
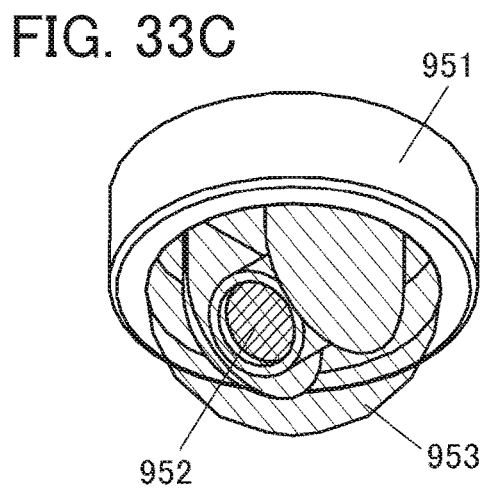

FIG. 33C is a surveillance camera, which includes a support base 951, a camera unit 952, a protection cover 953, and the like. By setting the camera unit 952 provided with a rotating mechanism and the like on a ceiling, an image of all of the surroundings can be taken. The imaging device according to one embodiment of the present invention and the operation method thereof can be employed for capturing an image by the camera unit. Note that a surveillance camera is a name in common use and does not limit the use thereof. A device that has a function of a surveillance camera is also called a camera or a video camera, for example.

Figure 33D:
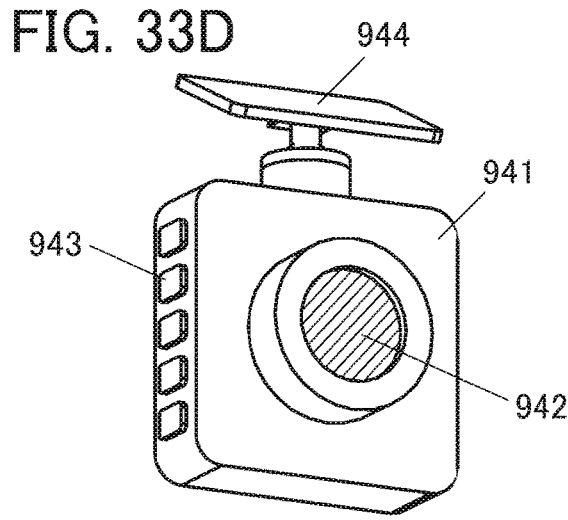

FIG. 33D is a dashboard camera, which includes a frame 941, a camera 942, operation buttons 943, an attaching member 944, and the like. When the attaching member 944 is set on a front window or the like of a motor vehicle, the landscape ahead in driving can be recorded. Note that a display panel displaying a recorded image is provided on a rear surface, which is not illustrated. The imaging device according to one embodiment of the present invention and the operation method thereof can be employed in the camera 942.

Figure 33E:
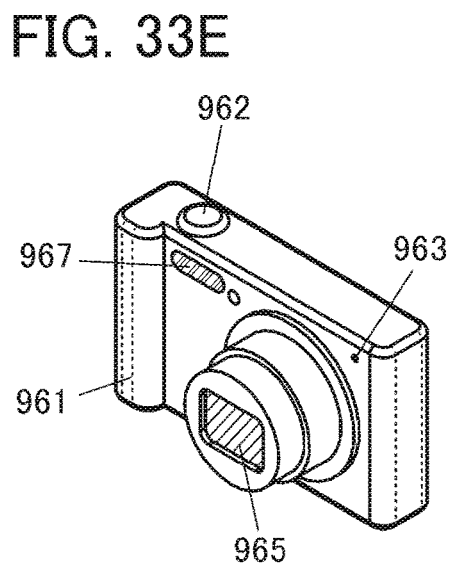

FIG. 33E is a digital camera, which includes a housing 961, a shutter button 962, a microphone 963, a light-emitting portion 967, a lens 965, and the like. The imaging device according to one embodiment of the present invention and the operation method thereof can be employed in the digital camera.

Figure 33F:
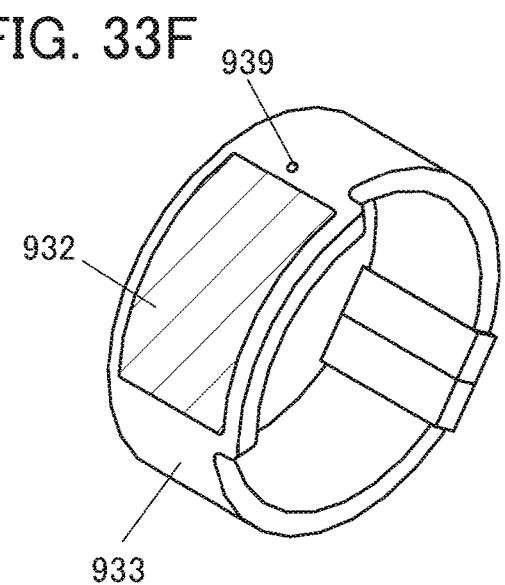

FIG. 33F is a wrist-watch-type information terminal, which includes a display portion 932, a housing/wristband 933, a camera 939, and the like. The display portion 932 is provided with a touch panel for performing the operation of the information terminal. The display portion 932 and the housing/wristband 933 have flexibility and fit a body well. The imaging device according to one embodiment of the present invention and the operation method thereof can be employed in the information terminal.

Figure 34A:
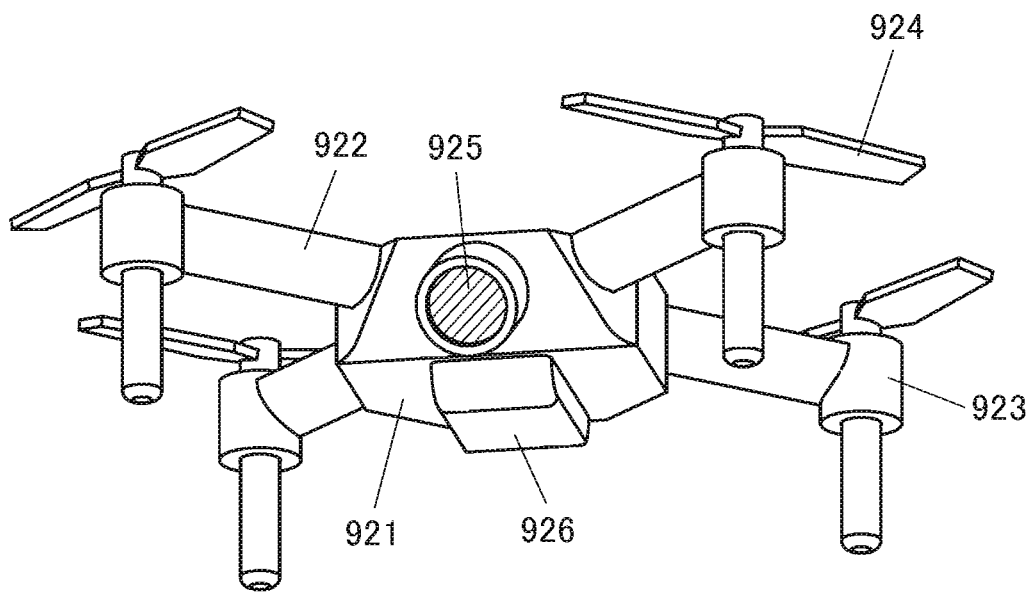
FIG. 34A and FIG. 34B are diagrams each illustrating a moving vehicle.

FIG. 34A is a drone as an example of a moving vehicle, which includes a frame 921, an arm 922, a rotor 923, a blade 924, a camera 925, a battery 926, and the like and has a function of flying autonomously, a function of staying still in midair, and the like. The imaging device according to one embodiment of the present invention and the operation method thereof can be employed in the camera 925.

Figure 34B:
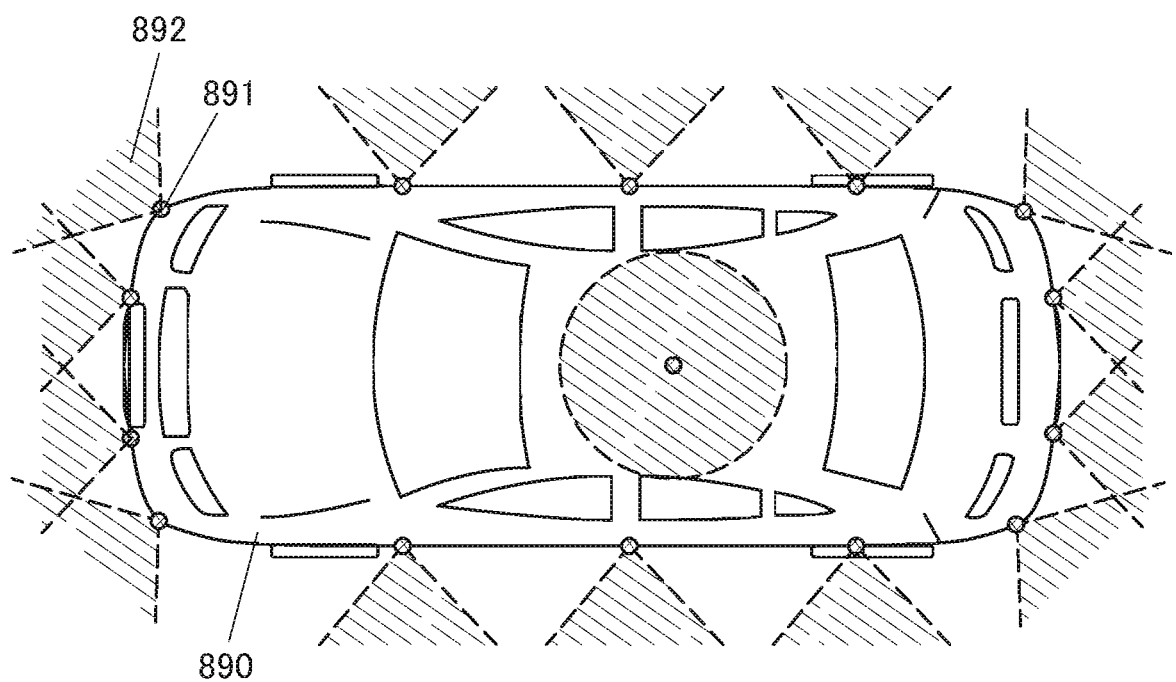

FIG. 34B illustrates an external view of a motor vehicle as an example of a moving vehicle. A motor vehicle 890 includes a plurality of cameras 891 and the like, and can obtain information on the front, rear, left, and right sides and the upper side of the motor vehicle 890. The imaging device according to one embodiment of the present invention and the operation method thereof can be employed in the cameras 891. The motor vehicle 890 is also provided with a variety of sensors such as an infrared radar, a millimeter wave radar, and a laser radar (not illustrated) and the like. The motor vehicle 890 judges traffic conditions there around such as the presence of a guardrail or a pedestrian by analyzing images in a plurality of imaging directions 892 taken by the cameras 891, and thus can perform autonomous driving. It can also be used for a system for navigation, risk prediction, or the like.

When arithmetic processing with a neural network or the like is performed on the obtained image data in the imaging device according to one embodiment of the present invention, for example, processing such as an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection can be performed.

Note that the motor vehicle may be any of a motor vehicle having an internal-combustion engine, an electric vehicle, a hydrogen vehicle, and the like. Furthermore, the moving vehicle is not limited to a motor vehicle. Examples of the moving vehicle also include a train, a monorail train, a ship, and a flying vehicle (a helicopter, an unmanned aircraft, an airplane, and a rocket), and these moving vehicles can include a system utilizing artificial intelligence when equipped with a computer of one embodiment of the present invention.

REFERENCE NUMERALS

10: layer, 11: pixel portion, 12: pixel block, 13: pixel block, 14: pixel, 15: pixel circuit, 16: memory circuit, 20: layer, 21: arithmetic unit, 22: binarization circuit, 23: product-sum operation circuit, 23a: multiplier, 23b: adder, 24: binarization circuit, 24S: selection transistor, 25: circuit, 26a: adder circuit, 26b: binarization circuit, 31: row driver, 32: column driver, 33: row driver, 34: column driver, 35: circuit, 36: circuit, 37: circuit, 40: circuit, 40S: switch, 41: circuit, 41S: switch, 42S: switch, 43S: switch, 44S: switch, 45S: switch, 51: register, 52: register, 60: circuit, 71: curve, 72: curve, 101: photoelectric conversion device, 102: transistor, 103: transistor, 104: transistor, 105: transistor, 106: capacitor, 107: transistor, 108: transistor, 109: transistor, 111: wiring, 112: wiring, 113: wiring, 114: wiring, 115: wiring, 116: wiring, 117: wiring, 118: wiring, 119: wiring, 150: memory cell, 150a: memory cell, 150b: memory cell, 150c: memory cell, 150d: memory cell, 170: back gate wiring, 175: metal oxide layer, 180: source-drain wiring, 185: gate wiring, 190: wiring, 223: transistor, 224: transistor, 225: transistor, 271: transistor, 272: transistor, 273: transistor, 274: capacitor, 275: capacitor, 276: transistor, 277: capacitor, 278: transistor, 279: capacitor, 410: bump, 415: back electrode, 420: through electrode, 425: electrode pad, 430: adhesive, 440: cover glass, 450: bare chip, 455: pixel array, 460: lens cover, 470: lens, 480: optical filter, 545: semiconductor layer, 546: insulating layer, 560: layer, 561: layer, 562: layer, 562a: layer, 562b: layer, 563: layer, 563a: layer, 563b: layer, 563c: layer, 565a: layer, 565b: layer, 566a: layer, 566b: layer, 566c: layer, 566d: layer, 567a: layer, 567b: layer, 567c: layer, 567d: layer, 567e: layer, 611: silicon substrate, 612: insulating layer, 613: insulating layer, 614: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 648: insulating layer, 651: insulating layer, 652: insulating layer, 653: insulating layer, 654: insulating layer, 655: conductive layer, 661: insulating layer, 662: insulating layer, 664: insulating layer, 665: insulating layer, 671: light-blocking layer, 672: optical conversion layer, 672B: color filter, 672G: color filter, 6721R: infrared filter, 672R: color filter, 672UV: ultraviolet filter, 673: microlens array, 683: conductive layer, 684: conductive layer, 685:

conductive layer, 686: conductive layer, 688: conductive layer, 689: conductive layer, 691: conductive layer, 692: conductive layer, 701: gate electrode, 702: gate insulating film, 703: source region, 704: drain region, 705: source electrode, 706: drain electrode, 707: oxide semiconductor layer, 708: channel formation region, 735: back gate, 890: motor vehicle, 891: camera, 892: imaging direction, 911: housing, 912: display portion, 913: speaker, 919: camera, 921: frame, 922: arm, 923: rotor, 924: blade, 925: camera, 926: battery, 932: display portion, 933: housing/wristband, 939: camera, 941: frame, 942: camera, 943: operation button, 944: member, 951: support base, 952: camera unit, 953: protective cover, 961: housing, 962: shutter button, 963: microphone, 965: lens, 967: light-emitting portion, 981: housing, 982: display portion, 983: operation button, 984: external connection port, 985: speaker, 986: microphone, and 987: camera.

The invention claimed is:

1. An imaging device comprising a plurality of pixel blocks,
    wherein the plurality of pixel blocks comprise a first layer and a second layer,
    wherein the first layer comprises a region overlapped with the second layer,
    wherein each of the plurality of pixel blocks comprises:
        a plurality of pixel circuits and a plurality of first memory circuits in the first layer; and
        a plurality of product-sum operation circuits, a plurality of first binarization circuits, and a plurality of second binarization circuits in the second layer,
    wherein the plurality of pixel circuits and the plurality of first memory circuits each comprise a transistor including a metal oxide comprising In in a channel formation region,
    wherein each of the plurality of first memory circuits is configured to retain a weight coefficient to be supplied to the plurality of product-sum operation circuits,
    wherein each of the plurality of first memory circuits comprises a memory cell, and
    wherein the memory cell comprises a capacitor including a ferroelectric layer.

2. An imaging device comprising a plurality of pixel blocks,
    wherein the plurality of pixel blocks comprise a first layer and a second layer,
    wherein the first layer is positioned over the second layer,
    wherein each of the plurality of pixel blocks comprises:
        a plurality of pixel circuits and a plurality of first memory circuits in the first layer; and
        a plurality of product-sum operation circuits, a plurality of first binarization circuits, and a plurality of second binarization circuits in the second layer,
    wherein each of the plurality of pixel circuits and each of the plurality of first memory circuits are overlapped with each other,
    wherein the plurality of pixel circuits and the plurality of first memory circuits each comprise a transistor including a metal oxide comprising In in a channel formation region,
    wherein each of the plurality of first memory circuits is configured to retain a weight coefficient to be supplied to the plurality of product-sum operation circuits,
    wherein each of the plurality of first memory circuits comprises a memory cell, and
    wherein the memory cell comprises a capacitor including a ferroelectric layer.

3. The imaging device according to claim 1,
    wherein the plurality of product-sum operation circuits, the plurality of first binarization circuits, and the plurality of second binarization circuits each comprise a transistor including silicon in a channel formation region.

4. The imaging device according to claim 1,
    wherein a number of the plurality of pixel circuits is the same as a number of the plurality of first binarization circuits.

5. The imaging device according to claim 1,
    wherein one of the plurality of pixel circuits is electrically connected to one of the plurality of first binarization circuits,
    wherein each of the plurality of first binarization circuits is electrically connected to the plurality of product-sum operation circuits, and
    wherein one of the plurality of product-sum operation circuits is electrically connected to one of the plurality of second binarization circuits.

6. The imaging device according to claim 1,
    wherein a number of the plurality of first binarization circuits is larger than a number of the plurality of second binarization circuits.

7. The imaging device according to claim 1,
    wherein a number of the plurality of product-sum operation circuits is the same as a number of the plurality of second binarization circuits.

8. The imaging device according to claim 1,
    wherein a driver circuit of the plurality of pixel circuits and a driver circuit of the plurality of first memory circuits are provided in the second layer.

9. The imaging device according to claim 1, further comprising a second memory circuit,
    wherein an input terminal of the second memory circuit is electrically connected to the plurality of second binarization circuits, and
    wherein an output terminal of the second memory circuit is electrically connected to the plurality of product-sum operation circuits.

10. The imaging device according to claim 9, further comprising a third memory circuit and a third binarization circuit,
    wherein the third memory circuit is electrically connected to the plurality of product-sum operation circuits with the third binarization circuit therebetween.

11. The imaging device according to claim 10,
    wherein the second memory circuit, the third memory circuit, and the third binarization circuit are provided in the second layer.

12. The imaging device according to claim 1,
    wherein the metal oxide further comprises Zn, and M, M being one or more of Al, Ti, Ga, Ge, Sn, Y, Zr, La, Ce, Nd, and Hf.

13. An electronic device comprising the imaging device according to claim 1, and a display device.

14. The imaging device according to claim 2,
    wherein the plurality of product-sum operation circuits, the plurality of first binarization circuits, and the plurality of second binarization circuits each comprise a transistor including silicon in a channel formation region.

15. The imaging device according to claim 2,
    wherein a number of the plurality of pixel circuits is the same as a number of the plurality of first binarization circuits.

16. The imaging device according to claim 2,
wherein one of the plurality of pixel circuits is electrically connected to one of the plurality of first binarization circuits,
wherein each of the plurality of first binarization circuits is electrically connected to the plurality of product-sum operation circuits, and
wherein one of the plurality of product-sum operation circuits is electrically connected to one of the plurality of second binarization circuits.

17. The imaging device according to claim 2,
wherein a number of the plurality of first binarization circuits is larger than a number of the plurality of second binarization circuits.

18. The imaging device according to claim 2,
wherein a number of the plurality of product-sum operation circuits is the same as a number of the plurality of second binarization circuits.

19. The imaging device according to claim 2,
wherein a driver circuit of the plurality of pixel circuits and a driver circuit of the plurality of first memory circuits are provided in the second layer.

20. The imaging device according to claim 2, further comprising a second memory circuit,
wherein an input terminal of the second memory circuit is electrically connected to the plurality of second binarization circuits, and
wherein an output terminal of the second memory circuit is electrically connected to the plurality of product-sum operation circuits.

21. The imaging device according to claim 20, further comprising a third memory circuit and a third binarization circuit,
wherein the third memory circuit is electrically connected to the plurality of product-sum operation circuits with the third binarization circuit therebetween.

22. The imaging device according to claim 21,
wherein the second memory circuit, the third memory circuit, and the third binarization circuit are provided in the second layer.

23. The imaging device according to claim 2,
wherein the metal oxide further comprises Zn, and M, M being one or more of Al, Ti, Ga, Ge, Sn, Y, Zr, La, Ce, Nd, and Hf.

24. An electronic device comprising the imaging device according to claim 2, and a display device.

* * * * *